United States Patent
Nishioka et al.

(10) Patent No.: US 11,835,844 B2
(45) Date of Patent: Dec. 5, 2023

(54) OPTICAL FREQUENCY CONTROL DEVICE, OPTICAL OSCILLATION DEVICE, FREQUENCY CONVERSION DEVICE, AND RADIO WAVE GENERATION DEVICE

(71) Applicant: Mitsubishi Electric Corporation, Tokyo (JP)

(72) Inventors: Junya Nishioka, Tokyo (JP); Tomohiro Akiyama, Tokyo (JP); Yuta Takemoto, Tokyo (JP); Toshiyuki Ando, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 64 days.

(21) Appl. No.: 17/712,667

(22) Filed: Apr. 4, 2022

(65) Prior Publication Data

US 2022/0244617 A1  Aug. 4, 2022

Related U.S. Application Data

(63) Continuation of application No. PCT/JP2020/043013, filed on Nov. 18, 2020.

(30) Foreign Application Priority Data

Nov. 19, 2019  (WO) ............... PCT/JP2019/045159

(51) Int. Cl.
  *G02F 2/02* (2006.01)
  *H01S 3/067* (2006.01)

(52) U.S. Cl.
  CPC ............... *G02F 2/02* (2013.01); *H01S 3/067* (2013.01); *H04B 2210/006* (2013.01)

(58) Field of Classification Search
  None
  See application file for complete search history.

(56) References Cited

U.S. PATENT DOCUMENTS 10,454,238 B2  10/2019  Fermann et al.
2001/0014106 A1*  8/2001  Gevorgian ............ H03B 28/00
                                                            372/20

(Continued)

FOREIGN PATENT DOCUMENTS

JP        3-120774 A    5/1991
JP        3-148189 A    6/1991

(Continued)

OTHER PUBLICATIONS

Extended European Search Report for European Application No. 20890712.1, dated Nov. 16, 2022.

(Continued)

*Primary Examiner* — David W Lambert
(74) *Attorney, Agent, or Firm* — Birch, Stewart, Kolasch & Birch, LLP

(57) ABSTRACT

An optical frequency control device includes: a detection circuit to receive first light including a first frequency, receive second light including a second frequency, modulate the first light with a local oscillation signal, and detect a differential beat signal between the frequency of sideband light included in the modulated first light and the second frequency; a light source control circuit to change the second frequency by frequency-dividing the differential beat signal with a first frequency division number, by frequency-dividing a reference signal with a second frequency division number, and by outputting a phase error signal indicating a phase difference between the frequency-divided differential beat signal and the frequency-divided reference signal; and a signal processing unit to set each of the first frequency division number and the second frequency division number according to the set value of a frequency difference between the first frequency and the second frequency.

20 Claims, 26 Drawing Sheets

(56) References Cited

U.S. PATENT DOCUMENTS

| | | | |
|---|---|---|---|
| 2007/0212012 A1* | 9/2007 | Hashizume | G02F 1/225 385/140 |
| 2009/0097843 A1* | 4/2009 | McBrien | H04B 10/505 398/16 |
| 2010/0014874 A1* | 1/2010 | Kawanishi | G02F 1/225 398/187 |
| 2016/0254646 A1* | 9/2016 | Li | H03L 7/00 372/32 |
| 2018/0048113 A1* | 2/2018 | Fermann | H01S 3/06712 |

FOREIGN PATENT DOCUMENTS

| | | | |
|---|---|---|---|
| JP | 2003-195380 A | 7/2003 | |
| JP | 2004-77979 A | 3/2004 | |

OTHER PUBLICATIONS

European Office Action dated Sep. 1, 2023 for Application No. 20 890 712.1.

* cited by examiner

First Light

First Control Signal

Second Light

Second Control Signal

OPTICAL FREQUENCY CONTROL DEVICE, OPTICAL OSCILLATION DEVICE, FREQUENCY CONVERSION DEVICE, AND RADIO WAVE GENERATION DEVICE

CROSS REFERENCE TO RELATED APPLICATIONS

This application is a Continuation of PCT International Application No. PCT/JP2020/043013 filed on Nov. 18, 2020, which claims priority under 35 U.S.C. § 119(a) to PCT International Application No. PCT/JP2019/045159 filed in Japan on Nov. 19, 2019, all of which are hereby expressly incorporated by reference into the present application.

TECHNICAL FIELD

The present invention relates to an optical frequency control device that changes a frequency included in light, an optical oscillation device including the optical frequency control device, a frequency conversion device including the optical oscillation device, and a radio wave generation device including the optical oscillation device.

BACKGROUND ART

Patent Literature 1 below discloses an optical frequency control device that controls a frequency difference between output light of a semiconductor laser diode, which is controlled output light, and reference light. The optical frequency control device includes an optical coupler that mixes output light of a semiconductor laser diode with reference light to generate a first intermediate frequency signal, a first local oscillator capable of continuously changing an oscillation frequency, a second local oscillator having a constant oscillation frequency, and a mixer that mixes a first intermediate frequency signal with an output signal of the first local oscillator to generate a second intermediate frequency signal.

In addition, the optical frequency control device includes a phase comparator that detects a phase difference between an output signal of a second local oscillator and a second intermediate frequency signal and outputs an error signal depending on the phase difference, and a control current injecting device that changes the oscillation frequency of the semiconductor laser diode based on the error signal.

CITATION LIST

Patent Literature

Patent Literature 1: Japanese Patent Laid-Open Publication No. H3-120774

SUMMARY OF INVENTION

Technical Problem

In the optical frequency control device disclosed in Patent Literature 1, the first local oscillator controls a frequency difference between controlled output light and reference light by changing the oscillation frequency. However, in order for the optical frequency control device to be able to change the frequency difference between the controlled output light and the reference light in a wide band, for example, a frequency synthesizer capable of changing the oscillation frequency in a wide band needs to be used as a first local oscillator. The frequency synthesizer capable of changing a frequency difference in a wide band is implemented with a filter or the like for suppressing occurrence of an unnecessary frequency, and the number of occurrence of unnecessary frequencies increases as a variable range of the frequency difference is wider. Therefore, in the frequency synthesizer capable of changing the frequency difference in a wide band, as the variable range of the frequency difference is wider, the circuit scale of the filter or the like to be implemented becomes larger, and there is a problem that the optical frequency control device becomes larger.

The present invention has been made to solve the above problems, and an object thereof is to obtain an optical frequency control device that does not require a frequency synthesizer.

Solution to Problem

An optical frequency control device according to the present invention includes: a detection circuit to receive first light including a first frequency from a first light source, receive second light including a second frequency from a second light source, modulate the first light with a local oscillation signal oscillated by a first local oscillation signal source, and detect a differential beat signal including a differential frequency between a frequency of sideband light included in the first light, which is modulated, and the second frequency; a light source control circuit to change the second frequency included in the second light oscillated by the second light source by frequency-dividing a differential beat signal detected by the detection circuit with a first frequency division number, by frequency-dividing a reference signal oscillated by a reference signal source with a second frequency division number, and by outputting, to the second light source, a phase error signal, which indicates a phase difference between the differential beat signal after the frequency division and the reference signal after the frequency division number; and a signal processor to set each of a first frequency division number and a second frequency division number in accordance with a set value of a frequency difference between the first frequency division number and the second frequency division number

Advantageous Effects of Invention

According to the present invention, it is possible to change the frequency difference between the first frequency included in the first light and the second frequency included in the second light without using the frequency synthesizer.

DESCRIPTION OF EMBODIMENTS

Hereinafter, in order to explain the present invention in more detail, a mode for carrying out the present invention will be described based on the accompanying drawings.

First Embodiment

Figure 1:
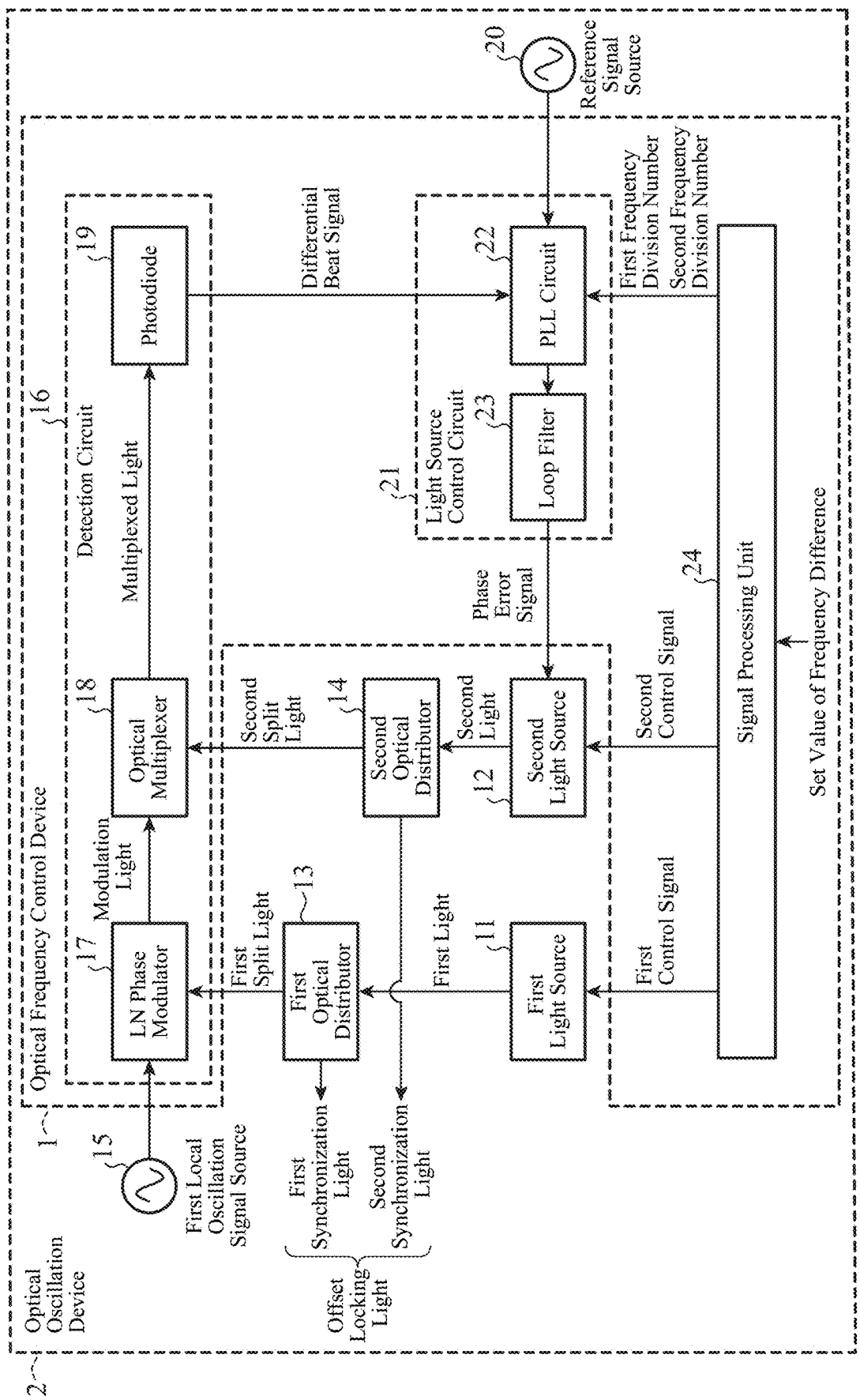
FIG. 1 is a configuration diagram illustrating an optical oscillation device 2 including an optical frequency control device 1 according to a first embodiment.

FIG. 1 is a configuration diagram illustrating an optical oscillation device 2 including an optical frequency control device 1 according to a first embodiment.

In FIG. 1, the optical frequency control device 1 is a device capable of varying an offset frequency that is a frequency difference $\Delta f(=f_2-f_1)$ between a first frequency $f_1$ included in first light and a second frequency $f_1$ included in second light.

The optical oscillation device 2 is a device, which includes the optical frequency control device 1, and outputs offset locking light that is light including the first frequency $f_1$ and the second frequency $f_2$.

A first light source 11 changes the first frequency $f_1$ included in the first light in accordance with a first control signal output from a signal processing unit 24 described later, and oscillates the first light including the changed first frequency $f_1$.

The first light source 11 is connected to a first optical distributor 13 described later via, for example, an optical fiber, and outputs the first light including the first frequency $f_1$ to the first optical distributor 13.

A second light source 12 changes a second frequency $f_2$ included in second light in accordance with each of a phase error signal output from a loop filter 23 described later included in a light source control circuit 21 described later and a second control signal output from the signal processing unit 24, and oscillates the second light including the changed second frequency $f_2$.

The second light source 12 is connected to a second optical distributor 14 described later via, for example, an optical fiber, and outputs the second light including the second frequency $f_2$ to the second optical distributor 14.

The first optical distributor 13 distributes the first light oscillated by the first light source 11.

The first optical distributor 13 is connected to an LN phase modulator 17 described later and included in a detection circuit 16 described later via, for example, an optical fiber. LN is lithium niobate.

The first optical distributor 13 outputs first split light which is one light after the distribution to the LN phase modulator 17, and outputs first synchronization light which is the other light after the distribution to the outside of the device as one light in offset locking light.

The second optical distributor 14 distributes the second light oscillated by the second light source 12.

The second optical distributor 14 is connected to an optical multiplexer 18 described later included in the detection circuit 16 via, for example, an optical fiber.

The second optical distributor 14 outputs second split light, which is one light after the distribution, to the optical multiplexer 18, and outputs second synchronization light, which is the other light after the distribution, to the outside of the device as the other light in the offset locking light.

A first local oscillation signal source 15 oscillates a local oscillation signal having a frequency of fm.

The first local oscillation signal source 15 is connected to the LN phase modulator 17 via, for example, an optical fiber, and outputs a local oscillation signal to the LN phase modulator 17.

The detection circuit 16 includes the LN phase modulator 17, the optical multiplexer 18, and a photodiode 19.

The detection circuit 16 receives the first light from the first light source 11 and receives the second light from the second light source 12.

The detection circuit 16 modulates the first light oscillated by the first light source 11 by the local oscillation signal oscillated by the first local oscillation signal source 15, and detects a differential beat signal including a differential frequency between the frequency $f_1+fm$ of sideband light included in the modulated first light and the second frequency $f_2$ included in the second light oscillated by the second light source 12.

The detection circuit 16 outputs the differential beat signal to the light source control circuit 21.

The LN phase modulator 17 modulates the first split light output from the first optical distributor 13 by the local oscillation signal oscillated by the first local oscillation signal source 15, thereby generating sideband light having a frequency of $f_1 \pm fm$. fm is a modulation frequency by the LN phase modulator 17.

The LN phase modulator 17 is connected to the optical multiplexer 18 via, for example, an optical fiber, and outputs modulation light including each of the first frequency $f_1$ and the frequency $f_1 \pm fm$ to the optical multiplexer 18 as the modulated first light.

In the optical frequency control device 1 illustrated in FIG. 1, the detection circuit 16 includes the LN phase modulator 17. However, the embodiment is not limited to the LN phase modulator 17 as long as the modulator can generate sideband light, and the detection circuit 16 may include a Mach-Zehnder intensity modulator, an electro-absorption modulator, or the like.

The optical multiplexer 18 multiplexes the modulation light output from the LN phase modulator 17 and the second split light output from the second optical distributor 14.

The optical multiplexer 18 is connected to the photodiode 19 via, for example, an optical fiber, and outputs the multiplexed light of the modulation light and the second split light to the photodiode 19.

The photodiode 19 converts the multiplexed light output from the optical multiplexer 18 into an electric signal.

The photodiode 19 detects, from the electric signals, a differential frequency $f_2-(f_1+fm)$ between the second frequency $f_2$ included in the second light and the frequency $f_1+fm$ of the sideband light.

The photodiode 19 outputs a signal including the differential frequency $f_2-(f_1+fm)$ as a differential beat signal to a phase locked loop (PLL) circuit 22 described later included in the light source control circuit 21.

A reference signal source 20 oscillates a reference signal having a frequency fr.

The reference signal source 20 outputs the reference signal to the PLL circuit 22.

The light source control circuit 21 includes the PLL circuit 22 and the loop filter 23.

The light source control circuit 21 frequency-divides the differential beat signal detected by the detection circuit 16 by a first frequency division number N.

The light source control circuit 21 frequency-divides the reference signal oscillated by the reference signal source 20 by a second frequency division number R.

The light source control circuit 21 outputs a phase error signal indicating a phase difference between the frequency-divided differential beat signal and the frequency-divided reference signal to the second light source 12, thereby changing the second frequency $f_2$ included in the second light oscillated by the second light source 12.

The PLL circuit 22 frequency-divides the differential beat signal output from the photodiode 19 by the first frequency division number N.

The PLL circuit 22 frequency-divides the reference signal output from the reference signal source 20 by the second frequency division number R.

The PLL circuit 22 outputs a phase error signal indicating a phase difference between the frequency-divided differential beat signal and the frequency-divided reference signal to the loop filter 23.

Note that the PLL circuit 22 may be an integral N-type PLL circuit or a fractional N-type PLL circuit capable of setting fractional frequency division.

The loop filter 23 integrates the phase error signal output from the PLL circuit 22 and outputs the integrated phase error signal to the second light source 12, thereby changing the second frequency $f_2$ included in the second light oscillated by the second light source 12.

The signal processing unit 24 sets each of the first frequency division number N and the second frequency division number R in accordance with a set value $\Delta f_{set}$ of a frequency difference $\Delta f$ between the first frequency $f_1$ included in the first light and the second frequency $f_2$ included in the second light.

The signal processing unit 24 outputs each of the first frequency division number N and the second frequency division number R to the PLL circuit 22.

The signal processing unit 24 sets each of a first control signal for controlling the first frequency $f_1$ and a second control signal for controlling the second frequency $f_2$ in accordance with the set value $\Delta f_{set}$.

The signal processing unit 24 outputs the first control signal to the first light source 11 and outputs the second control signal to the second light source 12.

The first control signal includes, as a control signal for controlling a laser diode 31 (see FIG. 2), which will be described later, included in the first light source 11, a set value of an injection current of the laser diode 31.

Moreover, the first control signal includes a set value of an element temperature of the laser diode 31 as a control signal for controlling a Peltier element 35 (see FIG. 2) which is described later and included in the first light source 11.

The second control signal includes a set value of an injection current of a laser diode 41 as a control signal for controlling the laser diode 41 (see FIG. 3) which is described later and included in the second light source 12.

Furthermore, the second control signal includes a set value of the element temperature of the laser diode 41 as a control signal for controlling a Peltier element 45 (see FIG. 3) which is described later and included in the second light source 12.

Figure 2:
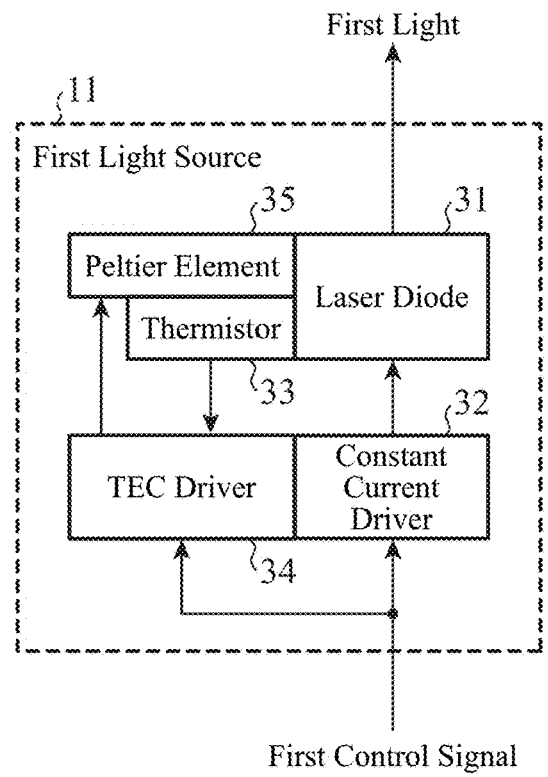
FIG. 2 is a configuration diagram illustrating a first light source 11.

FIG. 2 is a configuration diagram illustrating the first light source 11.

The first light source 11 includes the laser diode 31, a constant current driver 32, a thermistor 33, a Thermo electric coolers (TEC) driver 34, and the Peltier element 35.

The laser diode 31 oscillates the first light and outputs the first light to the first optical distributor 13.

The constant current driver 32 adjusts the first frequency $f_1$ included in the first light oscillated by the laser diode 31 by controlling the injection current of the laser diode 31 in accordance with the set value of the injection current of the laser diode 31, which is included in the first control signal output from the signal processing unit 24.

The thermistor 33 detects an element temperature of the laser diode 31 and outputs temperature information indicating the element temperature to the TEC driver 34.

The TEC driver 34 controls the current to be output to the Peltier element 35 based on the difference between the set value of the element temperature of the laser diode 31 and the element temperature indicated by the temperature information output from the thermistor 33, which is included in the first control signal output from the signal processing unit 24.

The Peltier element 35 adjusts the first frequency $f_1$ included in the first light oscillated by the laser diode 31 by controlling the element temperature of the laser diode 31 in accordance with the current output from the TEC driver 34.

The first light source 11 illustrated in FIG. 2 includes the laser diode 31, the constant current driver 32, the thermistor 33, the TEC driver 34, and the Peltier element 35. However, the first light source 11 is not limited to the configuration illustrated in FIG. 2 as long as the first frequency $f_1$ included in the first light can be adjusted. For example, the first light source 11 may be configured to control the first frequency $f_1$ included in the first light by controlling the resonator length of the light source, or may be configured to control the first frequency $f_1$ included in the first light by performing the serrodyne modulation and shifting the light source frequency.

Figure 3:
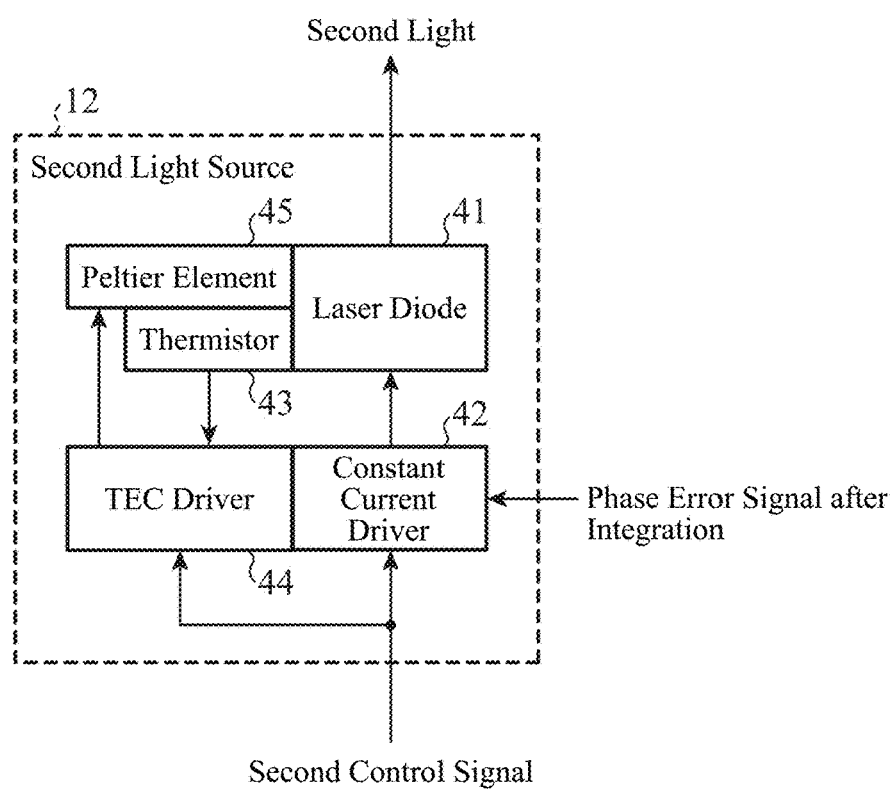
FIG. 3 is a configuration diagram illustrating a second light source 12.

FIG. 3 is a configuration diagram illustrating the second light source 12.

The second light source 12 includes the laser diode 41, a constant current driver 42, a thermistor 43, a TEC driver 44, and the Peltier element 45.

The laser diode 41 oscillates the second light and outputs the second light to the second optical distributor 14.

The constant current driver 42 adjusts the set value of the injection current of the laser diode 41 included in the second control signal output from the signal processing unit 24 in accordance with the phase error signal after the integration output from the loop filter 23.

The constant current driver 42 adjusts the second frequency $f_2$ included in the second light oscillated by the laser diode 41 by controlling the injection current of the laser diode 41 in accordance with the adjusted set value.

The thermistor 43 detects an element temperature of the laser diode 41 and outputs temperature information indicating the element temperature to the TEC driver 44.

The TEC driver 44 controls the current to be output to the Peltier element 45 based on the difference between the set value of the element temperature of the laser diode 41 and the element temperature indicated by the temperature information output from the thermistor 43, which is included in the second control signal output from the signal processing unit 24.

The Peltier element 45 adjusts the second frequency $f_2$ included in the second light oscillated by the laser diode 41 by controlling the element temperature of the laser diode 41 in accordance with the current output from the TEC driver 44.

The second light source 12 illustrated in FIG. 3 includes the laser diode 41, the constant current driver 42, the thermistor 43, the TEC driver 44, and the Peltier element 45. However, the second light source 12 is not limited to the configuration illustrated in FIG. 3 as long as the second frequency $f_2$ included in the second light can be adjusted. For example, the second light source 12 may be configured to control the second frequency $f_2$ included in the second light by controlling the resonator length of the light source, or may be configured to control the second frequency $f_2$ included in the second light by performing the serrodyne modulation and shifting the light source frequency.

Figure 4:
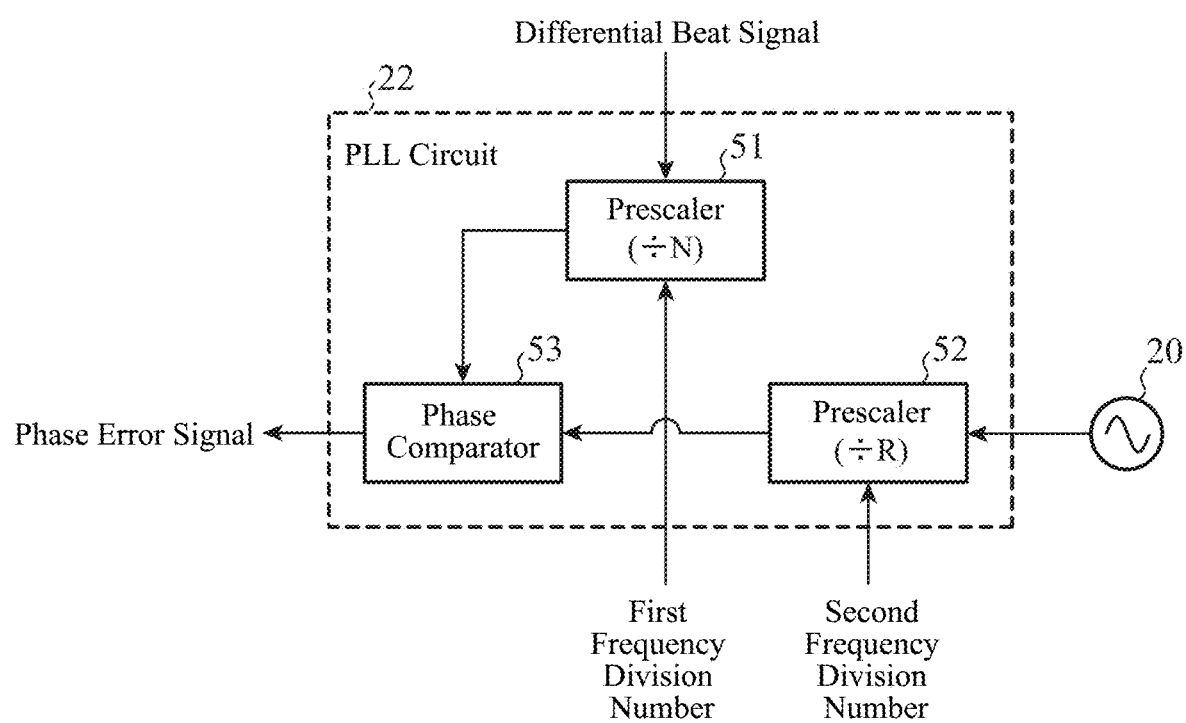
FIG. 4 is a configuration diagram illustrating a PLL circuit 22.

FIG. 4 is a configuration diagram illustrating the PLL circuit 22.

The PLL circuit 22 includes a prescaler 51, a prescaler 52, and a phase comparator 53.

The prescaler 51 frequency-divides the differential beat signal output from the photodiode 19 by the first frequency division number N output from the signal processing unit 24.

The prescaler 51 outputs the frequency-divided differential beat signal to the phase comparator 53.

The prescaler 52 frequency-divides a reference signal output from the reference signal source 20 by the second frequency division number R output from the signal processing unit 24.

The prescaler 52 outputs the frequency-divided reference signal to the phase comparator 53.

The phase comparator 53 detects a phase difference between the frequency-divided differential beat signal output from the prescaler 51 and the frequency-divided reference signal output from the prescaler 52.

The phase comparator 53 outputs a phase error signal indicating a phase difference to the loop filter 23.

Note that the phase comparator 53 may be a current output type phase comparator or a voltage output type phase comparator.

Figure 5:
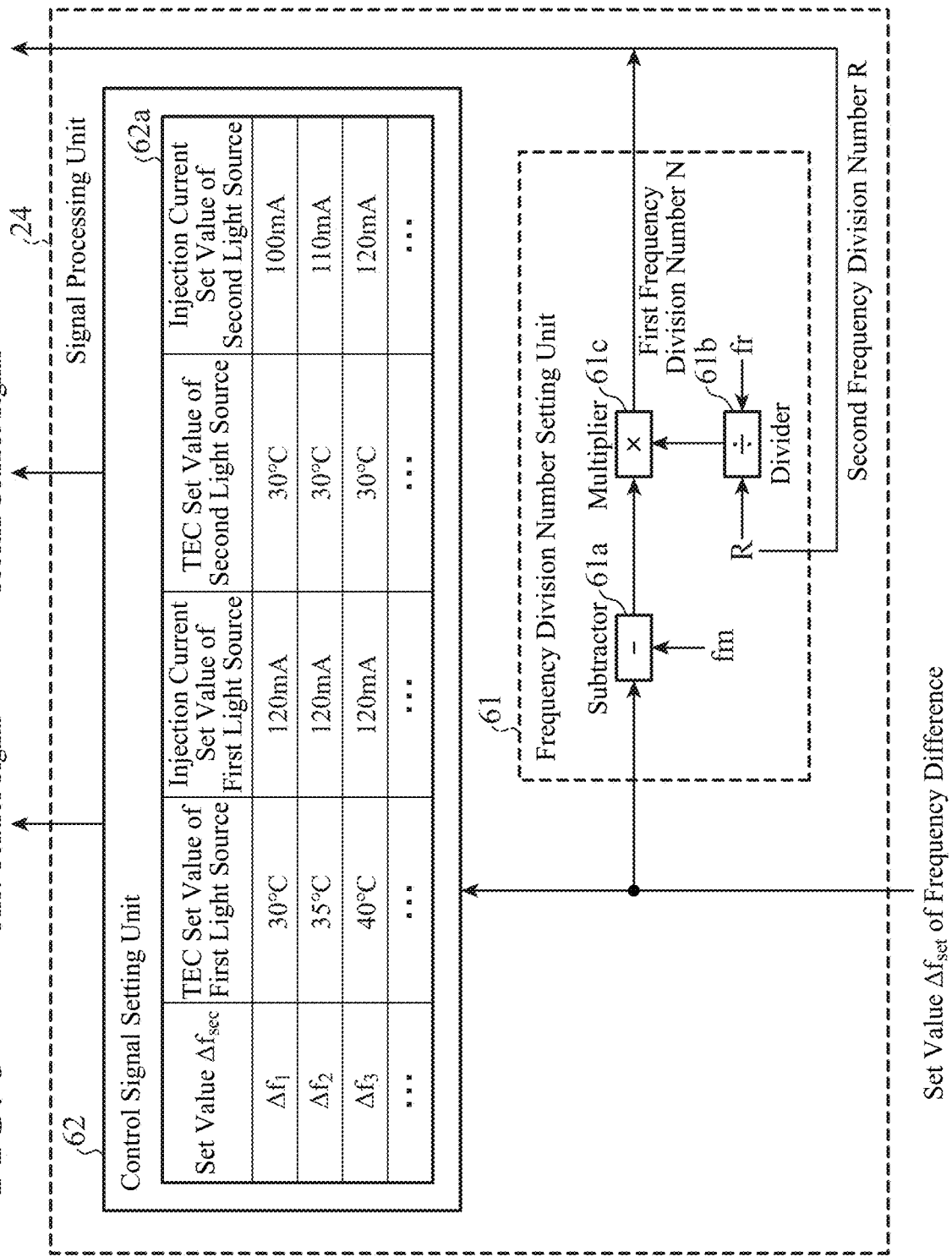
FIG. 5 is a configuration diagram illustrating a signal processing unit 24.

FIG. 5 is a configuration diagram illustrating the signal processing unit 24.

The signal processing unit 24 includes a frequency division number setting unit 61 and a control signal setting unit 62.

The frequency division number setting unit 61 includes a subtractor 61a, a divider 61b, and a multiplier 61c.

The internal memory of the frequency division number setting unit 61 stores each of the modulation frequency fm, the frequency fr and the second frequency division number R.

In the signal processing unit 24 illustrated in FIG. 5, each of the modulation frequency fm, the frequency fr and the second frequency division number R is stored in the internal memory of the frequency division number setting unit 61. However, this is merely an example, and each of the modulation frequency fm, the frequency fr, and the second frequency division number R may be provided from the outside of the signal processing unit 24.

For example, when a set value $\Delta f_{set}$ of the frequency difference $\Delta f$ is given from the outside of the device, the frequency division number setting unit 61 sets the first frequency division number N in accordance with each of the set value $\Delta f_{set}$, the modulation frequency fm, the frequency fr, and the second frequency division number R.

The frequency division number setting unit 61 outputs each of the first frequency division number N and the second frequency division number R to the PLL circuit 22.

For example, when a set value $\Delta f_{set}$ of the frequency difference $\Delta f$ is given from the outside of the device, the subtractor 61a subtracts the modulation frequency fm from the set value $\Delta f_{set}$, and outputs a subtraction result $\Delta f_{set}$–fm to the multiplier 61c.

The divider 61b divides the second frequency division number R by the frequency fr and outputs a division result R/fr to the multiplier 61c.

The multiplier 61c multiplies the subtraction result $\Delta f_{set}$–fm output from the subtractor 61a by the division result R/fr output from the divider 61b, and outputs the multiplication result ($\Delta f_{set}$–fm)×R/fr to the prescaler 51 of the PLL circuit 22 as the first frequency division number N.

The control signal setting unit 62 includes a table 62a that stores each of the first control signal and the second control signal corresponding to the set value $\Delta f_{set}$ of the frequency difference $\Delta f$.

Table 62a stores, as first control signals, a set value of an injection current of the laser diode 31 corresponding to a set value $\Delta f_{set}$ and a set value of an element temperature of the laser diode 31 corresponding to a set value $\Delta f_{set}$.

The table 62a stores, as second control signals, a set value of an injection current of the laser diode 41 corresponding to a set value $\Delta f_{set}$ and a set value of an element temperature of the laser diode 41 corresponding to the set value $\Delta f_{set}$.

The control signal setting unit 62 extracts each of the first control signal and the second control signal from the table 62a, outputs the first control signal to the first light source 11, and outputs the second control signal to the second light source 12.

In the optical frequency control device 1 illustrated in FIG. 1, one or more of the first light source 11, the second light source 12, and the detection circuit 16 are integrated as a planar lightwave circuit.

Figure 31:
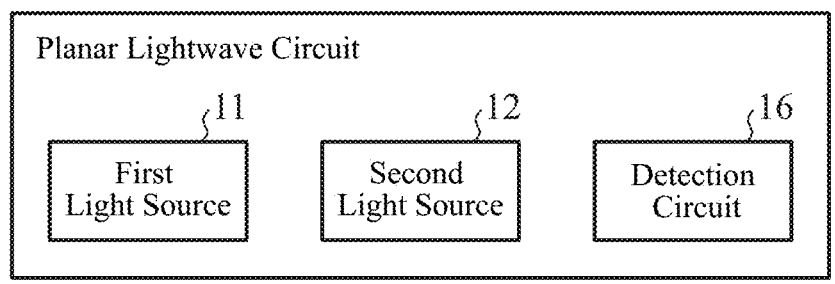
FIG. 31 is an explanatory diagram illustrating an example in which all of a first light source 11, a second light source 12, and the detection circuit 16 are integrated as a planar lightwave circuit.

FIG. 31 is an explanatory diagram illustrating an example in which all of the first light source 11, the second light source 12, and the detection circuit 16 are integrated as a planar lightwave circuit.

Furthermore, in the optical frequency control device 1 illustrated in FIG. 1, one or more of the first light source 11, the second light source 12, the detection circuit 16, the light source control circuit 21, and the signal processing unit 24 may be integrated using silicon.

Figure 32:
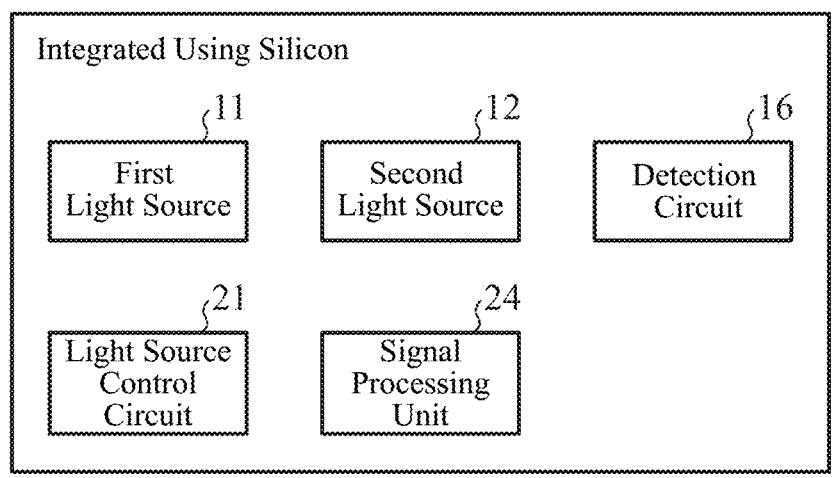
FIG. 32 is an explanatory diagram illustrating an example in which all of the first light source 11, the second light source 12, the detection circuit 16, a light source control circuit 21, and the signal processing unit 24 are integrated using silicon.

FIG. 32 is an explanatory diagram illustrating an example in which all of the first light source 11, the second light source 12, the detection circuit 16, the light source control circuit 21, and the signal processing unit 24 are integrated using silicon.

Next, the operation of the optical oscillation device 2 illustrated in FIG. 1 will be described.

The first light source 11 changes the first frequency $f_1$ included in the first light in accordance with the first control signal output from the signal processing unit 24, and oscillates the first light including the changed first frequency $f_1$.

The first light source 11 outputs the first light including the first frequency $f_1$ to the first optical distributor 13.

The second light source 12 changes the second frequency $f_2$ included in the second light in accordance with each of the phase error signal output from the loop filter 23 of the light source control circuit 21 and the second control signal output from the signal processing unit 24, and oscillates the second light including the changed second frequency $f_2$.

The second light source 12 outputs the second light including the second frequency $f_2$ to the second optical distributor 14.

When receiving the first light from the first light source 11, the first optical distributor 13 distributes the first light.

The first optical distributor 13 outputs the first split light, which is one light after the distribution, to the LN phase modulator 17.

The first optical distributor 13 outputs the first synchronization light, which is the other light after the distribution, to the outside of the device as one light of the offset locking light.

When receiving the second light from the second light source 12, the second optical distributor 14 distributes the second light.

The second optical distributor 14 outputs the second split light, which is one light after the distribution, to the optical multiplexer 18.

The second optical distributor 14 outputs the second synchronization light, which is the other light after the distribution, to the outside of the device as the other light in the offset locking light.

The first local oscillation signal source 15 oscillates a local oscillation signal having a frequency of fm and outputs the local oscillation signal to the LN phase modulator 17.

The LN phase modulator 17 modulates the first split light output from the first optical distributor 13 by the local oscillation signal oscillated by the first local oscillation signal source 15, thereby generating sideband light (see FIG. 6) having a frequency of $f_1 \pm$ fm. The phase of the modulation frequency fm by the LN phase modulator 17 is stable, for example, in the microwave region.

The LN phase modulator 17 outputs the modulated light including each of the first frequency $f_1$ and the frequency $f_1 \pm$ fm to the optical multiplexer 18.

Figure 6:
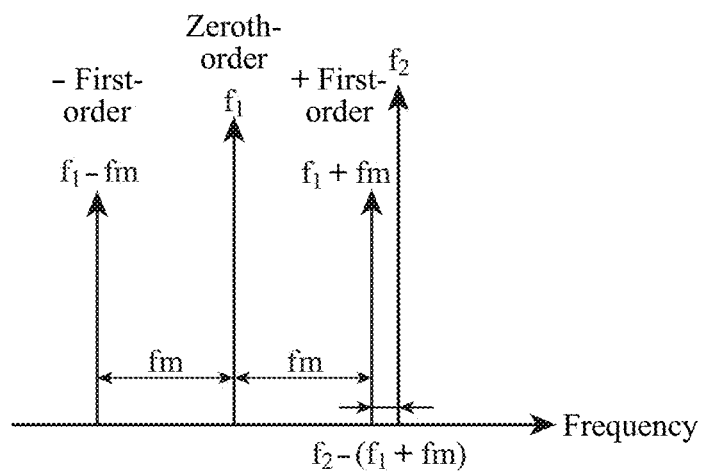
FIG. 6 is an explanatory diagram illustrating a first frequency $f_1$ included in first light, a second frequency $f_2$ included in second light, and frequencies $f_1-fm$ and $f_1+fm$ of sideband light.

FIG. 6 is an explanatory diagram illustrating the first frequency $f_1$ included in the first light, the second frequency $f_2$ included in the second light, and frequencies $f_1$–fm and $f_1$+fm of sideband light.

In FIG. 6, $f_2 - (f_1 + $fm$)$ is a differential frequency between the frequency of $f_2$ included in the second light and the frequency $f_1$+fm of the sideband light.

In the optical frequency control device 1 illustrated in FIG. 1, the LN phase modulator 17 generates sideband light having a frequency of $f_1 \pm$ fm at an interval of the modulation frequency fm on both sides of the first frequency $f_1$ with the first frequency $f_1$ as the center. However, this is merely an example, and the LN phase modulator 17 may generate, for example, only sideband light having a frequency of $f_1$+fm on one side of the first frequency $f_1$.

The optical multiplexer 18 multiplexes the modulation light output from the LN phase modulator 17 and the second split light output from the second optical distributor 14.

The optical multiplexer 18 outputs the multiplexed light of the modulated light and the second split light to the photodiode 19.

As illustrated in FIG. 6, the multiplexed light includes a first frequency $f_1$ included in the first light, a second frequency $f_2$ included in the second light, and frequencies $f_1$–fm and $f_1$+fm of the sideband light.

When receiving the multiplexed light from the optical multiplexer 18, the photodiode 19 converts the multiplexed light into an electric signal.

The photodiode 19 detects, from the electric signals, a differential frequency $f_2-(f_1+fm)$ between the second frequency $f_2$ included in the second light and the frequency $f_1+fm$ of the sideband light.

The photodiode 19 outputs a signal including the differential frequency $f_2-(f_1+fm)$ to the PLL circuit 22 as a differential beat signal.

In the optical frequency control device 1 illustrated in FIG. 1, assuming that the first frequency $f_1$<the second frequency $f_2$, the photodiode 19 detects the differential frequency $f_2-(f_1+fm)$ between the second frequency $f_2$ included in the second light and the frequency $f_1+fm$ of the sideband light from the electric signals. However, this is merely an example, and for example, when the first frequency $f_1$>the second frequency $f_2$, the photodiode 19 may detect the differential frequency $(f_1-fm)-f_2$ between the second frequency $f_2$ included in the second light and the frequency $f_1-fm$ of the sideband light from the electric signals. In this case, the photodiode 19 outputs a signal including a differential frequency $(f_1-fm)-f_2$ to the PLL circuit 22 as a differential beat signal.

The reference signal source 20 oscillates a reference signal having a frequency fr and outputs the reference signal to the PLL circuit 22.

The light source control circuit 21 frequency-divides the differential beat signal output from the photodiode 19 by a first frequency division number N and frequency-divides the reference signal output from the reference signal source 20 by a second frequency division number R.

The light source control circuit 21 outputs a phase error signal indicating a phase difference between the frequency-divided differential beat signal and the frequency-divided reference signal to the second light source 12, thereby changing the second frequency $f_2$ included in the second light oscillated by the second light source 12.

Hereinafter, the operation of the light source control circuit 21 will be described in detail.

The prescaler 51 of the PLL circuit 22 frequency-divides the differential beat signal output from the photodiode 19 by the first frequency division number N output from the signal processing unit 24.

Since the frequency included in the differential beat signal is $f_2-(f_1+fm)$, the frequency of the differential beat signal after the frequency division by the prescaler 51 is $(f_2-(f_1+fm))/N$.

The prescaler 51 outputs the frequency-divided differential beat signal to the phase comparator 53.

The prescaler 52 of the PLL circuit 22 frequency-divides the reference signal output from the reference signal source 20 by the second frequency division number R output from the signal processing unit 24.

Since the frequency included in the reference signal is fr, the reference signal after the frequency division by the prescaler 52 is fr/R.

The prescaler 52 outputs the frequency-divided reference signal to the phase comparator 53.

The phase comparator 53 of the PLL circuit 22 detects a phase difference between the frequency-divided differential beat signal output from the prescaler 51 and the frequency-divided reference signal output from the prescaler 52.

The phase comparator 53 outputs a phase error signal indicating a phase difference to the loop filter 23.

The loop filter 23 integrates the phase error signal output from the phase comparator 53 and outputs the integrated phase error signal to the second light source 12.

When the phase error signal after the integration is output to the second light source 12, the second frequency $f_2$ included in the second light output from the second light source 12 changes.

When the phase difference detected by the phase comparator 53 converges and phase synchronization of the PLL circuit 22 is fulfilled, the following Equation (1) is established.

$$\frac{f_2-(f_1+fm)}{N} = \frac{fr}{R} \quad (1)$$

Expression (1) can be organized as the following Expression (2).

$$f_2 - f_1 = \frac{N}{R}fr + fm \quad (2)$$

Expression (2) represents an offset frequency $f_2-f_1$ between the first frequency $f_1$ included in the first light oscillated by the first light source 11 and the second frequency $f_2$ included in the second light oscillated by the second light source 12. The offset frequency $f_2-f_1$ is determined by the first frequency division number N, the second frequency division number R, the frequency fr included in the reference signal and the modulation frequency fm.

The offset frequency $f_2-f_1$ corresponds to a frequency difference between the first frequency $f_1$ included in the first synchronization light and the second frequency $f_2$ included in the second synchronization light. The first synchronization light and the second synchronization light are light constituting offset locking light.

When Expression (1) is solved for N, the following Expression (3) is obtained.

$$N = \frac{R}{fr}(f_2-f_1-fm) \quad (3)$$
$$= \frac{R}{fr}(\Delta f_{set} - fm)$$

Upon receiving the set value $\Delta f_{set}$ of the frequency difference $\Delta f$ between the first frequency $f_1$ and the second frequency $f_2$ from the outside of the device, the signal processing unit 24 sets each of the first frequency division number N and the second frequency division number R in accordance with the set value $\Delta f_{set}$.

The signal processing unit 24 outputs each of the first frequency division number N and the second frequency division number R to the PLL circuit 22.

Moreover, the signal processing unit 24 sets each of the first control signal for controlling the first frequency $f_1$ and the second control signal for controlling the second frequency $f_2$ in accordance with the set value $\Delta f_{set}$.

The signal processing unit 24 outputs the first control signal to the first light source 11 and outputs the second control signal to second light source 12.

Hereinafter, the operation of the signal processing unit 24 will be described in detail.

First, the frequency division number setting unit 61 outputs the second frequency division number R stored in the internal memory to the prescaler 52 of the PLL circuit 22.

For example, when a set value $\Delta f_{set}$ of the frequency difference $\Delta f$ is given from the outside of the device, the subtractor 61a of the frequency division number setting unit 61 acquires the modulation frequency fm stored in the internal memory, and subtracts the modulation frequency fm from the set value $\Delta f_{set}$.

The subtractor 61a outputs the subtraction result $\Delta f_{set}$-fm to the multiplier 61c.

The divider 61b of the frequency division number setting unit 61 acquires the second frequency division number R stored in the internal memory and the frequency fr included in the reference signal stored in the internal memory.

The divider 61b divides the second frequency division number R by the frequency fr and outputs a division result R/fr to the multiplier 61c.

The multiplier 61c of the frequency division number setting unit 61 multiplies the subtraction result $\Delta f_{set}$-fm output from the subtractor 61a by the division result R/fr output from the divider 61b.

The multiplication result $(\Delta f_{set}-fm) \times R/fr$ of the subtraction result $\Delta f_{set}$-fm and the division result R/fr corresponds to the first frequency division number N from Expression (3).

The multiplier 61c outputs the multiplication result $(\Delta f_{set}-fm) \times R/fr$ to the prescaler 51 of the PLL circuit 22 as the first frequency division number N.

For example, when the set value $\Delta f_{set}$ of the frequency difference $\Delta f$ is given from the outside of the device, the control signal setting unit 62 acquires the first control signal corresponding to the set value $\Delta f_{set}$ and the second control signal corresponding to the set value $\Delta f_{set}$ from the table 62a.

That is, the control signal setting unit 62 acquires, as the first control signals from the table 62a, the set value of the injection current of the laser diode 31 corresponding to the set value $\Delta f_{set}$ and the set value of the element temperature of the laser diode 31 corresponding to the set value $\Delta f_{set}$.

Moreover, the control signal setting unit 62 acquires, as the second control signals from the table 62a, the set value of the injection current of the laser diode 41 corresponding to the set value $\Delta f_{set}$ and the set value of the element temperature of the laser diode 41 corresponding to the set value $\Delta f_{set}$.

The control signal setting unit 62 outputs the first control signal to the first light source 11 and outputs the second control signal to the second light source 12.

In the table 62a illustrated in FIG. 5, the set value of the injection current of the laser diode 31 is described as the injection current set value of the first light source, and the set value of the element temperature of the laser diode 31 is described as the TEC set value of the first light source.

Furthermore, the set value of the injection current of the laser diode 41 is described as the injection current set value of the second light source, and the set value of the element temperature of the laser diode 41 is described as the TEC set value of the second light source.

In the table 62a illustrated in FIG. 5, when the set value $\Delta f_{set}$ is $\Delta f_1$, the set value of the injection current of the laser diode 31 is 120 mA, the set value of the element temperature of the laser diode 31 is 30° C., the set value of the injection current of the laser diode 41 is 100 mA, and the set value of the element temperature of the laser diode 41 is 30° C.

Moreover, when the set value $\Delta f_{set}$ is $\Delta f_2$, the set value of the injection current of the laser diode 31 is 120 mA, the set value of the element temperature of the laser diode 31 is 35° C., the set value of the injection current of the laser diode 41 is 110 mA, and the set value of the element temperature of the laser diode 41 is 30° C.

When receiving the first control signal from the signal processing unit 24, the constant current driver 32 of the first light source 11 extracts the set value of the injection current of the laser diode 31 included in the first control signal.

The constant current driver 32 adjusts the first frequency $f_1$ included in the first light oscillated by the laser diode 31 by controlling the injection current of the laser diode 31 in accordance with the set value of the injection current.

The thermistor 33 of the first light source 11 detects the element temperature of the laser diode 31 and outputs temperature information indicating the element temperature to the TEC driver 34.

Upon receiving the first control signal from the signal processing unit 24, the TEC driver 34 extracts the set value of the element temperature of the laser diode 31 included in the first control signal.

The TEC driver 34 controls the current to be output to the Peltier element 35 based on the difference between the set value of the element temperature of the laser diode 31 and the element temperature indicated by the temperature information output from the thermistor 33.

The Peltier element 35 adjusts the first frequency $f_1$ included in the first light oscillated by the laser diode 31 by controlling the element temperature of the laser diode 31 in accordance with the current output from the TEC driver 34.

Thus, the first frequency $f_1$ included in the first light is adjusted in accordance with the set value $\Delta f_{set}$ of the frequency difference $\Delta f$.

When receiving the second control signal from the signal processing unit 24, the constant current driver 42 of the second light source 12 extracts the set value of the injection current of the laser diode 41 included in the second control signal.

The constant current driver 42 adjusts the set value of the injection current of the laser diode 41 in accordance with the integrated phase error signal output from the loop filter 23. The constant current driver 42 adjusts the set value of the injection current, for example, by subtracting the phase error signal after the integration from the set value of the injection current.

The constant current driver 42 adjusts the second frequency $f_2$ included in the second light oscillated by the laser diode 41 by controlling the injection current of the laser diode 41 in accordance with the adjusted set value.

The thermistor 43 of the second light source 12 detects the element temperature of the laser diode 41 and outputs temperature information indicating the element temperature to the TEC driver 44.

Upon receiving the second control signal from the signal processing unit 24, the TEC driver 44 extracts the set value of the element temperature of the laser diode 41 included in the second control signal.

The TEC driver 44 controls the current to be output to the Peltier element 45 based on the difference between the set value of the element temperature of the laser diode 41 and the element temperature indicated by the temperature information output from the thermistor 43.

The Peltier element 45 adjusts the second frequency $f_2$ included in the second light oscillated by the laser diode 41 by controlling the element temperature of the laser diode 41 in accordance with the current output from the TEC driver 44.

Thus, the second frequency $f_2$ included in the second light is adjusted in accordance with the set value $\Delta f_{set}$ of the frequency difference $\Delta f$.

When receiving the first light from the first light source 11, the first optical distributor 13 distributes the first light and outputs the first split light, which is one light after the distribution, to the LN phase modulator 17.

The first optical distributor 13 outputs the first synchronization light, which is the other light after the distribution, to the outside of the device as one light of the offset locking light.

When receiving the second light from the second light source 12, the second optical distributor 14 distributes the second light and outputs the second split light, which is one of the distributed light, to the optical multiplexer 18.

The second optical distributor 14 outputs the second synchronization light, which is the other light after the distribution, to the outside of the device as the other light in the offset locking light.

Figure 7:
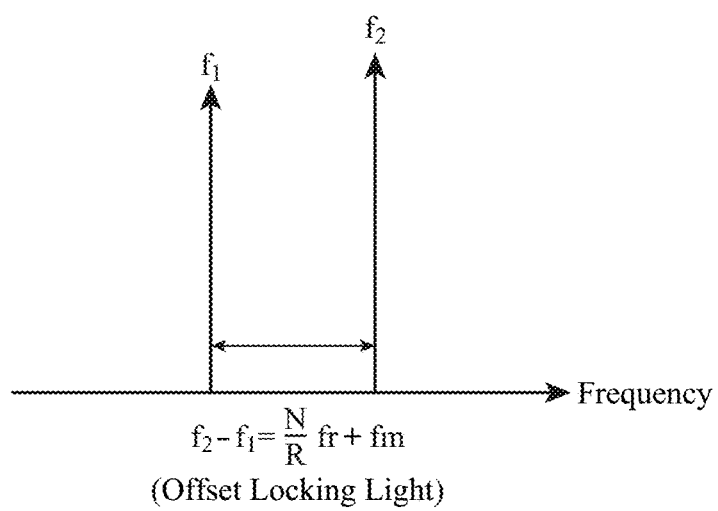
FIG. 7 is an explanatory view illustrating offset locking light.

FIG. 7 is an explanatory diagram illustrating offset locking light.

In FIG. 7, the frequency $f_1$ is the first frequency included in the first synchronous light, and the frequency $f_2$ is the second frequency included in the second synchronous light.

Since each of the first frequency $f_1$ and the second frequency $f_2$ is adjusted in accordance with the set value $\Delta f_{set}$ of the frequency difference $\Delta f$, the frequency difference $\Delta f$ between the first frequency $f_1$ and the second frequency $f_2$ can be changed.

In the first embodiment described above, the optical frequency control device 1 is configured to include the detection circuit 16 to receive the first light including the first frequency from the first light source 11, receive the second light including the second frequency from the second light source 12, modulate the first light with the local oscillation signal oscillated by the first local oscillation signal source 15, and detect the differential beat signal including the differential frequency between the frequency of the sideband light included in the modulated first light and the second frequency, the light source control circuit 21 to change the second frequency included in the second light oscillated by the second light source 12 by frequency-dividing the differential beat signal detected by the detection circuit 16 with the first frequency division number, by frequency-dividing the reference signal oscillated by the reference signal source 20 with the second frequency division number, and by outputting the phase error signal indicating the phase difference between the divided differential beat signal and the divided reference signal to the second light source 12, and the signal processing unit 24 to set each of the first frequency division number and the second frequency division number according to the set value of the frequency difference between the first frequency and the second frequency. Therefore, the optical frequency control device 1 can change the frequency difference between the first frequency included in the first light and the second frequency included in the second light without using the frequency synthesizer.

Second Embodiment

In a second embodiment, an optical frequency control device 1, in which a control signal setting unit 75 adjusts each of a first control signal and a second control signal by updating an internal table 62a on the basis of the phase error signal output from the light source control circuit 21, will be described.

Figure 8:
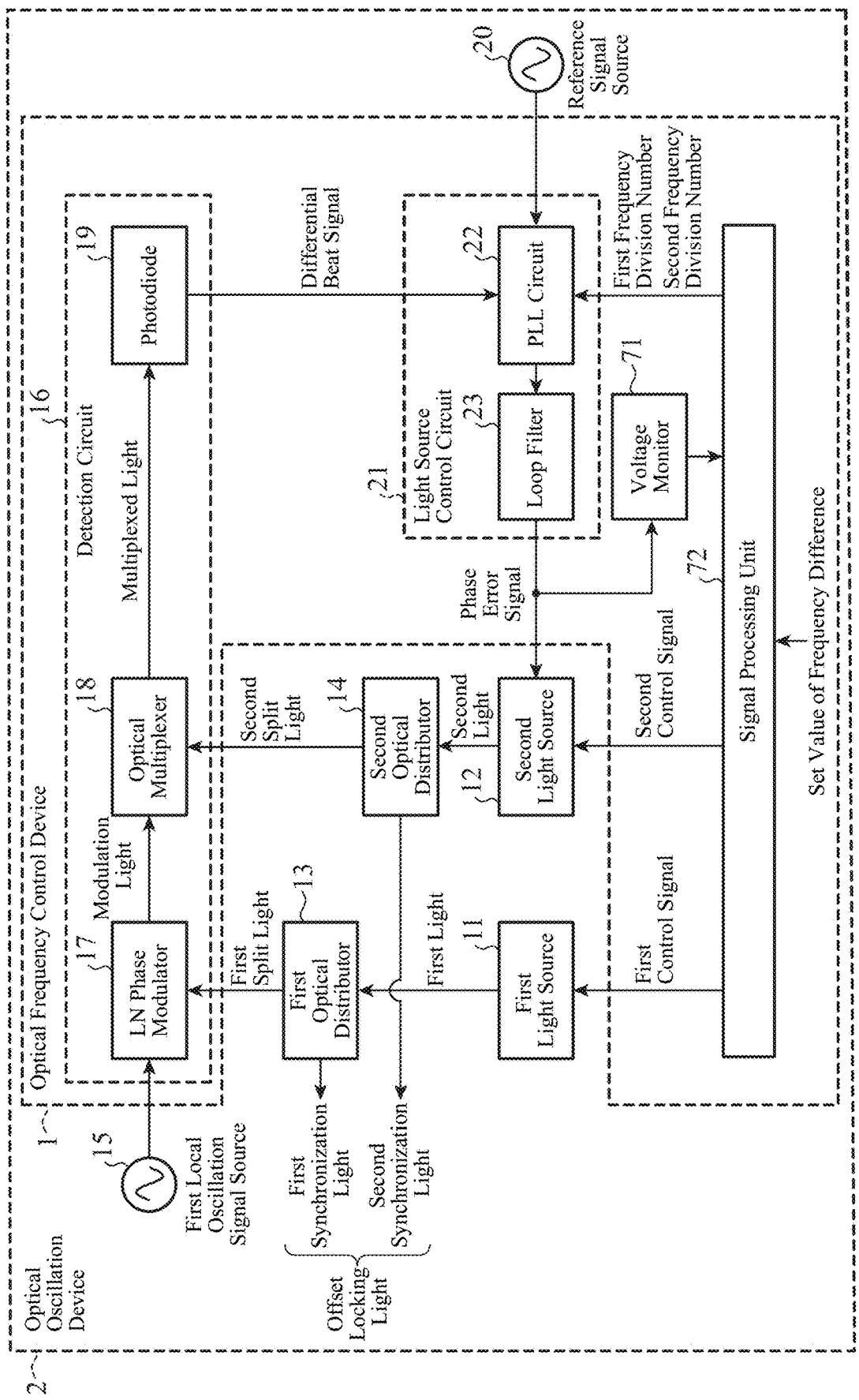
FIG. 8 is a configuration diagram illustrating an optical oscillation device 2 including an optical frequency control device 1 according to a second embodiment.

FIG. 8 is a configuration diagram illustrating an optical oscillation device 2 including an optical frequency control device 1 according to the second embodiment. In FIG. 8, the same reference signs as those in FIG. 1 denote the same or corresponding parts, and thus the description thereof is omitted.

A voltage monitor 71 samples a phase error signal after the integration output from a loop filter 23 and converts the sampled phase error signal into voltage data.

The voltage monitor 71 outputs the voltage data to the signal processing unit 72 described later.

Similarly to the signal processing unit 24 illustrated in FIG. 1, the signal processing unit 72 sets each of a first frequency division number N and a second frequency division number R in accordance with a set value $\Delta f_{set}$ of a frequency difference $\Delta f$ between a first frequency $f_1$ included in first light and a second frequency $f_2$ included in second light.

The signal processing unit 72 outputs each of the first frequency division number N and the second frequency division number R to a PLL circuit 22.

Similarly to the signal processing unit 24 illustrated in FIG. 1, the signal processing unit 72 sets each of a first control signal for controlling the first frequency $f_1$ and a second control signal for controlling the second frequency $f_2$ in accordance with the set value $\Delta f_{set}$.

The signal processing unit 72 outputs a first control signal to a first light source 11 and outputs a second control signal to a second light source 12.

Unlike the signal processing unit 24 illustrated in FIG. 1, the signal processing unit 72 adjusts each of the first control signal and the second control signal on the basis of the voltage data output from the voltage monitor 71.

Figure 9:
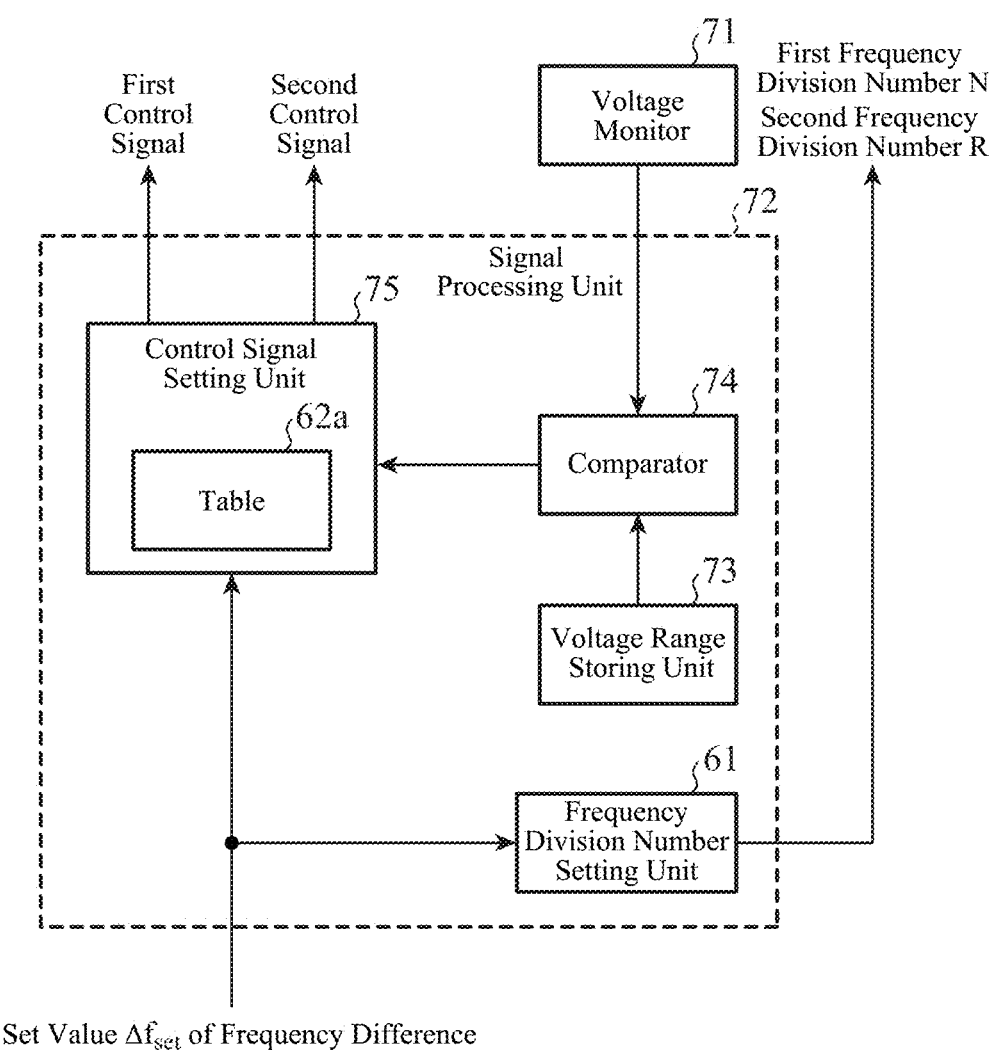
FIG. 9 is a configuration diagram illustrating a signal processing unit 72.

FIG. 9 is a configuration diagram illustrating the signal processing unit 72.

Similarly to the signal processing unit 24 illustrated in FIG. 5, the signal processing unit 72 illustrated in FIG. 9 includes a frequency division number setting unit 61.

Unlike the signal processing unit 24 illustrated in FIG. 5, the signal processing unit 72 illustrated in FIG. 9 includes a voltage range storing unit 73, a comparator 74 and a control signal setting unit 75.

The voltage range storing unit 73 is a storage medium for storing the voltage range of the phase error signal after the integration output from the loop filter 23.

In a case where the voltage swing width of the phase error signal after the integration output from the loop filter 23 is designed to be in the range of 0 to 10 V, for example, a range of 3 to 7 V narrower than the voltage swing width, for example, is stored in the voltage range storing unit 73 as the voltage range of the phase error signal.

When the voltage data output from the voltage monitor 71 is out of the range of the voltage range stored in the voltage range storing unit 73, the comparator 74 updates a table 62a included in the control signal setting unit 75.

Similarly to the control signal setting unit 62 illustrated in FIG. 5, the control signal setting unit 75 includes the table 62a that stores each of the first control signal and the second control signal corresponding to the set value $\Delta f_{set}$ of the frequency difference $\Delta f$.

Similarly to the control signal setting unit 62 illustrated in FIG. 5, the control signal setting unit 75 takes each of the first control signal and the second control signal out from the table 62a, outputs the first control signal to the first light source 11, and outputs the second control signal to the second light source 12.

The table 62a included in the control signal setting unit 75 is updated by the comparator 74 unlike the table 62a included in the control signal setting unit 62 illustrated in FIG. 5.

Next, the operation of the optical frequency control device 1 illustrated in FIG. 8 will be described.

The optical frequency control device 1 illustrated in FIG. 8 operates in a way that, when the voltage swing width of the phase error signal after the integration output from the loop filter 23 is designed to be in the range of 0 to 10 V, for example, the voltage range of the phase error signal is drawn into the range of 3 to 7 V, for example.

Since the components other than the voltage monitor 71 and the signal processing unit 72 are similar to those of the optical frequency control device 1 illustrated in FIG. 1, only the operations of the voltage monitor 71 and the signal processing unit 72 will be described herein.

The voltage monitor 71 samples a phase error signal after the integration output from the loop filter 23 and converts the sampled phase error signal into voltage data.

The voltage monitor 71 outputs the voltage data to the comparator 74 of the signal processing unit 72.

The comparator 74 compares the voltage data output from the voltage monitor 71 with the voltage range stored in the voltage range storing unit 73.

When the comparison result indicates that the voltage data is out of the voltage range, the comparator 74 updates the table 62a included in the control signal setting unit 75.

Hereinafter, an example of updating the table 62a by the comparator 74 will be described in detail.

When the voltage range of the phase error signal is, for example, in the range of 3 to 7 V, if the voltage data output from the voltage monitor 71 is smaller than 3 V, which is the lower limit of the voltage range, the comparator 74 updates the set values of the element temperatures of laser diodes 31 and 41 stored in the table 62a to be increased by, for example, 1° C.

When the voltage data output from the voltage monitor 71 is larger than the upper limit 7 V of the voltage range, the comparator 74 updates the set values of the element temperatures of the laser diodes 31 and 41 stored in the table 62a to be lowered by, for example, 1° C.

If the voltage data output from the voltage monitor 71 is within the voltage range, the comparator 74 does not update the set values of the element temperatures of the laser diodes 31 and 41 stored in the table 62a.

By the comparator 74 updating the set value of the element temperature stored in the table 62a, the voltage range of the phase error signal falls within the range of 3 to 7 V, for example.

In the optical frequency control device 1 illustrated in FIG. 8, the comparator 74 updates the set values of the element temperatures of the laser diodes 31 and 41. However, it is sufficient that the voltage range of the phase error signal is updated so as to be fallen within, for example, the range of 3 to 7 V and the comparator 74 may update the set value of the injection current of the laser diodes 31 and 41 stored in the table 62a, for example.

The control signal setting unit 75 takes out the first control signal corresponding to the set value $\Delta f_{set}$ and the second control signal corresponding to the set value $\Delta f_{set}$ from the table 62a updated by the comparator 74.

The control signal setting unit 75 outputs the first control signal to the first light source 11 and outputs the second control signal to the second light source 12.

In the second embodiment described above, the optical frequency control device 1 illustrated in FIG. 8 is configured in such a manner that the signal processing unit 72 adjusts each of the first control signal and the second control signal on the basis of the phase error signal output from the light source control circuit 21. Therefore, similarly to the optical frequency control device 1 illustrated in FIG. 1, the optical frequency control device 1 illustrated in FIG. 8 can change the frequency difference between the first frequency included in the first light and the second frequency included in the second light without using the frequency synthesizer.

Moreover, even if the oscillation frequencies of the first light source 11, the second light source 12, and the first local oscillation signal source 15 drift due to a change in the operating environment, a secular change, or the like, the optical frequency control device 1 illustrated in FIG. 8 can avoid falling into lock-off during non-establishment of phase synchronization or synchronization.

Furthermore, even when the voltage swing width of the phase error signal output from the loop filter 23 is narrow, it is possible to avoid falling into lock-off. Thus, even when a light source with low phase noise is used as the first light source 11, the second light source 12, and the first local oscillation signal source 15, synchronization can be maintained, and low phase noise can be reduced.

Third Embodiment

In a third embodiment, an optical frequency control device 1, in which a signal processing unit 81 determines the order d of the sideband light on the basis of a set value $\Delta f_{set}$ and sets a first frequency division number N in accordance with each of the set value $\Delta f_{set}$ and the order d, will be described.

Figure 10:
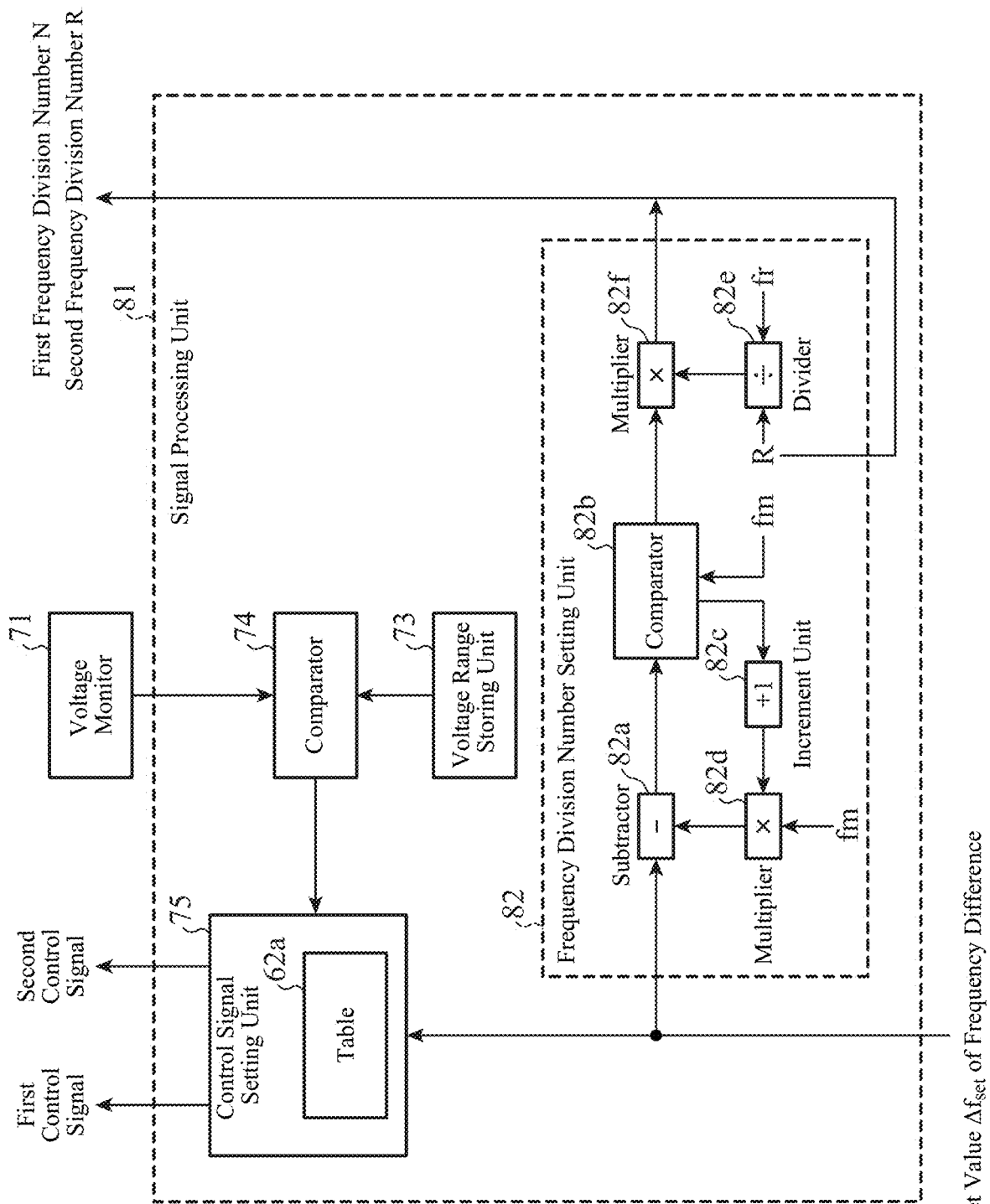
FIG. 10 is a configuration diagram illustrating a signal processing unit 81 of an optical frequency control device 1 according to a third embodiment.

FIG. 10 is a configuration diagram illustrating the signal processing unit 81 of the optical frequency control device 1 according to the third embodiment. In FIG. 10, the same reference signs as those in FIGS. 5 and 9 denote the same or corresponding parts, and thus the description thereof is omitted.

The signal processing unit 81 illustrated in FIG. 10 includes a voltage range storing unit 73, a comparator 74, and a control signal setting unit 75, similarly to the signal processing unit 72 illustrated in FIG. 9. However, this is merely an example, and the signal processing unit 81 may include the control signal setting unit 62 illustrated in FIG. 5 instead of the voltage range storing unit 73, the comparator 74 and the control signal setting unit 75.

A frequency division number setting unit 82 includes a subtractor 82a, a comparator 82b, an increment unit 82c, a multiplier 82d, a divider 82e, and a multiplier 82f.

The internal memory of the frequency division number setting unit 82 stores each of a modulation frequency fm, a frequency fr, and a second frequency division number R.

In the signal processing unit 81 illustrated in FIG. 10, each of the modulation frequency fm, the frequency fr and the second frequency division number R is stored in the internal memory of the frequency division number setting unit 82. However, this is merely an example, and each of the modulation frequency fm, the frequency fr, and the second frequency division number R may be given from the outside of the signal processing unit 81.

For example, when a set value $\Delta f_{set}$ of a frequency difference $\Delta f$ is given from the outside of the device, the frequency division number setting unit 82 determines the order d of the sideband light based on each of the set value $\Delta f_{set}$ and the modulation frequency fm.

The frequency division number setting unit 82 sets the first frequency division number N in accordance with each of the set value $\Delta f_{set}$, the order d, the modulation frequency fm, the frequency fr, and the second frequency division number R.

The frequency division number setting unit 82 outputs each of the first frequency division number N and the second frequency division number R to the PLL circuit 22.

For example, when the set value $\Delta f_{set}$ of the frequency difference $\Delta f$ is given from the outside of the device, the subtractor 82a subtracts the multiplication result d×fm of the multiplier 83d from the set value $\Delta f_{set}$, and outputs the subtraction result $\Delta f_{set}$–d×fm to the comparator 82b.

The comparator 82b compares the subtraction result $\Delta f_{set}$–d×fm output from the subtractor 82a with the modulation frequency fm.

If the subtraction result $\Delta f_{set}$–d×fm is equal to or greater than the modulation frequency fm, the comparator 82b outputs an increment command of the order d to the increment unit 82c.

When the subtraction result $\Delta f_{set}$–d×fm is smaller than the modulation frequency fm, the comparator 82b determines the order d at the present time as the order d of the sideband light and outputs the subtraction result $\Delta f_{set}$–d×fm to the multiplier 82f.

When receiving the increment command from the comparator 82b, the increment unit 82c increments the order d by 1. The initial value of the order d is 0.

The multiplier 82d multiplies the order d output from the increment unit 82c by the modulation frequency fm and outputs a multiplication result d×fm of the order d by the modulation frequency fm to the subtractor 82a.

The divider 82e divides the second frequency division number R by the frequency fr and outputs the division result R/fr to the multiplier 82f.

The multiplier 82f multiplies the subtraction result $\Delta f_{set}$–d×fm output from the comparator 82b by the division result R/fr output from the divider 82e and outputs the multiplication result $(\Delta f_{set}-d\times fm)\times R/fr$ to the prescaler 51 of the PLL circuit 22 as a first frequency division number N.

Next, the operation of the signal processing unit 81 will be described. Note that, since the operation other than the frequency division number setting unit 82 is similar to that of the signal processing unit 72 illustrated in FIG. 9, only the operation of the frequency division number setting unit 82 will be described here.

First, the frequency division number setting unit 82 outputs the second frequency division number R stored in the internal memory to the prescaler 52 of the PLL circuit 22.

For example, when a set value $\Delta f_{set}$ of the frequency difference $\Delta f$ is given from the outside of the device, the subtractor 82a subtracts the multiplication result d×fm of the multiplier 83d from the set value $\Delta f_{set}$. Note that, since the initial value of the order d is 0, the multiplication result d×fm at the present time is 0.

The subtractor 82a outputs the subtraction result $\Delta f_{set}$–d×fm to the comparator 82b.

The comparator 82b compares the subtraction result $\Delta f_{set}$–d×fm output from the subtractor 82a with, for example, the modulation frequency fm stored in the internal memory.

If the subtraction result $\Delta f_{set}$–d×fm is equal to or greater than the modulation frequency fm, the comparator 82b outputs an increment command of the order d to the increment unit 82c.

When the subtraction result $\Delta f_{set}$–d×fm is smaller than the modulation frequency fm, the comparator 82b outputs the subtraction result $\Delta f_{set}$–d×fm to the multiplier 82f.

Herein, for convenience of explanation, it is assumed that the subtraction result $\Delta f_{set}$–d×fm is equal to or greater than the modulation frequency fm, and the comparator 82b outputs an increment command of the order d to the increment unit 82c.

When receiving the increment command from the comparator 82b, the increment unit 82c increments the order d by 1. Since the order d before being incremented is 0, the order d output from the increment unit 82c is 1.

The multiplier 82d multiplies the order d output from the increment unit 82c by the modulation frequency fm and outputs a multiplication result d×fm of the order d by the modulation frequency fm to the subtractor 82a.

Upon receiving the multiplication result d×fm from the multiplier 82d, the subtractor 82a subtracts the multiplication result d×fm from the set value $\Delta f_{set}$ of the frequency difference $\Delta f$. Since the order d output from the increment unit 82c is 1, the multiplication result d×fm is equal to fm.

The subtractor 82a outputs the subtraction result $\Delta f_{set}$–d×fm to the comparator 82b.

The comparator 82b compares the subtraction result $\Delta f_{set}$–d×fm output from the subtractor 82a with the modulation frequency fm.

If the subtraction result $\Delta f_{set}$–d×fm is equal to or greater than the modulation frequency fm, the comparator 82b outputs an increment command of the order d to the increment unit 82c.

When the subtraction result $\Delta f_{set}$–d×fm is smaller than the modulation frequency fm, the comparator 82b outputs the subtraction result $\Delta f_{set}$–d×fm to the multiplier 82f.

Herein, for convenience of explanation, it is assumed that the subtraction result $\Delta f_{set}$–d×fm is equal to or greater than the modulation frequency fm, and the comparator 82b outputs an increment command of the order d to the increment unit 82c.

When receiving the increment command from the comparator 82b, the increment unit 82c increments the order d by 1. Since the order d before being incremented is 1, the order d output from the increment unit 82c is 2.

The multiplier 82d multiplies the order d output from the increment unit 82c by the modulation frequency fm and outputs a multiplication result d×fm of the order d by the modulation frequency fm to the subtractor 82a.

Upon receiving the multiplication result d×fm from the multiplier 82d, the subtractor 82a subtracts the multiplication result d×fm from the set value $\Delta f_{set}$ of the frequency difference $\Delta f$. Since the order d output from the increment unit 82c is 2, the multiplication result d×fm is equal to 2fm.

The subtractor 82a outputs the subtraction result $\Delta f_{set}$–d×fm to the comparator 82b.

The comparator 82b compares the subtraction result $\Delta f_{set}$–d×fm output from the subtractor 82a with the modulation frequency fm.

If the subtraction result $\Delta f_{set}$–d×fm is equal to or greater than the modulation frequency fm, the comparator 82b outputs an increment command of the order d to the increment unit 82c.

When the subtraction result $\Delta f_{set}$–d×fm is smaller than the modulation frequency fm, the comparator 82b outputs the subtraction result $\Delta f_{set}$–d×fm to the multiplier 82f.

Herein, for convenience of description, it is assumed that the subtraction result $\Delta f_{set}$–d×fm is smaller than the modulation frequency fm, and the comparator 82b outputs the subtraction result $\Delta f_{set}$–d×fm to the multiplier 82f.

The divider 82e acquires the second frequency division number R stored in the internal memory and the frequency fr included in the reference signal stored in the internal memory.

The divider 82e divides the second frequency division number R by the frequency fr and outputs the division result R/fr to the multiplier 82f.

The multiplier 82f multiplies the subtraction result $\Delta f_{set}$-d×fm output from the comparator 82b by the division result R/fr output from the divider 82e.

The multiplication result $(\Delta f_{set}$-d×fm)×R/fr of the subtraction result $\Delta f_{set}$-d×fm and the division result R/fr corresponds to the first frequency division number N as shown in the following Expression (4).

The multiplier 61c outputs the multiplication result $(\Delta f_{set}$-d×fm)×R/fr to the prescaler 51 of the PLL circuit 22 as the first frequency division number N.

$$N = \frac{R}{fr}(\Delta f_{set} - d \times fm) \quad (4)$$

Figure 11:
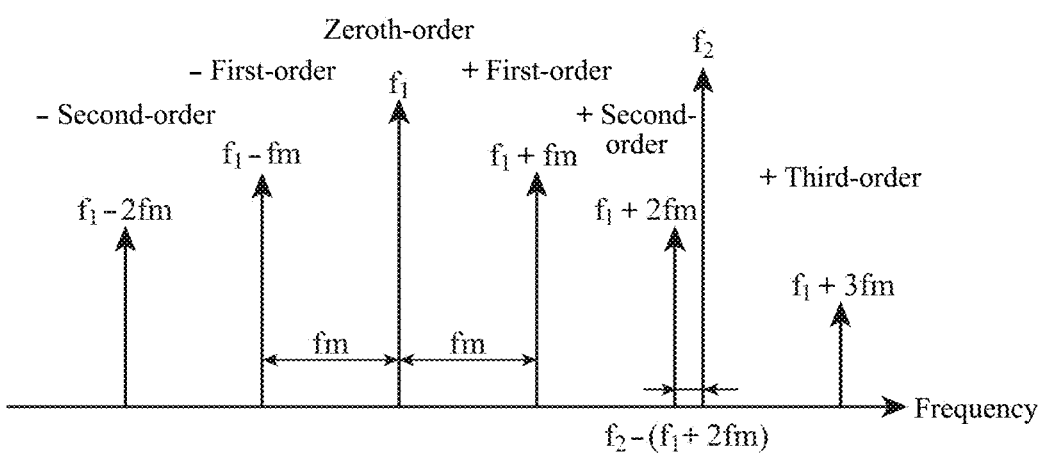
FIG. 11 is an explanatory diagram illustrating a first frequency $f_1$ included in first light, a second frequency $f_2$ included in second light, and respective frequencies of sideband light of orders d of −2 to +3.

FIG. 11 is an explanatory diagram illustrating the first frequency $f_1$ included in the first light, the second frequency $f_2$ included in the second light, and the frequencies of the respective sideband lights in the order d of −2 to +3.

In FIG. 11, $f_2-(f_1+2fm)$ is a differential frequency between the frequency of $f_2$ included in the second light and the frequency $f_1+2fm$ of the order of +2 sideband light.

In FIG. 11, only the offset frequency of which the differential frequency is $f_2-(f_1+2fm)$ is illustrated. However, actually, in addition to the offset frequency of which the differential frequency is $f_2-(f_1+2fm)$, an offset frequency of which the differential frequency is $f_2-(f_1+fm)$, an offset frequency of which the differential frequency is $f_2-(f_1+3fm)$, or the like may be included in the multiplexed light.

When the phase difference detected by the phase comparator 53 of the PLL circuit 22 converges and phase synchronization of the PLL circuit 22 is fulfilled, the following Expression (5) is established.

$$f_2 - f_1 = \frac{N}{R}fr + d \times fm \quad (5)$$

Therefore, the frequency difference between the first frequency $f_1$ included in the first synchronization light included in the offset locking light and the second frequency $f_2$ included in the second synchronization light included in the offset locking light converges in accordance with Expression (5).

In the third embodiment described above, the optical frequency control device 1 is configured in such a manner that the signal processing unit 81 determines the order d of the sideband light on the basis of the set value $\Delta f_{set}$ and sets the first frequency division number N in accordance with each of the set value $\Delta f_{set}$ and the order d. Therefore, similarly to the first embodiment, the optical frequency control device 1 can change the frequency difference between the first frequency included in the first light and the second frequency included in the second light without using a frequency synthesizer.

Moreover, in the optical frequency control device 1, when the signal processing unit 81 determines the order d of the sideband light to be a high order, it is possible to obtain the offset locking light having a high frequency of the order d.

Even when the signal processing unit 81 determines the order d of the sideband light to be the high order, the response speed in each of the photodiode 19 and the PLL circuit 22 is the same as the response speed in a case where the order d of the sideband light is low. Therefore, even if the order d is changed, it is unnecessary to replace each of the photodiode 19 and the PLL circuit 22.

Fourth Embodiment

In a fourth embodiment, an optical frequency control device 1, in which a signal processing unit 100 switches the polarity of a phase error signal output from a light source control circuit 90, will be described.

Figure 12:
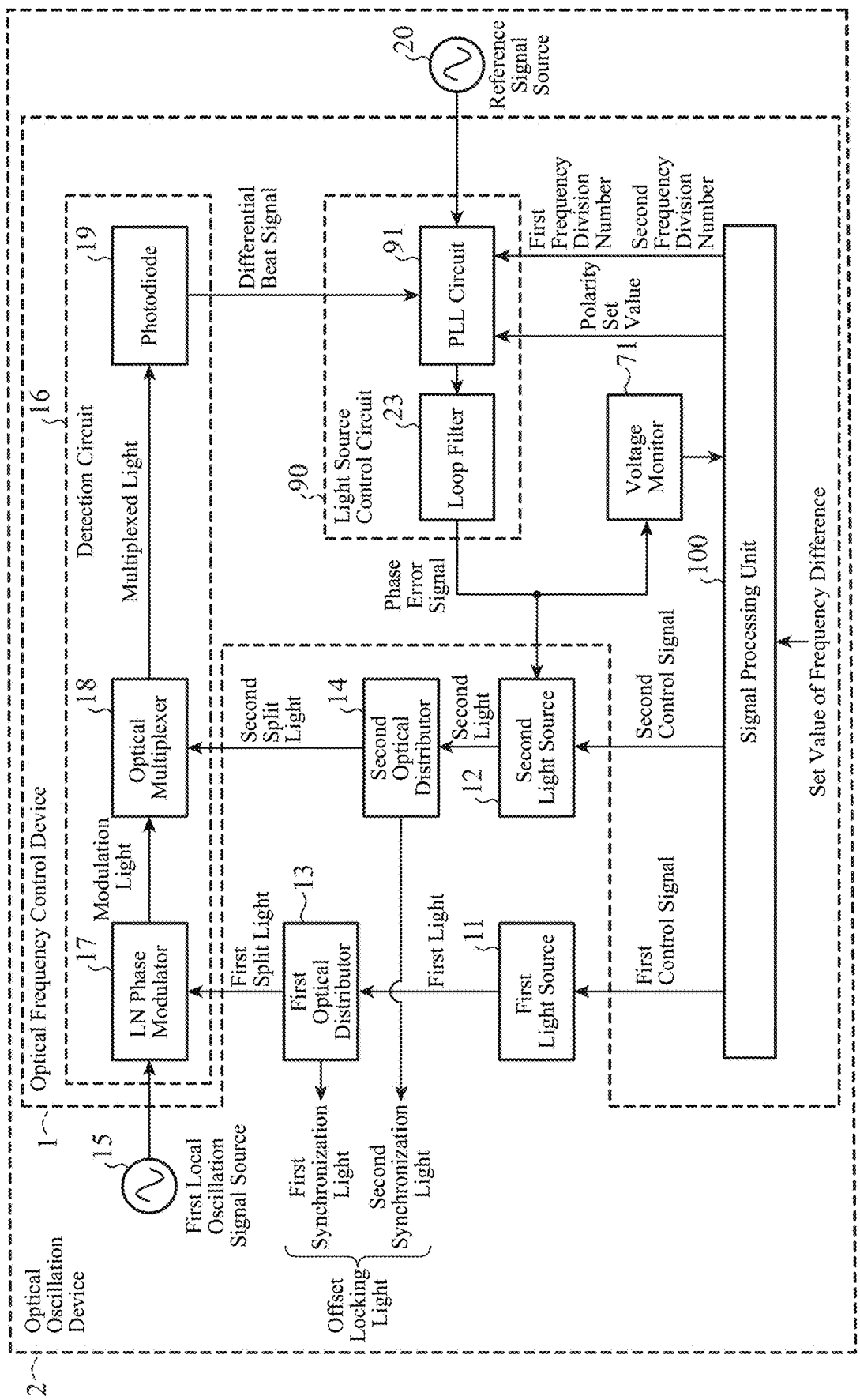
FIG. 12 is a configuration diagram illustrating an optical oscillation device 2 including an optical frequency control device 1 according to a fourth embodiment.

FIG. 12 is a configuration diagram illustrating an optical oscillation device 2 including the optical frequency control device 1 according to the fourth embodiment. In FIG. 12, the same reference signs as those in FIGS. 1 and 8 denote the same or corresponding parts, and thus the description thereof is omitted.

In the optical frequency control device 1 illustrated in FIG. 12, a light source control circuit 90 and the signal processing unit 100 are applied to the optical frequency control device 1 illustrated in FIG. 8. However, this is merely an example, and the light source control circuit 90 and the signal processing unit 100 may be applied to the optical frequency control device 1 illustrated in FIG. 1.

The light source control circuit 90 includes a PLL circuit 91 and the loop filter 23.

Similarly to the light source control circuit 21 illustrated in FIGS. 1 and 8, the light source control circuit 90 frequency-divides a differential beat signal detected by the detection circuit 16 by a first frequency division number N and frequency-divides a reference signal oscillated by a reference signal source 20 by a second frequency division number R.

Unlike the light source control circuits 21 illustrated in FIGS. 1 and 8, the light source control circuit 90 sets the polarity of the phase error signal indicating the phase difference between the frequency-divided differential beat signal and the frequency-divided reference signal in accordance with the polarity set value output from the signal processing unit 100.

The light source control circuit 90 outputs a phase error signal having the set polarity to the second light source 12.

The PLL circuit 91 frequency-divides the differential beat signal output from the photodiode 19 by the first frequency division number N.

The PLL circuit 91 frequency-divides the reference signal output from the reference signal source 20 by the second frequency division number R.

The PLL circuit 91 sets the polarity of the phase error signal indicating the phase difference between the frequency-divided differential beat signal and the frequency-divided reference signal in accordance with the polarity set value output from the signal processing unit 100.

The PLL circuit 91 outputs the phase error signal having the set polarity to the loop filter 23.

Similarly to the signal processing unit 81 illustrated in FIG. 10, the signal processing unit 100 determines the order d of the sideband light on the basis of the set value $\Delta f_{set}$ and sets the first frequency division number N according to each of the set value $\Delta f_{set}$ and the order d.

The signal processing unit 100 outputs each of the first frequency division number N and the second frequency division number R to the PLL circuit 91.

Unlike the signal processing unit 81 illustrated in FIG. 10, the signal processing unit 100 outputs a polarity set value indicating the polarity of the phase error signal to the PLL circuit 91.

Similarly to the signal processing unit 81 illustrated in FIG. 10, the signal processing unit 100 sets each of the first control signal for controlling the first frequency $f_1$ and the second control signal for controlling the second frequency $f_2$ in accordance with the set value $\Delta f_{set}$.

The signal processing unit 100 outputs the first control signal to a first light source 11 and outputs the second control signal to a second light source 12.

Similarly to the signal processing unit 81 illustrated in FIG. 10, the signal processing unit 100 adjusts each of the first control signal and the second control signal on the basis of the voltage data output from the voltage monitor 71.

The signal processing unit 100 adjusts each of the first control signal and the second control signal on the basis of the voltage data. However, this is merely an example, and each of the first control signal and the second control signal may be not adjusted on the basis of the voltage data, similarly to the signal processing unit 24 illustrated in FIG. 1.

Figure 13:
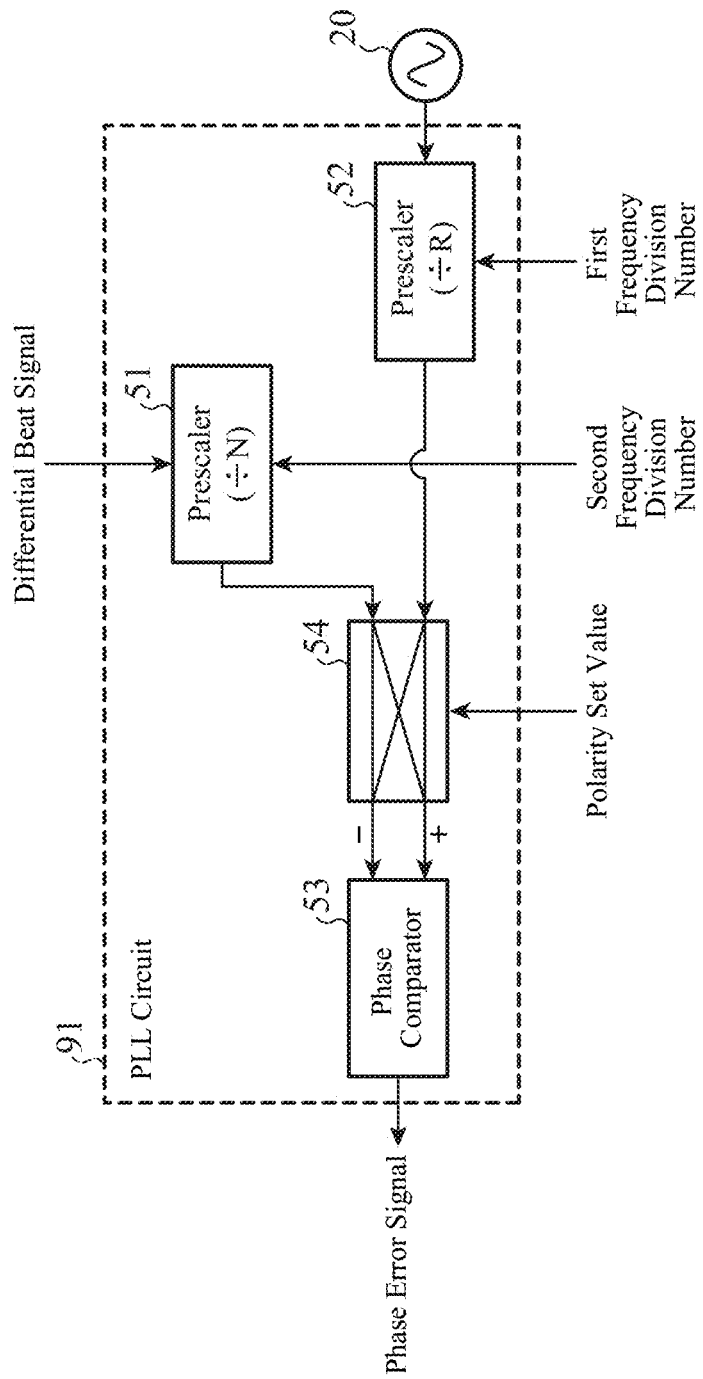
FIG. 13 is a configuration diagram illustrating a PLL circuit 91.

FIG. 13 is a configuration diagram illustrating the PLL circuit 91. In FIG. 13, the same reference signs as those in FIG. 4 denote the same or corresponding parts, and thus the description thereof is omitted.

If the polarity set value output from the signal processing unit 100 indicates that the polarity of the phase error signal is set to be positive, a polarity switch 54 sets the polarity of the phase error signal output from the phase comparator 53 to be positive.

If the polarity set value output from the signal processing unit 100 indicates that the polarity of the phase error signal is set to be negative, the polarity switch 54 sets the polarity of the phase error signal output from the phase comparator 53 to be negative.

Figure 14:
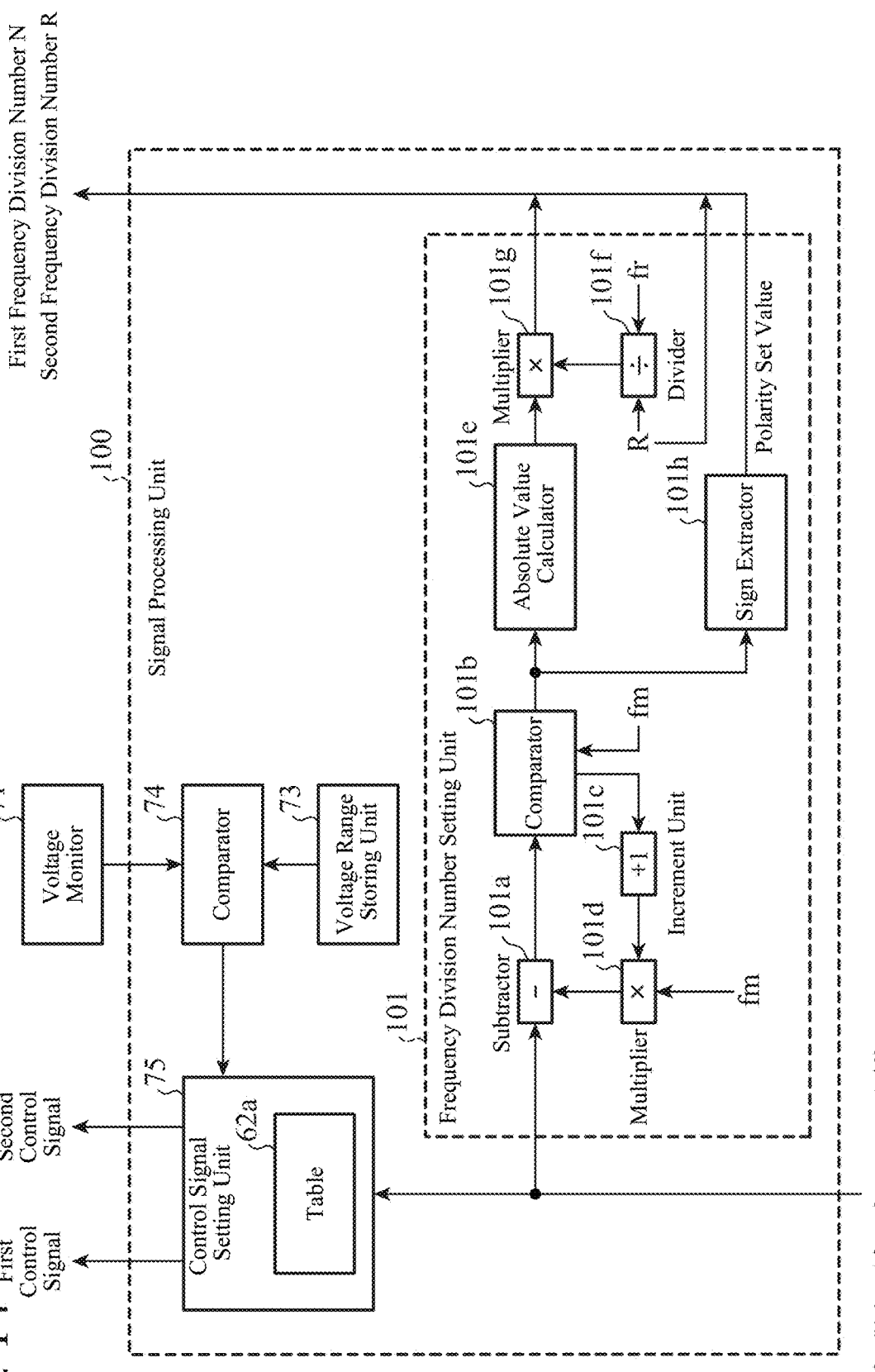
FIG. 14 is a configuration diagram illustrating a signal processing unit 100.

FIG. 14 is a configuration diagram illustrating the signal processing unit 100. In FIG. 14, the same reference signs as those in FIGS. 5, 9, and 10 denote the same or corresponding parts, and thus the description thereof is omitted.

The signal processing unit 100 illustrated in FIG. 14 includes a voltage range storing unit 73, the comparator 74 and the control signal setting unit 75, similarly to the signal processing unit 72 illustrated in FIG. 9 and the signal processing unit 81 illustrated in FIG. 10. However, this is merely an example, and the signal processing unit 81 may include the control signal setting unit 62 illustrated in FIG. 5 instead of the voltage range storing unit 73, the comparator 74 and the control signal setting unit 75.

The frequency division number setting unit 101 includes a subtractor 101a, a comparator 101b, an increment unit 101c, a multiplier 101d, an absolute value calculator 101e, a divider 101f, a multiplier 101g, and a sign extractor 101h.

The internal memory of the frequency division number setting unit 101 stores each of the modulation frequency fm, the frequency fr and the second frequency division number R.

In the signal processing unit 100 illustrated in FIG. 14, each of the modulation frequency fm, the frequency fr, and the second frequency division number R is stored in the internal memory of the frequency division number setting unit 101. However, this is merely an example, and each of the modulation frequency fm, the frequency fr, and the second frequency division number R may be given from the outside of the signal processing unit 100.

For example, when a set value $\Delta f_{set}$ of the frequency difference $\Delta f$ is given from the outside of the device, the frequency division number setting unit 101 determines the order d of the sideband light based on each of the set value $\Delta f_{set}$ and the modulation frequency fm.

The frequency division number setting unit 101 sets the first frequency division number N in accordance with each of the set value $\Delta f_{set}$, the order d, the modulation frequency fm, the frequency fr and the second frequency division number R.

The frequency division number setting unit 101 outputs each of the first frequency division number N and the second frequency division number R to the PLL circuit 91.

The frequency division number setting unit 101 sets the polarity of the phase error signal in accordance with each of the set value $\Delta f_{set}$, the order d, and the modulation frequency fm and outputs the polarity set value indicating the polarity to the PLL circuit 91.

For example, when the set value $\Delta f_{set}$ of the frequency difference $\Delta f$ is given from the outside of the device, the subtractor 101a subtracts the multiplication result d×fm of the multiplier 101d from the set value $\Delta f_{set}$ and outputs the subtraction result $\Delta f_{set}$–d×fm to the comparator 101b.

The comparator 101b compares the subtraction result $\Delta f_{set}$–d×fm output from the subtractor 101a with –fm/2, and also compares the subtraction result $\Delta f_{set}$–d×fm with +fm/2.

When the subtraction result $\Delta f_{set}$–d×fm is equal to or less than –fm/2 or the subtraction result $\Delta f_{set}$–d×fm is equal to or greater than +fm/2, the comparator 101b outputs an increment command of the order d to the increment unit 101c.

When the subtraction result $\Delta f_{set}$–d×fm is greater than –fm/2 and less than +fm/2, the comparator 101b determines the order d at the present time as the order d of the sideband light, and outputs the subtraction result $\Delta f_{set}$–d×fm to each of an absolute value calculator 101e and a sign extractor 101h.

When receiving the increment command from the comparator 101b, the increment unit 101c increments the order d by 1. The initial value of the order d is 1.

The multiplier 101d multiplies the order d output from the increment unit 101c by the modulation frequency fm, and outputs a multiplication result d×fm of the order d by the modulation frequency fm to the subtractor 101a.

The absolute value calculator 101e calculates the absolute value |$\Delta f_{set}$–d×fm| of the subtraction result $\Delta f_{set}$–d×fm output from the comparator 101b, and outputs the absolute value |$\Delta f_{set}$–d×fm| to the multiplier 101g.

The divider 101f divides the second frequency division number R by the frequency fr and outputs a division result R/fr to the multiplier 101g.

The multiplier 101g multiplies the absolute value |$\Delta f_{set}$–d×fm| output from the absolute value calculator 101e by the division result R/fr output from the divider 101f, and outputs the multiplication result |$\Delta f_{set}$–d×fm|×R/fr as the first frequency division number N to the prescaler 51 of the PLL circuit 91.

For example, when the second frequency $f_2$ is greater than the first frequency $f_1$, if the subtraction result $\Delta f_{set}$–d×fm output from the comparator 101b is equal to or greater than 0, a sign extractor 101h outputs a polarity set value indicating a positive polarity to the polarity switch 54 of the PLL circuit 91.

For example, when the second frequency $f_2$ is greater than the first frequency $f_1$, if the subtraction result $\Delta f_{set}$–d×fm output from the comparator 101b is less than 0, the sign extractor 101h outputs a polarity set value indicating the negative polarity to the polarity switch 54.

For example, when the first frequency $f_1$ is equal to or greater than the second frequency $f_2$, if the subtraction result $\Delta f_{set}$–d×fm output from the comparator 101b is equal to or greater than 0, the sign extractor 101h outputs a polarity set value indicating the negative polarity to the polarity switch 54.

For example, when the first frequency $f_1$ is equal to or greater than the second frequency $f_2$, if the subtraction result $\Delta f_{set}$–d×fm output from the comparator 101b is less than 0, the sign extractor 101h outputs the polarity set value indicating the positive polarity to the polarity switch 54.

Next, the operation of the optical frequency control device 1 illustrated in FIG. 12 will be described. Note that, since the optical frequency control device 1 is similar to the optical frequency control device 1 illustrated in FIG. 8 except for the PLL circuit 91 of the light source control circuit 90 and the frequency division number setting unit 101 of the signal processing unit 100, only the operations of the PLL circuit 91 and the frequency division number setting unit 101 will be described herein.

For example, when a set value $\Delta f_{set}$ of the frequency difference $\Delta f$ is given from the outside of the device, the subtractor 101a of the frequency division number setting unit 101 subtracts the multiplication result d×fm of the multiplier 101d from the set value $\Delta f_{set}$. Note that, since the initial value of the order d is 1, the multiplication result d×fm is equal to fm at the present time.

The subtractor 101a outputs the subtraction result $\Delta f_{set}$–d×fm to the comparator 101b.

The comparator 101b compares the subtraction result $\Delta f_{set}$–d×fm output from the subtractor 101a with –fm/2, and also compares the subtraction result $\Delta f_{set}$ d×fm with +fm/2.

As shown in the following Expression (6), when the subtraction result $\Delta f_{set}$–d×fm is equal to or less than –fm/2, or the subtraction result $\Delta f_{set}$–d×fm is equal to or greater than +fm/2, the comparator 101b outputs an increment command of the order d to the increment unit 101c.

$$\Delta f_{set}-d\times fm \leq -fm/2$$

OR $$\Delta f_{set}-d\times fm \geq fm/2 \qquad (6)$$

When the subtraction result $\Delta f_{set}$–d×fm is greater than –fm/2 and less than +fm/2 as expressed in the following Expression (7), the comparator 101b determines the order d at the present time as the order d of the sideband light.

$$-fm/2 < \Delta f_{set}-d\times fm < fm/2 \qquad (7)$$

When determining the order d of the sideband light, the comparator 101b outputs the subtraction result $\Delta f_{set}$–d×fm to each of the absolute value calculator 101e and the sign extractor 101h.

Herein, for convenience of explanation, it is assumed that the subtraction result $\Delta f_{set}$–d×fm is equal to or less than –fm/2 or less, or the subtraction result $\Delta f_{set}$–d×fm is equal to or greater than +fm/2 or more, and the comparator 101b outputs an increment command of the order d to the increment unit 101c.

When receiving the increment command from the comparator 101b, the increment unit 101c increments the order d by 1. Since the order d before being incremented is 1, the order d output from the increment unit 101c is 2.

The multiplier 101d multiplies the order d output from the increment unit 101c by the modulation frequency fm, and outputs a multiplication result d×fm of the order d by the modulation frequency fm to the subtractor 101a.

Upon receiving the multiplication result d×fm from the multiplier 101d, the subtractor 101a subtracts the multiplication result d×fm from the set value $\Delta f_{set}$ of the frequency difference $\Delta f$. Since the order d output from the increment unit 101c is 2, the multiplication result d×fm is equal to 2fm.

The subtractor 101a outputs the subtraction result $\Delta f_{set}$–d×fm to the comparator 101b.

The comparator 101b compares the subtraction result $\Delta f_{set}$–d×fm output from the subtractor 101a with –fm/2, and also compares the subtraction result $\Delta f_{set}$ d×fm with +fm/2.

As shown in Expression (6), when the subtraction result $\Delta f_{set}$–d×fm is equal to or less than –fm/2, or the subtraction result $\Delta f_{set}$–d×fm is equal to or greater than +fm/2, the comparator 101b outputs an increment command of the order d to the increment unit 101c.

When the subtraction result $\Delta f_{set}$–d×fm is greater than –fm/2 and less than +fm/2 as expressed in Expression (7), the comparator 101b determines the order d at the present time as the order d of the sideband light.

The comparator 101b outputs the subtraction result $\Delta f_{set}$–d×fm to each of the absolute value calculator 101e and the sign extractor 101h.

Herein, for convenience of description, it is assumed that the subtraction result $\Delta f_{set}$–d×fm is greater than –fm/2 and less than +fm/2, and the comparator 101b outputs the subtraction result $\Delta f_{set}$–d×fm to each of the absolute value calculator 101e and the sign extractor 101h.

Upon receiving the subtraction result $\Delta f_{set}$–d×fm from the comparator 101b, the absolute value calculator 101e calculates the absolute value |$\Delta f_{set}$–d×fm| of the subtraction result $\Delta_{set}$ d×fm.

The absolute value calculator 101e outputs the absolute value |$\Delta f_{set}$–d×fm| to the multiplier 101g.

The divider 101f acquires the second frequency division number R stored in the internal memory and the frequency fr included in the reference signal stored in the internal memory.

The divider 101f divides the second frequency division number R by the frequency fr and outputs a division result R/fr to the multiplier 101g.

The multiplier 101g multiplies the absolute value |$\Delta f_{set}$–d×fm| output from the absolute value calculator 101e by the division result R/fr output from the divider 101f.

The multiplication result |$\Delta f_{set}$–d×fm|×R/fr of the absolute value |$\Delta f_{set}$–d×fm| and the division result R/fr corresponds to the first frequency division number N as shown in Expression (8).

The multiplier 101g outputs the multiplication result |$\Delta f_{set}$–d×fm|×R/fr to the prescaler 51 of the PLL circuit 91 as the first frequency division number N.

$$N = \frac{R}{fr}|\Delta f_{set} - d \times fm| \qquad (8)$$

For example, when the second frequency $f_2$ is greater than the first frequency $f_1$, if the subtraction result $\Delta f_{set}$–d×fm output from the comparator 101b is equal to or greater than 0 as shown by the following Expression (9), the sign extractor 101h outputs a polarity set value indicating a positive polarity to the polarity switch 54 of the PLL circuit 91.

$$\Delta f_{set}-d\times fm \geq 0 \qquad (9)$$

For example, when the second frequency $f_2$ is greater than the first frequency $f_1$, if the subtraction result $\Delta f_{set}$–d×fm output from the comparator 101b is less than 0 as shown by the following Expression (10), the sign extractor 101h outputs a polarity set value indicating the negative polarity to the polarity switch 54.

$$\Delta f_{set} - d \times fm < 0 \qquad (10)$$

For example, when the first frequency $f_1$ is equal to or greater than the second frequency $f_2$, if the subtraction result $\Delta f_{set} - d \times fm$ output from the comparator 101b is equal to or greater than 0 as shown by Expression (9), the sign extractor 101h outputs a polarity set value indicating the negative polarity to the polarity switch 54.

For example, when the first frequency $f_1$ is equal to or greater than the second frequency $f_2$, if the subtraction result $\Delta f_{set} - d \times fm$ output from the comparator 101b is less than 0 as shown by Expression (10), the sign extractor 101h outputs a polarity set value indicating the positive polarity to the polarity switch 54.

The prescaler 51 of the PLL circuit 91 frequency-divides the differential beat signal output from the photodiode 19 by the first frequency division number N output from the multiplier 101g of the frequency division number setting unit 101.

Since the frequency included in the differential beat signal is $f_2-(f_1+d \times fm)$, the frequency of the differential beat signal after the frequency division by the prescaler 51 is $(f_2-(f_1+d \times fm))/N$.

The prescaler 51 outputs the divided differential beat signal to the polarity switch 54.

The prescaler 52 of the PLL circuit 91 frequency-divides the reference signal output from the reference signal source 20 by the second frequency division number R output from the frequency division number setting unit 101.

Since the frequency included in the reference signal is fr, the reference signal after the frequency division by the prescaler 52 is fr/R.

The prescaler 52 outputs the divided reference signal to the polarity switch 54.

If the polarity set value output from the sign extractor 101h indicates that the polarity of the phase error signal is set to be positive, the polarity switch 54 of the PLL circuit 91 sets the polarity of the phase error signal output from the phase comparator 53 to be positive.

If the polarity set value output from the sign extractor 101h indicates that the polarity of the phase error signal is set to be negative, the polarity switch 54 sets the polarity of the phase error signal output from the phase comparator 53 to be negative.

When the phase difference detected by the phase comparator 53 of the PLL circuit 91 converges and phase synchronization of the PLL circuit 91 is fulfilled, the following Expression (11) is established.

$$f_2 - f_1 = \frac{N}{R} fr + d \times fm \qquad (11)$$

Therefore, the frequency difference between the first frequency $f_1$ included in the first synchronization light included in the offset locking light and the second frequency $f_2$ included in the second synchronization light included in the offset locking light converges in accordance with Expression (11).

Figure 15:
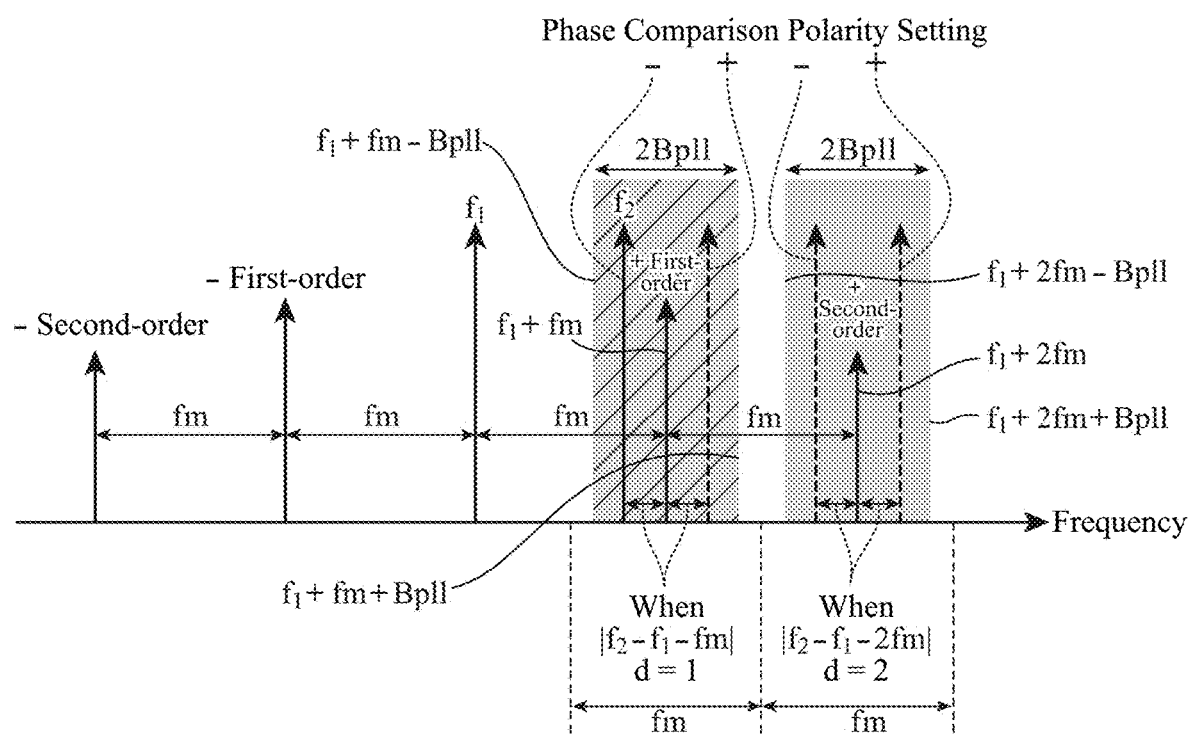
FIG. 15 is an explanatory diagram illustrating a first frequency $f_1$ included in first light, a second frequency $f_2$ included in second light, and respective frequencies of sideband light of orders d of −2 to +2.

FIG. 15 is an explanatory diagram illustrating the first frequency $f_1$ included in the first light, the second frequency $f_2$ included in the second light, and the frequencies of the respective sideband light in the order d of −2 to +2.

Herein, for convenience of description, it is assumed that the response frequency of the PLL circuit 91 is in a range of DC (direct current) to Bpll. Bpll>0.

For example, it is assumed that the order d determined by the comparator 101b of the frequency division number setting unit 101 is 1 and the polarity set by the polarity switch 54 of the frequency division number setting unit 101 is negative.

In this case, the second frequency $f_2$ included in the second light can be converged in a range between the sideband frequency $f_1+fm$ of the +first-order sideband light and a frequency lower by Bpll from the sideband frequency $f_1+fm$.

Next, it is assumed that the order d determined by the comparator 101b is 1 and the polarity set by the polarity switch 54 is positive.

In this case, the second frequency $f_2$ included in the second light can be converged in a range of the sideband frequency $f_1+fm$ and a frequency higher by Bpll from the sideband frequency $f_1+fm$.

Therefore, if the order d is 1, the second frequency $f_2$ included in the second light can be changed by a range of 2Bpll. The range of 2Bpll is twice the variable width of the second frequency $f_2$ in a case where the polarity of the phase error signal is fixed.

For example, it is assumed that the order d determined by the comparator 101b of the frequency division number setting unit 101 is 2 and the polarity set by the polarity switch 54 of the frequency division number setting unit 101 is negative.

In this case, the second frequency $f_2$ included in the second light can be converged to a range between the sideband frequency $f_1+2fm$ included in the +second-order sideband light and a frequency lower by Bpll from the sideband frequency $f_1+2fm$.

Next, it is assumed that the order d determined by the comparator 101b is 2 and the polarity set by the polarity switch 54 is positive.

In this case, the second frequency $f_2$ included in the second light can be converged in a range of the sideband frequency $f_1+2fm$ and a frequency higher by Bpll from the sideband frequency $f_1+2fm$.

Therefore, if the order d is 2, the second frequency $f_2$ included in the second light can be changed by a range of 2Bpll. The range of 2Bpll is twice the variable width of the second frequency $f_2$ in a case where the polarity of the phase error signal is fixed.

If the order d can be switched to n stages, the second frequency $f_2$ included in the second light can be changed by a range of 2×n×Bpll.

In the fourth embodiment described above, the optical frequency control device 1 illustrated in FIG. 12 is configured in such a manner that the signal processing unit 100 switches the polarity of the phase error signal output from the light source control circuit 90. Therefore, similarly to the optical frequency control device 1 illustrated in FIG. 1, the optical frequency control device 1 illustrated in FIG. 12 can change the frequency difference between the first frequency included in the first light and the second frequency included in the second light without using the frequency synthesizer.

Moreover, the optical frequency control device 1 illustrated in FIG. 12 can double the variable width of the second frequency included in the second light as compared with the optical frequency control device 1 illustrated in FIG. 1. Therefore, the response band of the PLL circuit 91 can be relaxed to ½ of the response band of the PLL circuit 22 illustrated in FIG. 1.

Furthermore, as compared with the optical frequency control device 1 illustrated in FIG. 1, the optical frequency control device 1 illustrated in FIG. 12 can reduce the possibility that the spurious caused by the mixing of the sideband of the desired order and the sideband of the order adjacent to the sideband is mixed in the PLL circuit 91.

Fifth Embodiment

In a fifth embodiment, an optical frequency control device 1 including a power regulator 110 that regulates power of a local oscillation signal oscillated by a first local oscillation signal source 15 will be described.

Figure 16:
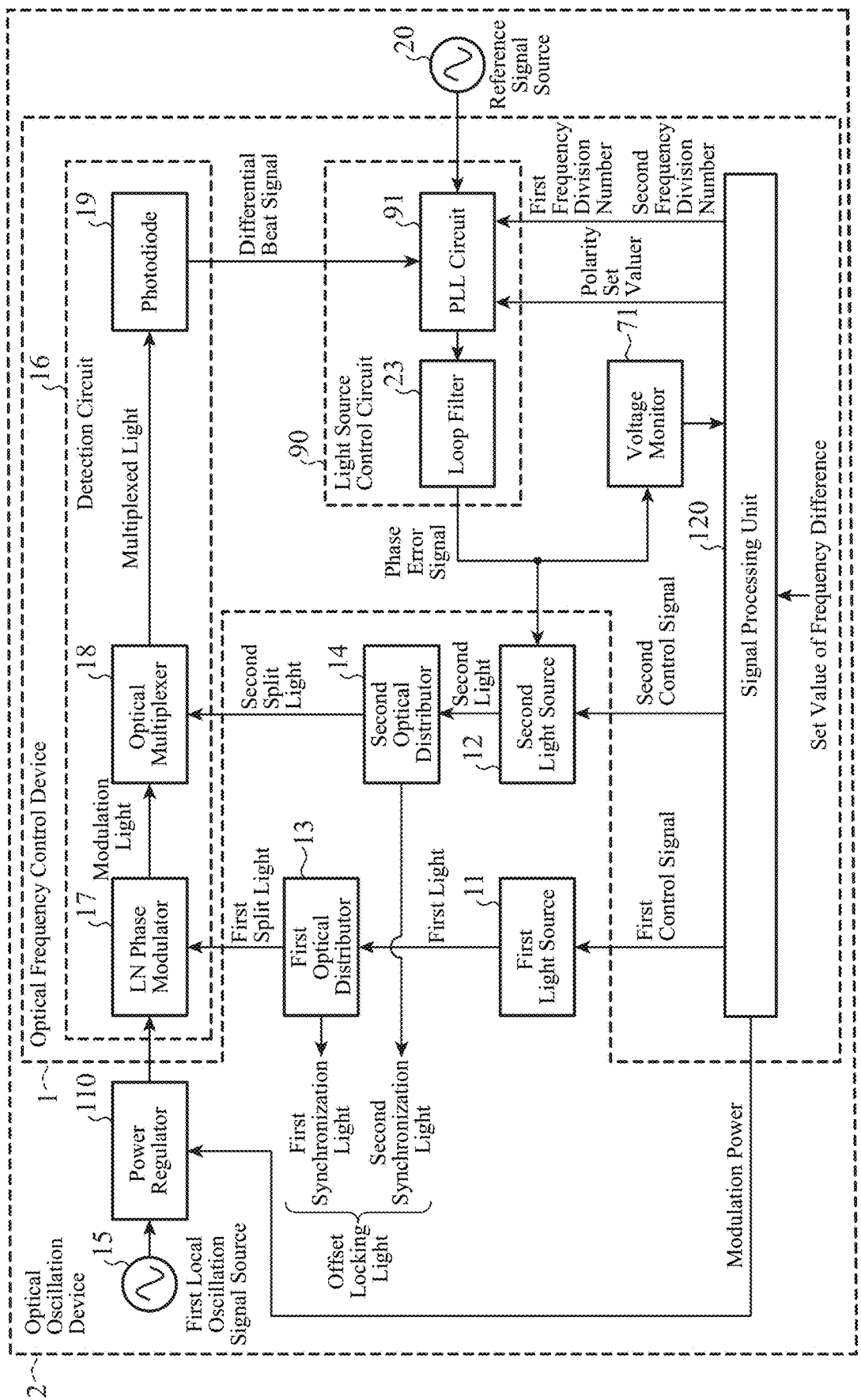
FIG. 16 is a configuration diagram illustrating an optical oscillation device 2 including an optical frequency control device 1 according to a fifth embodiment.

FIG. 16 is a configuration diagram illustrating an optical oscillation device 2 including the optical frequency control device 1 according to the fifth embodiment. In FIG. 16, the same reference signs as those in FIGS. 1, 8, and 12 denote the same or corresponding parts, and thus the description thereof is omitted.

The power regulator 110 is implemented, for example, by a variable attenuator.

The power regulator 110 regulates the power of the local oscillation signal so that the power of the local oscillation signal oscillated by the first local oscillation signal source 15 becomes modulation power $P_m$ output from a signal processing unit 120 described later, and outputs the local oscillation signal after the power regulation to the LN phase modulator 17 of the detection circuit 16.

The signal processing unit 100 performs the operation similar to that of the signal processing unit 120 illustrated in FIG. 12, and controls the regulation of power by the power regulator 110 on the basis of the order d determined by the comparator 101b.

In the optical frequency control device 1 illustrated in FIG. 16, the signal processing unit 120 performs the operation similar to that of the signal processing unit 100 illustrated in FIG. 12. However, this is merely an example, and the signal processing unit 120 may perform the operation similar to that of the signal processing unit 81 illustrated in FIG. 10 and control the regulation of the power by the power regulator 110 on the basis of the order d determined by the comparator 82b.

Figure 17:
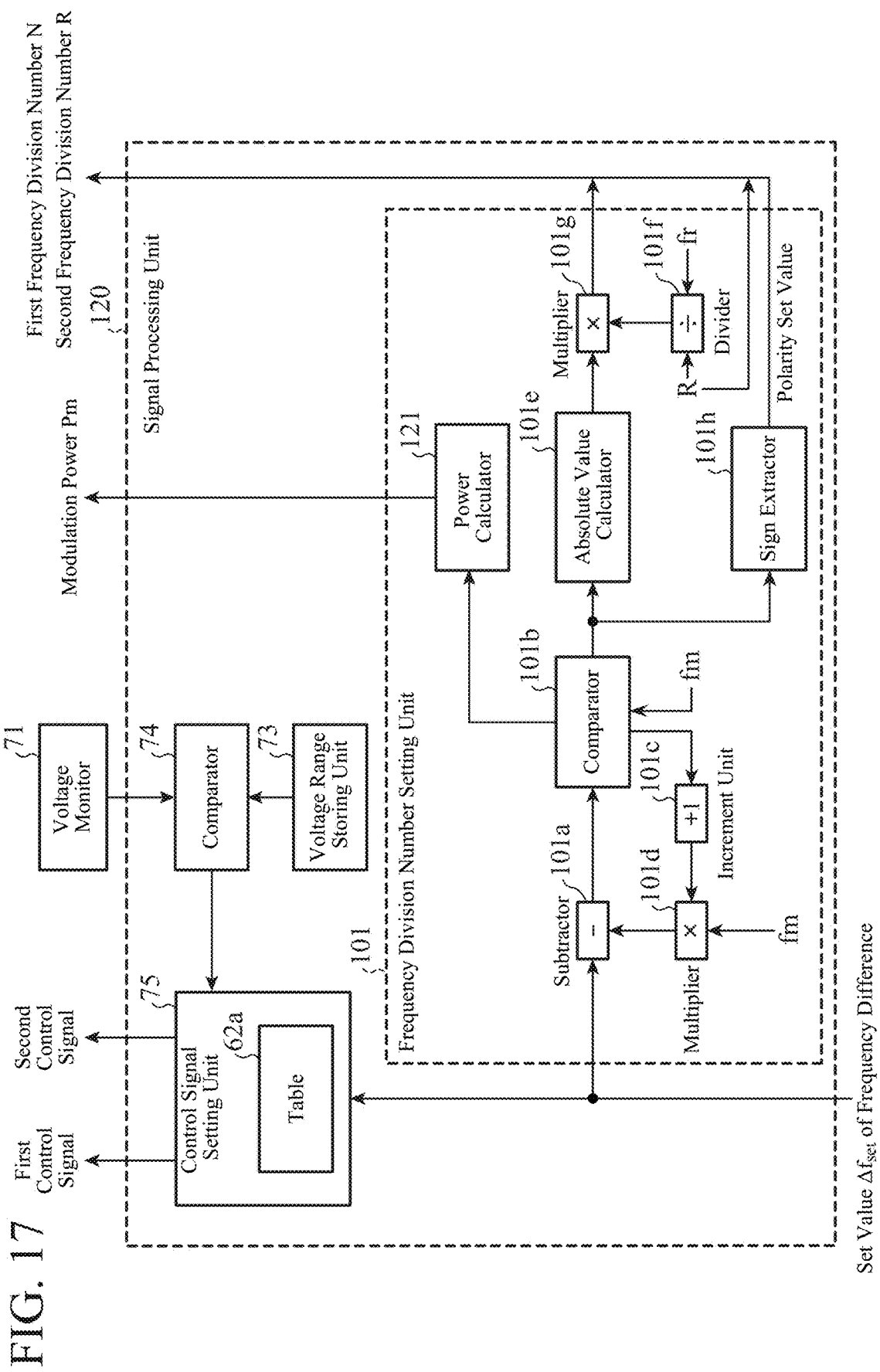
FIG. 17 is a configuration diagram illustrating a signal processing unit 120.

FIG. 17 is a configuration diagram illustrating the signal processing unit 120. In FIG. 17, the same reference signs as those in FIG. 14 denote the same or corresponding parts, and thus description thereof is omitted.

A power calculator 121 calculates the modulation power $P_m$ of the power regulator 110 based on the order d determined by the comparator 101b, and outputs the modulation power $P_m$ to the power regulator 110.

Next, the operation of the optical frequency control device 1 illustrated in FIG. 16 will be described. Note that, since the optical frequency control device 1 is similar to the optical frequency control device 1 illustrated in FIG. 12 except for the power regulator 110 and the power calculator 121 of the signal processing unit 120, only the operations of the power regulator 110 and the power calculator 121 will be described herein.

The optical frequency control device 1 illustrated in FIG. 16 uses an LN phase modulator 17 as a sideband generator.

In a case where the optical frequency control device 1 uses the LN phase modulator 17, the optical power of the sideband light of the order d is proportional to the square of the Bessel function of the first type $(|J_d(m)|^2)$ m is a modulation index by the LN phase modulator 17 and is expressed by the following Expression (12).

$$m[\text{rad}] = \pi \frac{\sqrt{2ZP_m}}{V_\pi} \tag{12}$$

In Expression (12), $V_\pi$ is the half wave voltage [V] of the LN phase modulator 17, Z is the input impedance [ohm] of the modulation port in the LN phase modulator 17, and $P_m$ is the modulation power [W].

Figure 18:
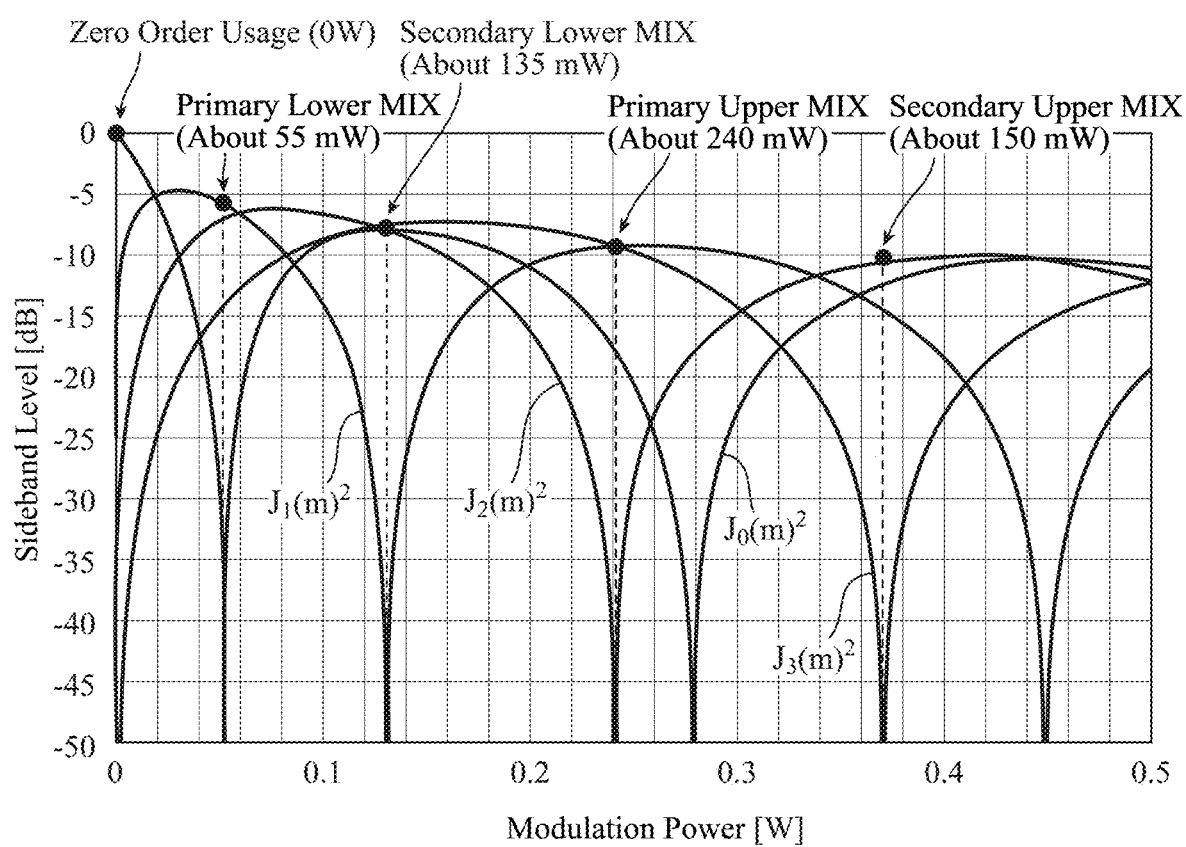
FIG. 18 is an explanatory diagram illustrating a calculation example of a sideband level with respect to modulation power of an LN phase modulator 17.

FIG. 18 is an explanatory diagram illustrating a calculation example of a sideband level with respect to modulation power of the LN phase modulator 17. In the calculation example of FIG. 18, the half wave voltage $V_\pi$ of the LN phase modulator 17 is 3 [V], and the input impedance Z of the modulation port in the LN phase modulator 17 is 50 [ohm].

In FIG. 18, the horizontal axis represents the modulation power $P_m$ [W], and the vertical axis represents the sideband level [dB].

"First-order lower MIX" means that the second light is mixed on the low frequency side of the primary sideband light, and "first-order upper MIX" means that the second light is mixed on the high frequency side of the first-order sideband light. "Second-order lower MIX" means that the second light is mixed on the low frequency side of the secondary sideband light, and "second-order upper MIX" means that the second-order light is mixed on the high frequency side of the secondary sideband light.

For example, in a case where the second frequency $f_2$ included in the second light is generated on the low frequency side of the sideband light having the order d of the second order, the adjacent sideband light that becomes a spurious factor is the sideband light having the order d of the first order.

As illustrated in FIG. 18, when the modulation power $P_m$ is about 135 [mW], the first-order sideband light is suppressed, which enables a level ratio of the second-order sideband light to the first-order sideband light to be high, so that the optical oscillation device 2 can suppress main spurious at the time of detecting the differential beat signal.

A power calculator 121 calculates the modulation power $P_m$ of the power regulator 110 based on the order d determined by the comparator 101b, and outputs the modulation power $P_m$ to the power regulator 110.

That is, the power calculator 121 calculates the modulation power $P_m$ that maximizes the level ratio of the sideband light of the order d with respect to the adjacent sideband light of the sideband light of the order d determined by the comparator 101b.

The modulation power $P_m$ calculated by the power calculator 121 is not limited to modulation power that maximizes the level ratio of the sideband light of the order d to the adjacent sideband light, and may be modulation power that makes the level of the sideband light of the order d greater than the level of the adjacent sideband light.

The power calculator 121 outputs the calculated modulation power $P_m$ to the power regulator 110.

The power regulator 110 regulates the power of the local oscillation signal so that the power of the local oscillation signal oscillated by the first local oscillation signal source 15 becomes the modulation power $P_m$ output from the power calculator 121.

The power regulator 110 outputs the local oscillation signal after the power regulation to the LN phase modulator 17.

In the fifth embodiment described above, the optical frequency control device 1 illustrated in FIG. 16 is configured to include the power regulator 110 that regulates the power of the local oscillation signal oscillated by the first local oscillation signal source 15, and the signal processing unit 120 controls the regulation of the power by the power regulator 110 on the basis of the order of the sideband light. Therefore, similarly to the optical frequency control device 1 illustrated in FIG. 1, the optical frequency control device 1 illustrated in FIG. 16 can change the frequency difference between the first frequency included in the first light and the second frequency included in the second light without using the frequency synthesizer.

Moreover, the optical frequency control device 1 illustrated in FIG. 16 can reduce the possibility that spurious is mixed into the PLL circuit 91 as compared with the optical frequency control device 1 illustrated in FIG. 1.

In addition, the optical frequency control device 1 illustrated in FIG. 16 can avoid interference between two signals occurring under the condition of $f_2-f_1=(n+0.5) \times fm$ where d is an integer. That is, interference between the first-order differential beat signal and the second-order differential beat signal can be avoided. Therefore, even under the condition that the band Bpll of the PLL circuit 91 is ½ of the modulation frequency fm, the PLL circuit 91 can be prevented from being out of synchronization.

Sixth Embodiment

In a sixth embodiment, an optical frequency control device 1, in which a detection circuit 152 detects a differential beat signal including a differential frequency between a frequency of sideband light included in modulated first light and a frequency of sideband light included in modulated second light, will be described.

Figure 19:
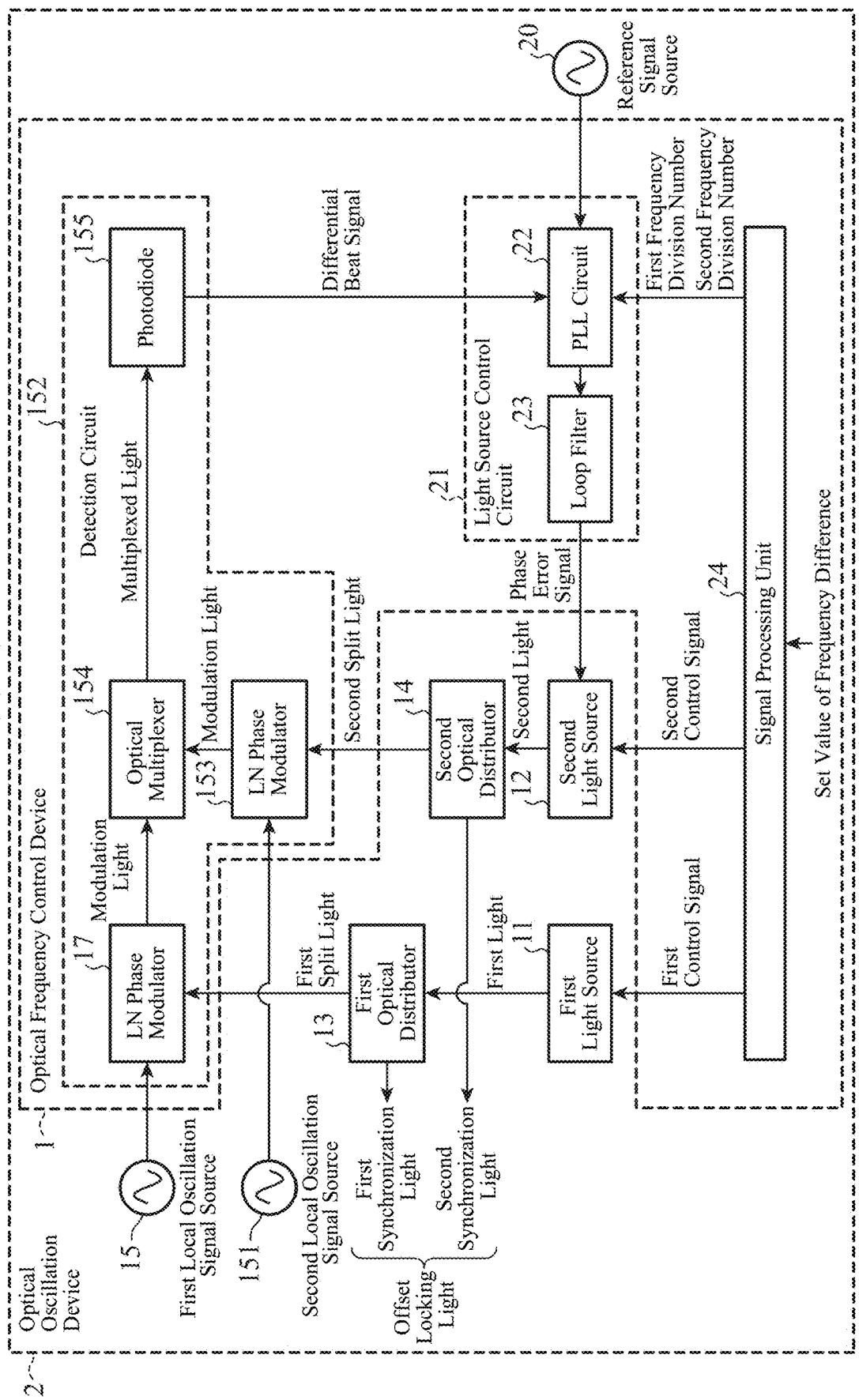
FIG. 19 is a configuration diagram illustrating an optical oscillation device 2 including an optical frequency control device 1 according to a sixth embodiment.

FIG. 19 is a configuration diagram illustrating an optical oscillation device 2 including the optical frequency control device 1 according to the sixth embodiment. In FIG. 19, the same reference signs as those in FIGS. 1, 8, 12, and 16 denote the same or corresponding parts, and thus the description thereof is omitted.

A second local oscillation signal source 151 oscillates a local oscillation signal whose frequency is fn.

The second local oscillation signal source 151 is connected to an LN phase modulator 153 of a detection circuit 152 via, for example, an optical fiber, and outputs the local oscillation signal to the LN phase modulator 153.

The detection circuit 152 includes an LN phase modulator 17, the LN phase modulator 153, an optical multiplexer 154, and a photodiode 155.

The detection circuit 152 receives first light from a first light source 11 and receives second light from a second light source 12.

The detection circuit 152 modulates the first light oscillated by the first light source 11 by the local oscillation signal oscillated by the first local oscillation signal source 15, and modulates the second light oscillated by the second light source 12 by the local oscillation signal oscillated by the second local oscillation signal source 151.

The detection circuit 152 detects a differential beat signal including a differential frequency $(f_2-fn)-(f_1+fm)$ between the frequency $f_1+fm$ of the sideband light included in the modulated first light and the frequency $f_2-fn$ of the sideband light included in the modulated second light.

The detection circuit 152 outputs the differential beat signal to the light source control circuit 21.

The LN phase modulator 153 modulates the second split light output from a second optical distributor 14 by the local oscillation signal oscillated by the second local oscillation signal source 151, thereby generating sideband light having a frequency of $f_2 \pm fn$. fn is a modulation frequency by the LN phase modulator 153.

The LN phase modulator 153 is connected to the optical multiplexer 154 via, for example, an optical fiber, and outputs modulation light including each of the second frequency $f_2$ and the frequency $f_2 \pm fn$ to the optical multiplexer 154 as the modulated second light.

In the optical frequency control device 1 illustrated in FIG. 19, the detection circuit 152 includes an LN phase modulator 153. However, the embodiment is not limited to the LN phase modulator 153 as long as the modulator can generate sideband light, and the detection circuit 152 may include a Mach-Zehnder intensity modulator, an electro-absorption modulator, or the like.

The optical multiplexer 154 multiplexes the modulation light output from the LN phase modulator 17 and the modulation light output from the LN phase modulator 153.

The optical multiplexer 154 is connected to the photodiode 155 via, for example, an optical fiber, and outputs multiplexed light of the modulation light output from the LN phase modulator 17 and the modulation light output from the LN phase modulator 153 to the photodiode 155.

The photodiode 155 converts the multiplexed light output from the optical multiplexer 154 into an electric signal.

The photodiode 155 detects a differential frequency $(f_2-fn)-(f_1+fm)$ between the frequency $f_1+fm$ of the sideband light included in the modulated first light and the frequency $f_2-fn$ of the sideband light included in the modulated second light from the electric signal.

The photodiode 155 outputs a signal including a differential frequency $(f_2-fn)-(f_1+fm)$ as a differential beat signal to the PLL circuit 22 of the light source control circuit 21.

In the optical oscillation device 2 illustrated in FIG. 19, the second local oscillation signal source 151 and the detection circuit 152 are applied to the optical oscillation device 2 illustrated in FIG. 1. However, this is merely an example, and the second local oscillation signal source 151 and the detection circuit 152 may be applied to the optical oscillation device 2 illustrated in FIG. 8, the optical oscillation device 2 illustrated in FIG. 12, or the optical oscillation device 2 illustrated in FIG. 16.

Next, the operation of the optical oscillation device 2 illustrated in FIG. 19 will be described.

The first local oscillation signal source 15 oscillates a local oscillation signal having a frequency of fm and outputs the local oscillation signal to the LN phase modulator 17.

The LN phase modulator 17 modulates the first split light output from the first optical distributor 13 by the local oscillation signal oscillated by the first local oscillation signal source 15, thereby generating sideband light (see FIG. 20) having a frequency of $f_1 \pm fm$. The phase of the modulation frequency fm by the LN phase modulator 17 is stable, for example, in the microwave region.

The LN phase modulator 17 outputs the modulation light including each of the first frequency $f_1$ and the frequency $f_1 \pm fm$ to the optical multiplexer 154.

The second local oscillation signal source 151 oscillates a local oscillation signal having a frequency of fn and outputs the local oscillation signal to the LN phase modulator 153.

The LN phase modulator 153 modulates the second split light output from the second optical distributor 14 by the local oscillation signal oscillated by the second local oscillation signal source 151, thereby generating sideband light (see FIG. 20) having a frequency of $f_2 \pm fn$. The phase of the modulation frequency fn by the LN phase modulator 153 is stable, for example, in the microwave region.

The LN phase modulator 153 outputs the modulation light including each of the second frequency $f_2$ and the frequency $f_2 \pm fn$ to the optical multiplexer 154.

Figure 20:
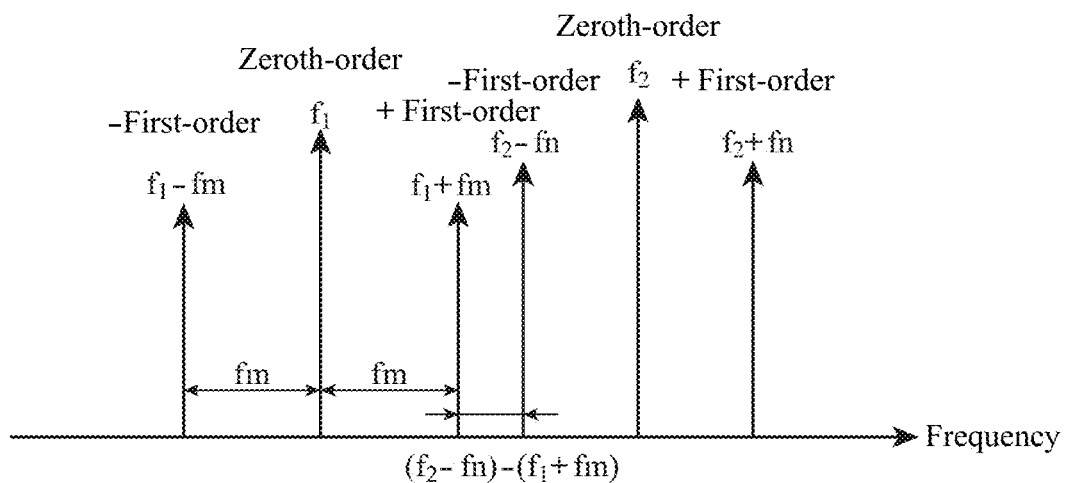
FIG. 20 is an explanatory diagram illustrating a first frequency $f_1$ included in first light, frequencies $f_1$−fm and $f_1$+fm of sideband light included in modulated first light, a second frequency $f_2$ included in second light, and frequencies $f_2$−fn and $f_2$+fn of sideband light included in modulated second light.

FIG. 20 is an explanatory diagram illustrating a first frequency $f_1$ included in first light, frequencies $f_1-fm$ and $f_1+fm$ of sideband light included in modulated first light, a second frequency $f_2$ included in second light, and frequencies $f_2-fn$ and $f_2+fn$ of sideband light included in modulated second light.

In FIG. 20, $(f_2-fn)-(f_1+fm)$ is a differential frequency between the frequency $f_1+fm$ of the sideband light included in the modulated first light and the frequency $f_2-fn$ of the sideband light included in the modulated second light.

In the optical frequency control device 1 illustrated in FIG. 19, the LN phase modulator 17 generates sideband light having a frequency of $f_1 \pm fm$ at an interval of the modulation frequency fm on both sides of the first frequency $f_1$ with the first frequency $f_1$ as the center. However, this is merely an example, and the LN phase modulator 17 may generate, for example, only sideband light having a frequency of $f_1+fm$ on one side of the first frequency $f_1$.

In the optical frequency control device 1 illustrated in FIG. 19, the LN phase modulator 153 generates sideband light having a frequency of $f_2 \pm fn$ at an interval of the modulation frequency fn on both sides of the second frequency $f_2$ with the second frequency $f_2$ as the center. However, this is merely an example, and the LN phase modulator 153 may generate, for example, only the sideband light having the frequency $f_2-fn$ on one side of the second frequency $f_2$.

The optical multiplexer 154 multiplexes the modulation light output from the LN phase modulator 17 and the modulation light output from the LN phase modulator 153.

The optical multiplexer 154 outputs the multiplexed light of the modulation light output from the LN phase modulator 17 and the modulation light output from the LN phase modulator 153 to the photodiode 155.

As illustrated in FIG. 20, the multiplexed light includes a first frequency $f_1$ included in the first light and frequencies $f_1-fm$ and $f_1+fm$ of the sideband light included in the modulated first light.

Moreover, as illustrated in FIG. 20, the multiplexed light includes a second frequency $f_2$ included in the second light and frequencies $f_2-fn$ and $f_2+fn$ of the sideband light included in the modulated second light.

When receiving the multiplexed light from the optical multiplexer 154, the photodiode 155 converts the multiplexed light into an electric signal.

The photodiode 155 detects a differential frequency $(f_2-fn)-(f_1+fm)$ between the frequency $f_1+fm$ of the sideband light included in the modulated first light and the frequency $f_2-fn$ of the sideband light included in the modulated second light from the electric signal.

The photodiode 155 outputs a signal including the differential frequency $(f_2-fn)-(f_1+fm)$ as a differential beat signal to the PLL circuit 22 of the light source control circuit 21.

In the optical frequency control device 1 illustrated in FIG. 19, assuming that the first frequency $f_1$<the second frequency $f_2$, the photodiode 155 detects, from the electric signal, a differential frequency $(f_2-fn)-(f_1+fm)$ between the frequency $f_1+fm$ of the sideband light included in the modulated first light and the frequency $f_2-fn$ of the sideband light included in the modulated second light. However, this is merely an example, and for example, if the frequency $f_1$>the frequency $f_2$, the photodiode 155 may detect, from the electric signal, the differential frequency $(f_1-fm)-(f_2+fn)$ between the frequency $f_1-fm$ of the sideband light included in the modulated first light and the frequency $f_2+fn$ of the sideband light included in the modulated second light. In this case, the photodiode 155 outputs a signal including a differential frequency $(f_1-fn)-(f_2+fn)$ to the PLL circuit 22 as a differential beat signal.

The reference signal source 20 oscillates a reference signal having a frequency fr and outputs the reference signal to the PLL circuit 22 of the light source control circuit 21.

The light source control circuit 21 frequency-divides the differential beat signal output from the photodiode 155 by a first frequency division number N and frequency-divides the reference signal output from the reference signal source 20 by a second frequency division number R.

The light source control circuit 21 outputs a phase error signal indicating a phase difference between the frequency-divided differential beat signal and the frequency-divided reference signal to the second light source 12, thereby changing the second frequency $f_2$ included in the second light oscillated by the second light source 12.

Hereinafter, the operation of the light source control circuit 21 will be described in detail.

The prescaler 51 of the PLL circuit 22 frequency-divides the differential beat signal output from the photodiode 155 by the first frequency division number N output from the signal processing unit 24.

Since the frequency included in the differential beat signal is $(f_2-fn)-(f_1+fm)$, the frequency of the differential beat signal after the frequency division by the prescaler 51 is $((f_2-fn)-(f_1+fm))/N$.

The prescaler 51 outputs the frequency-divided differential beat signal to the phase comparator 53.

The prescaler 52 of the PLL circuit 22 frequency-divides the reference signal output from the reference signal source 20 by the second frequency division number R output from the signal processing unit 24.

Since the frequency included in the reference signal is fr, the reference signal after the frequency division by the prescaler 52 is fr/R.

The prescaler 52 outputs the frequency-divided reference signal to the phase comparator 53.

The phase comparator 53 of the PLL circuit 22 detects a phase difference between the frequency-divided differential beat signal output from the prescaler 51 and the frequency-divided reference signal output from the prescaler 52.

The phase comparator 53 outputs a phase error signal indicating a phase difference to the loop filter 23.

The loop filter 23 integrates the phase error signal output from the phase comparator 53 and outputs the integrated phase error signal to the second light source 12.

When the phase error signal after the integration is output to the second light source 12, the second frequency $f_2$ included in the second light output from the second light source 12 changes.

When the phase difference detected by the phase comparator 53 converges and phase synchronization of the PLL circuit 22 is fulfilled, the following Expression (13) is established.

$$\frac{((f_2 - f_n) - (f_1 + fm))}{N} = \frac{fr}{R} \quad (13)$$

Expression (13) can be organized as the following Expression (14).

$$f_2 - f_1 = \frac{N}{R} fr + fm + fn \tag{14}$$

Expression (14) represents an offset frequency $f_2-f_1$ between the first frequency $f_1$ included in the first light oscillated by the first light source 11 and the second frequency $f_2$ included in the second light oscillated by the second light source 12. The offset frequency $f_2-f_1$ is determined by the first frequency division number N, the second frequency division number R, the frequency fr included in the reference signal, the modulation frequency fm, and the modulation frequency fn included in the reference signal.

The offset frequency $f_2-f_1$ corresponds to a frequency difference between the first frequency $f_1$ included in the first synchronization light and the second frequency $f_2$ included in the second synchronization light. The first synchronization light and the second synchronization light are light forming offset locking light.

When Expression (13) is solved for N, the following Expression (15) is obtained.

$$N = \frac{R}{fr}(f_2 - f_1 - fm - fn) \tag{15}$$
$$= \frac{R}{fr}(\Delta f_{set} - fm - fn)$$

Upon receiving the set value $\Delta f_{set}$ of the frequency difference $\Delta f$ between the first frequency $f_1$ and the second frequency $f_2$ from the outside of the device, the signal processing unit 24 sets each of the first frequency division number N and the second frequency division number R in accordance with the set value $\Delta f_{set}$ as the first embodiment.

The signal processing unit 24 outputs each of the first frequency division number N and the second frequency division number R to the PLL circuit 22.

Similarly to the first embodiment, the signal processing unit 24 sets each of the first control signal for controlling the first frequency $f_1$ and the second control signal for controlling the second frequency $f_2$ in accordance with the set value $\Delta f_{set}$.

The signal processing unit 24 outputs the first control signal to the first light source 11 and outputs the second control signal to second light source 12.

Similarly to the first embodiment, the first light source 11 changes the first frequency $f_1$ included in the first light in accordance with the first control signal output from the signal processing unit 24, and oscillates the first light including the changed first frequency $f_1$.

Thus, the first frequency $f_1$ included in the first light is adjusted in accordance with the set value $\Delta f_{set}$ of the frequency difference $\Delta f$.

The first light source 11 outputs the first light including the first frequency $f_1$ to the first optical distributor 13.

Similarly to the first embodiment, the second light source 12 changes the second frequency $f_2$ included in the second light in accordance with each of the phase error signal output from the loop filter 23 of the light source control circuit 21 and the second control signal output from the signal processing unit 24, and oscillates the second light including the changed second frequency $f_2$.

Thus, the second frequency $f_2$ included in the second light is adjusted in accordance with the set value $\Delta f_{set}$ of the frequency difference $\Delta f$.

The second light source 12 outputs the second light including the second frequency $f_2$ to the second optical distributor 14.

When receiving the first light from the first light source 11, the first optical distributor 13 distributes the first light and outputs the first split light, which is one light after the distribution, to the LN phase modulator 17.

The first optical distributor 13 outputs the first synchronization light, which is the other light after the distribution, to the outside of the device as one light of the offset locking light.

When receiving the second light from the second light source 12, the second optical distributor 14 distributes the second light and outputs the second split light, which is one light after the distribution, to the LN phase modulator 153.

The second optical distributor 14 outputs the second synchronization light, which is the other light after the distribution, to the outside of the device as the other light in the offset locking light.

Figure 21:
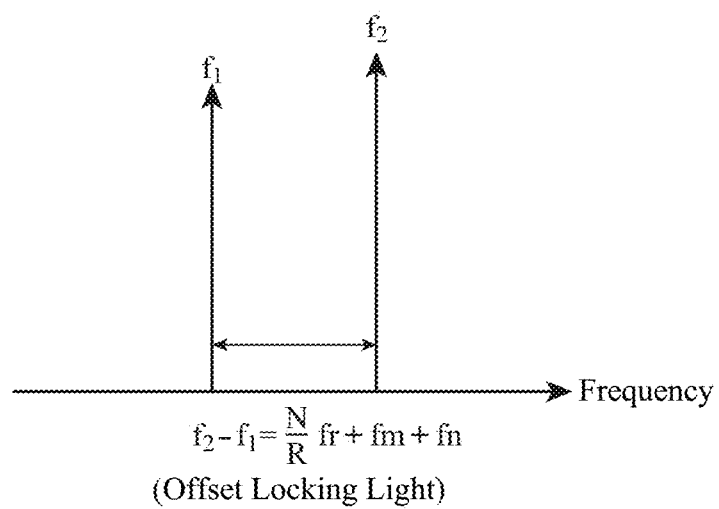
FIG. 21 is an explanatory view illustrating offset locking light.

FIG. 21 is an explanatory diagram illustrating off set locking light.

In FIG. 21, the frequency $f_1$ is the first frequency included in the first synchronization light, and the frequency $f_2$ is the second frequency included in the second synchronization light.

Since each of the first frequency $f_1$ and the second frequency $f_2$ is adjusted in accordance with the set value $\Delta f_{set}$ of the frequency difference $\Delta f$, the frequency difference $\Delta f$ between the first frequency $f_1$ and the second frequency $f_2$ can be changed.

In the sixth embodiment described above, the detection circuit 152 modulates the second light oscillated by the second light source 12 by the local oscillation signal oscillated by the second local oscillation signal source 151. The optical frequency control device 1 illustrated in FIG. 19 is configured in such a manner that the detection circuit 152 detects the differential beat signal including the differential frequency between the frequency of the sideband light included in the modulated first light and the frequency of the sideband light included in the modulated second light instead of detecting the differential beat signal including the differential frequency between the frequency of the sideband light included in the modulated first light and the second frequency. Therefore, similarly to the optical frequency control device 1 illustrated in FIG. 1, the optical frequency control device 1 illustrated in FIG. 19 can change the frequency difference between the first frequency included in the first light and the second frequency included in the second light without using a frequency synthesizer.

Seventh Embodiment

In a seventh embodiment, an optical frequency control device 1, in which a detection circuit 156 modulates second light oscillated by a second light source 12 by a local oscillation signal oscillated by a first local oscillation signal source 15, will be described.

Figure 22:
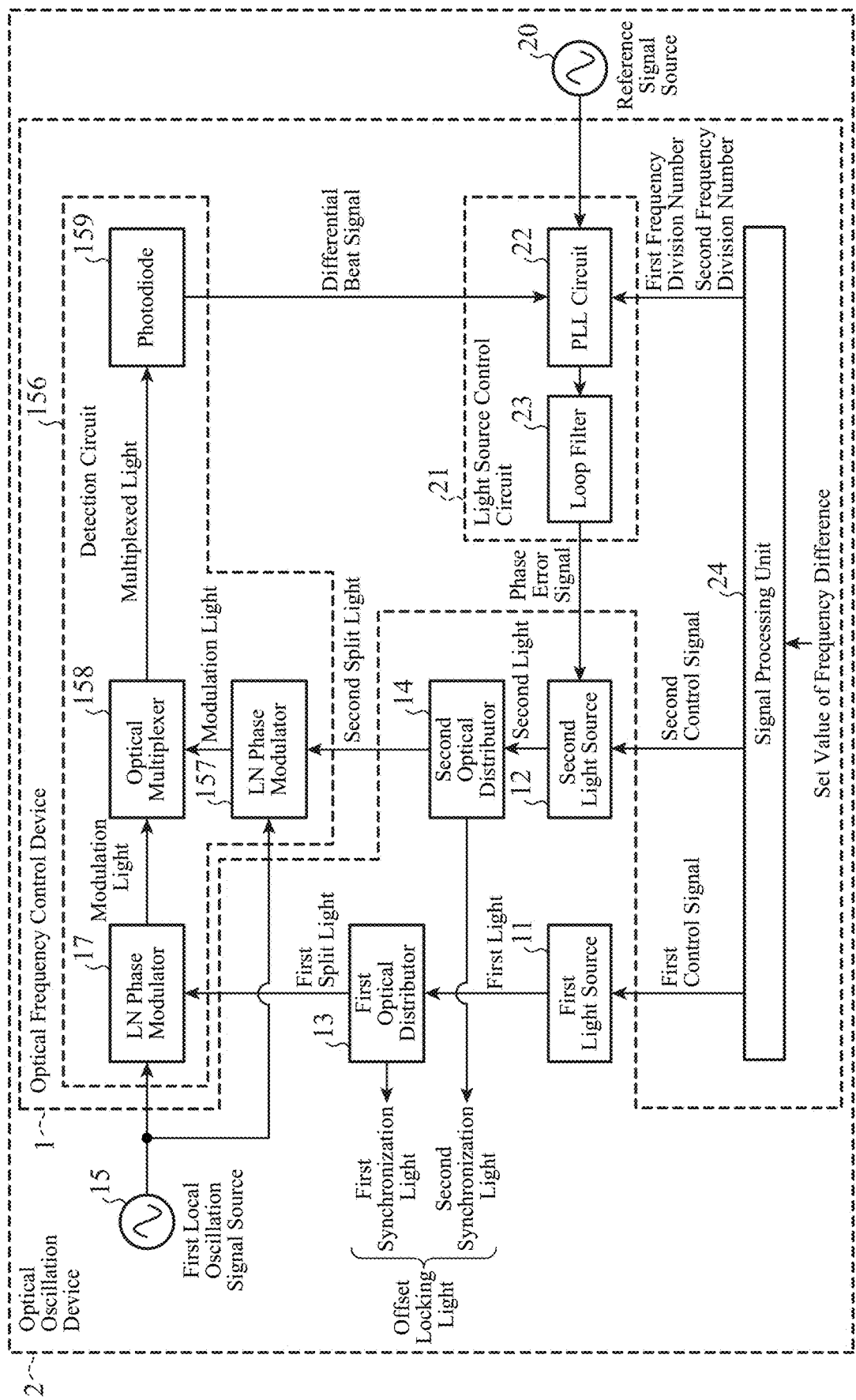
FIG. 22 is a configuration diagram illustrating an optical oscillation device 2 including an optical frequency control device 1 according to a seventh embodiment.

FIG. 22 is a configuration diagram illustrating an optical oscillation device 2 including the optical frequency control device 1 according to the seventh embodiment. In FIG. 22, the same reference signs as those in FIGS. 1, 8, 12, 16, and 19 denote the same or corresponding parts, and thus the description thereof is omitted.

The detection circuit 156 includes an LN phase modulator 17, an LN phase modulator 157, an optical multiplexer 158, and a photodiode 159.

The detection circuit 156 receives the first light from the first light source 11 and receives the second light from the second light source 12.

The detection circuit 156 modulates the first light oscillated by the first light source 11 by the local oscillation signal oscillated by the first local oscillation signal source 15 and modulates the second light oscillated by the second light source 12 by the local oscillation signal oscillated by the first local oscillation signal source 15.

The detection circuit 156 detects a differential beat signal including a differential frequency $(f_2-fm)-(f_1+fm)$ between the frequency $f_1+fm$ of the sideband light included in the modulated first light and the frequency $f_2-fm$ of the sideband light included in the modulated second light.

The detection circuit 156 outputs the differential beat signal to the light source control circuit 21.

The LN phase modulator 157 modulates the second split light output from the second optical distributor 14 by the local oscillation signal oscillated by the first local oscillation signal source 15, thereby generating sideband light having a frequency of $f_2\pm fm$.

The LN phase modulator 157 is connected to the optical multiplexer 158 via, for example, an optical fiber, and outputs modulation light including each of the second frequency $f_2$ and the frequency $f_2\pm fm$ to the optical multiplexer 158 as the modulated second light.

In the optical frequency control device 1 illustrated in FIG. 22, the detection circuit 156 includes the LN phase modulator 157. However, it is not limited to the LN phase modulator 157 as long as the modulator can generate sideband light, and the detection circuit 156 may include a Mach-Zehnder intensity modulator, an electro-absorption modulator, or the like.

The optical multiplexer 158 multiplexes the modulation light output from the LN phase modulator 17 and the modulation light output from the LN phase modulator 157.

The optical multiplexer 158 is connected to the photodiode 159 via, for example, an optical fiber, and outputs multiplexed light of the modulation light output from the LN phase modulator 17 and the modulation light output from the LN phase modulator 157 to the photodiode 159.

The photodiode 159 converts the multiplexed light output from the optical multiplexer 158 into an electric signal.

The photodiode 159 detects a differential frequency $(f_2-fm)-(f_1+fm)$ between the frequency $f_1+fm$ of the sideband light included in the modulated first light and the frequency $f_2-fm$ of the sideband light included in the modulated second light from the electric signal.

The photodiode 159 outputs a signal including the differential frequency $(f_2-fm)-(f_1+fm)$ as a differential beat signal to the PLL circuit 22 of the light source control circuit 21.

In the optical oscillation device 2 illustrated in FIG. 22, the detection circuit 156 is applied to the optical oscillation device 2 illustrated in FIG. 1. However, this is merely an example, and the detection circuit 156 may be applied to the optical oscillation device 2 illustrated in FIG. 8, the optical oscillation device 2 illustrated in FIG. 12, or the optical oscillation device 2 illustrated in FIG. 16.

Next, the operation of the optical oscillation device 2 illustrated in FIG. 22 will be described.

The first local oscillation signal source 15 oscillates a local oscillation signal having a frequency of fm and outputs the local oscillation signal to each of the LN phase modulator 17 and the LN phase modulator 157.

The LN phase modulator 17 modulates the first split light output from the first optical distributor 13 by the local oscillation signal oscillated by the first local oscillation signal source 15, thereby generating sideband light (see FIG. 23) having a frequency of $f_1\pm fm$.

The LN phase modulator 17 outputs the modulation light including each of the first frequency $f_1$ and the frequency $f_1\pm fm$ to the optical multiplexer 158.

The LN phase modulator 157 modulates the second split light output from the second optical distributor 14 by the local oscillation signal oscillated by the first local oscillation signal source 15, thereby generating sideband light (see FIG. 23) having a frequency of $f_2\pm m$.

The LN phase modulator 157 outputs the modulation light including each of the second frequency $f_2$ and the frequency $f_2\pm fm$ to the optical multiplexer 158.

Figure 23:
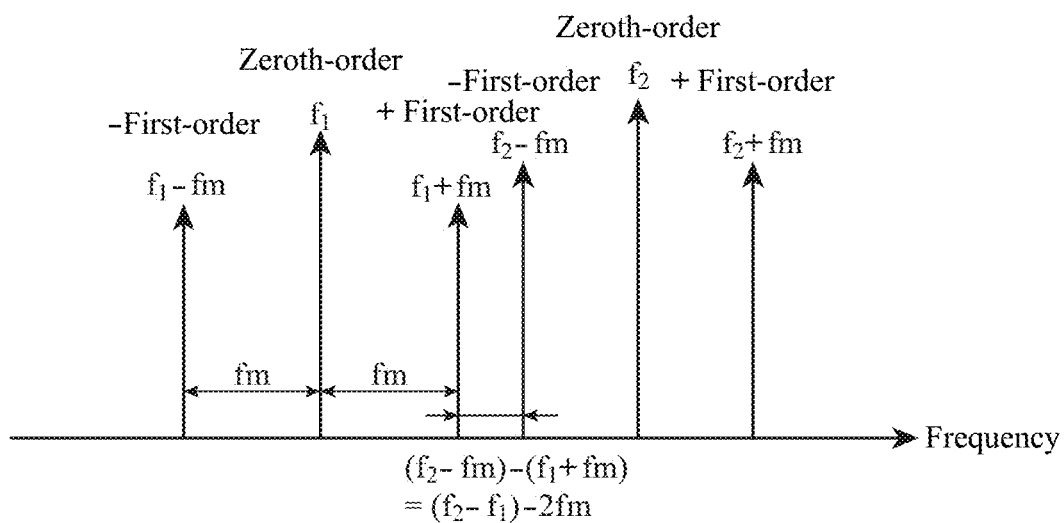
FIG. 23 is an explanatory diagram illustrating a first frequency $f_1$ included in first light, frequencies $f_1$−fm and $f_1$+fm of sideband light included in modulated first light, a second frequency $f_2$ included in second light, and frequencies $f_2$−fm and $f_2$+fm of sideband light included in modulated second light.

FIG. 23 is an explanatory diagram illustrating a first frequency $f_1$ included in first light, frequencies $f_1-fm$ and $f_1+fm$ of sideband light included in modulated first light, a second frequency $f_2$ included in second light, and frequencies $f_2-fm$ and $f_2+fm$ of sideband light included in modulated second light.

In FIG. 23, $(f_2-fn)-(f_1+fm)=(f_2-f_1)-2fm$ is a differential frequency between the frequency $f_1+fm$ of the sideband light included in the modulated first light and the frequency $f_2-fm$ of the sideband light included in the modulated second light.

In the optical frequency control device 1 illustrated in FIG. 22, the LN phase modulator 17 generates sideband light having a frequency of $f_1+fm$ at an interval of the modulation frequency fm on both sides of the first frequency $f_1$ with the first frequency $f_1$ as the center. However, this is merely an example, and the LN phase modulator 17 may generate, for example, only sideband light having a frequency of $f_1+fm$ on one side of the first frequency $f_1$.

In the optical frequency control device 1 illustrated in FIG. 22, the LN phase modulator 157 generates sideband light having a frequency of $f_2\pm fm$ at an interval of the modulation frequency fm on both sides of the second frequency $f_2$ with the second frequency $f_2$ as the center. However, this is merely an example, and the LN phase modulator 157 may generate, for example, only sideband light having a frequency of $f_2+fm$ on one side of the second frequency $f_2$.

The optical multiplexer 158 multiplexes the modulation light output from the LN phase modulator 17 and the modulation light output from the LN phase modulator 157.

The optical multiplexer 158 outputs the multiplexed light of the modulation light output from the LN phase modulator 17 and the modulation light output from the LN phase modulator 157 to the photodiode 159.

As illustrated in FIG. 23, the multiplexed light includes a first frequency $f_1$ included in the first light and frequencies $f_1-fm$ and $f_1+fm$ of the sideband light included in the modulated first light.

As illustrated in FIG. 23, the multiplexed light includes a second frequency $f_2$ included in the second light and frequencies $f_2-fm$ and $f_2+fm$ of the sideband light included in the modulated second light.

When receiving the multiplexed light from the optical multiplexer 158, the photodiode 159 converts the multiplexed light into an electric signal.

The photodiode 159 detects a differential frequency $(f_2-f_1)-2fm$ between the frequency $f_1+fm$ of the sideband light included in the modulated first light and the frequency $f_2-fm$ of the sideband light included in the modulated second light from the electric signal.

The photodiode 159 outputs a signal including the differential frequency $(f_2-f_1)-2fm$ to the PLL circuit 22 of the light source control circuit 21 as a differential beat signal.

In the optical frequency control device 1 illustrated in FIG. 22, assuming that the first frequency $f_1$<the second frequency $f_2$, the photodiode 159 detects, from the electric signal, a differential frequency $(f_2-f_1)-2fm$ between the frequency $f_1+fm$ of the sideband light included in the modulated first light and the frequency $f_2-fm$ of the sideband light included in the modulated second light. However, this is merely an example, and for example, if the frequency $f_1$>the frequency $f_2$, the photodiode 159 may detect, from the electric signal, the differential frequency $(f_1-f_2)-2fm$ between the frequency $f_1-fm$ of the sideband light included in the modulated first light and the frequency $f_2+fm$ of the sideband light included in the modulated second light. In this case, the photodiode 159 outputs a signal including the differential frequency $(f_1-f_2)-2fm$ to the PLL circuit 22 as a differential beat signal.

The reference signal source 20 oscillates a reference signal having a frequency fr and outputs the reference signal to the PLL circuit 22 of the light source control circuit 21.

The light source control circuit 21 frequency-divides the differential beat signal output from the photodiode 155 by a first frequency division number N and frequency-divides the reference signal output from the reference signal source 20 by a second frequency division number R.

The light source control circuit 21 outputs a phase error signal indicating a phase difference between the frequency-divided differential beat signal and the frequency-divided reference signal to the second light source 12, thereby changing the second frequency $f_2$ included in the second light oscillated by the second light source 12.

Hereinafter, the operation of the light source control circuit 21 will be described in detail.

The prescaler 51 of the PLL circuit 22 frequency-divides the differential beat signal output from the photodiode 159 by the first frequency division number N output from the signal processing unit 24.

Since the frequency included in the differential beat signal is $(f_2-f_1)-2fm$, the frequency of the differential beat signal after the frequency division by the prescaler 51 is $(f_2-f_1)-2fm))/N$.

The prescaler 51 outputs the frequency-divided differential beat signal to the phase comparator 53.

The prescaler 52 of the PLL circuit 22 frequency-divides the reference signal output from the reference signal source 20 by the second frequency division number R output from the signal processing unit 24.

Since the frequency included in the reference signal is fr, the reference signal after the frequency division by the prescaler 52 is fr/R.

The prescaler 52 outputs the frequency-divided reference signal to the phase comparator 53.

The phase comparator 53 of the PLL circuit 22 detects a phase difference between the frequency-divided differential beat signal output from the prescaler 51 and the frequency-divided reference signal output from the prescaler 52.

The phase comparator 53 outputs a phase error signal indicating a phase difference to the loop filter 23.

The loop filter 23 integrates the phase error signal output from the phase comparator 53 and outputs the integrated phase error signal to the second light source 12.

When the phase error signal after the integration is output to the second light source 12, the second frequency $f_2$ included in the second light output from the second light source 12 changes.

When the phase difference detected by the phase comparator 53 converges and phase synchronization of the PLL circuit 22 is fulfilled, the following Expression (16) is established.

$$\frac{((f_2 - f_1) - 2fm)}{N} = \frac{fr}{R} \quad (16)$$

Expression (16) can be organized as the following Expression (17).

$$f_2 - f_1 = \frac{N}{R}fr + 2fm \quad (17)$$

Expression (17) represents an offset frequency $f_2-f_1$ between the first frequency $f_1$ included in the first light oscillated by the first light source 11 and the second frequency $f_2$ included in the second light oscillated by the second light source 12. The offset frequency $f_2-f_1$ is determined by the first frequency division number N, the second frequency division number R, the frequency fr included in the reference signal and the modulation frequency fm.

The offset frequency $f_2-f_1$ corresponds to a frequency difference between the first frequency $f_1$ included in the first synchronization light and the second frequency $f_2$ included in the second synchronization light. The first synchronization light and the second synchronization light are light forming offset locking light.

When Expression (16) is solved for N, the following Expression (18) is obtained.

$$N = \frac{R}{fr}(f_2 - f_1 - 2fm) \quad (18)$$
$$= \frac{R}{fr}(\Delta f_{set} - 2fm)$$

Upon receiving the set value $\Delta f_{set}$ of the frequency difference $\Delta f$ between the first frequency $f_1$ and the second frequency $f_2$ from the outside of the device, the signal processing unit 24 sets each of the first frequency division number N and the second frequency division number R in accordance with the set value $\Delta f_{set}$ as the first embodiment.

The signal processing unit 24 outputs each of the first frequency division number N and the second frequency division number R to the PLL circuit 22.

Similarly to the first embodiment, the signal processing unit 24 sets each of the first control signal for controlling the first frequency $f_1$ and the second control signal for controlling the second frequency $f_2$ in accordance with the set value $\Delta f_{set}$.

The signal processing unit 24 outputs the first control signal to the first light source 11 and outputs the second control signal to second light source 12.

Similarly to the first embodiment, the first light source 11 changes the first frequency $f_1$ included in the first light in accordance with the first control signal output from the signal processing unit 24, and oscillates the first light including the changed first frequency $f_1$.

Thus, the first frequency $f_1$ included in the first light is adjusted in accordance with the set value $\Delta f_{set}$ of the frequency difference $\Delta f$.

The first light source 11 outputs the first light including the first frequency $f_1$ to the first optical distributor 13.

Similarly to the first embodiment, the second light source 12 changes the second frequency $f_2$ included in the second light in accordance with each of the phase error signal output from the loop filter 23 of the light source control circuit 21 and the second control signal output from the signal processing unit 24, and oscillates the second light including the changed second frequency $f_2$.

Thus, the second frequency $f_2$ included in the second light is adjusted in accordance with the set value $\Delta f_{set}$ of the frequency difference $\Delta f$.

The second light source 12 outputs the second light including the second frequency $f_2$ to the second optical distributor 14.

When receiving the first light from the first light source 11, the first optical distributor 13 distributes the first light and outputs the first split light, which is one light after the distribution, to the LN phase modulator 17.

The first optical distributor 13 outputs the first synchronization light, which is the other light after the distribution, to the outside of the device as one light of the offset locking light.

When receiving the second light from the second light source 12, the second optical distributor 14 distributes the second light and outputs the second split light, which is one light after the distribution, to the LN phase modulator 157.

The second optical distributor 14 outputs the second synchronization light, which is the other light after the distribution, to the outside of the device as the other light in the offset locking light.

Figure 24:
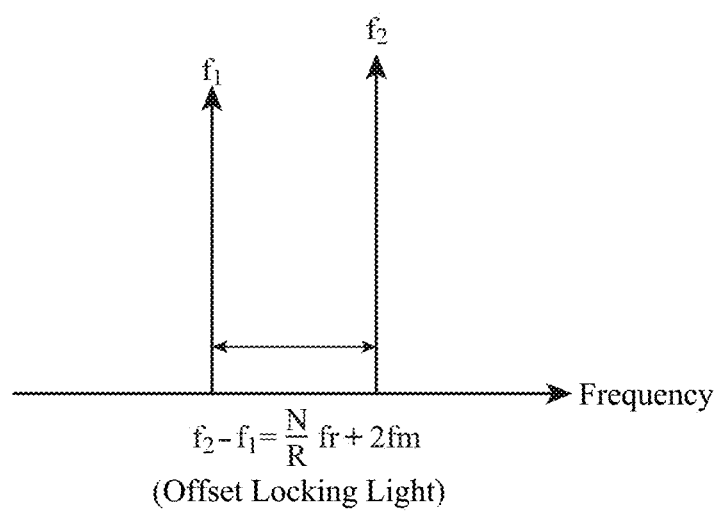
FIG. 24 is an explanatory view illustrating offset locking light.

FIG. 24 is an explanatory diagram illustrating offset locking light.

In FIG. 24, the frequency $f_1$ is the first frequency included in the first synchronization light, and the frequency $f_2$ is the second frequency included in the second synchronization light.

Since each of the first frequency $f_1$ and the second frequency $f_2$ is adjusted in accordance with the set value $\Delta f_{set}$ of the frequency difference $\Delta f$, the frequency difference $\Delta f$ between the first frequency $f_1$ and the second frequency $f_2$ can be changed.

In the seventh embodiment described above, the detection circuit 156 modulates the second light oscillated by the second light source 12 by the local oscillation signal oscillated by the first local oscillation signal source 15. The optical frequency control device 1 illustrated in FIG. 22 is configured in such a manner that the detection circuit 156 detects the differential beat signal including the differential frequency between the frequency of the sideband light included in the modulated first light and the frequency of the sideband light included in the modulated second light instead of detecting the differential beat signal including the differential frequency between the frequency of the sideband light included in the modulated first light and the second frequency. Therefore, similarly to the optical frequency control device 1 illustrated in FIG. 1, the optical frequency control device 1 illustrated in FIG. 22 can change the frequency difference between the first frequency included in the first light and the second frequency included in the second light without using a frequency synthesizer.

Figure 25:
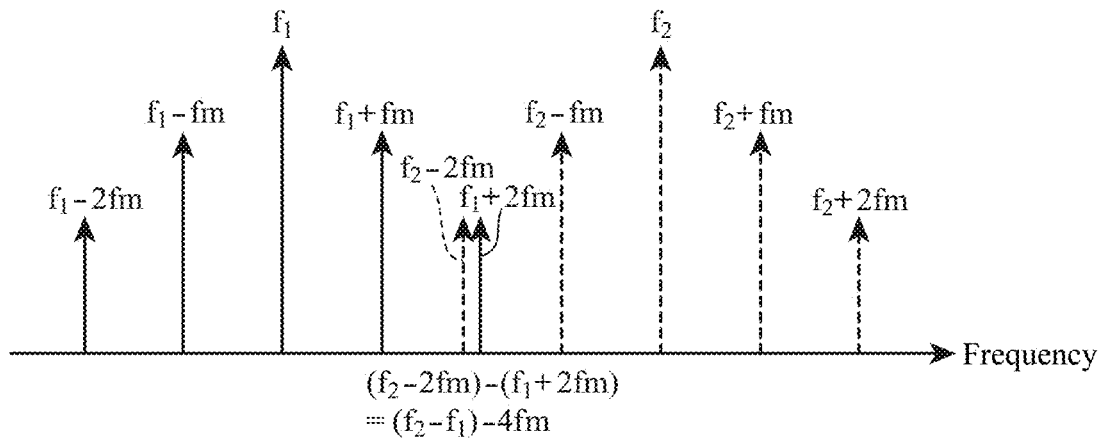
FIG. 25 is an explanatory diagram illustrating a first frequency $f_1$ included in first light, frequencies $f_1$−fm, $f_1$+fm, $f_1$−2fm, and $f_1$+2fm of sideband light included in the modulated first light, a second frequency $f_2$ included in second light, and frequencies $f_2$−fm, $f_2$+fm, $f_2$−2fm, and $f_2$+2fm of sideband light included in the modulated second light.

In the optical frequency control device 1 illustrated in FIG. 22, the photodiode 159 detects, from the electric signal, a differential frequency $(f_2-f_1)-2fm$ between the frequency $f_1+fm$ of the sideband light included in the modulated first light and the frequency $f_2-fm$ of the sideband light included in the modulated second light. However, this is merely an example, and for example, as shown in FIG. 25, the photodiode 159 may detect, from the electric signal, the differential frequency $(f_2-f_1)-4fm$ between the frequency $f_1+2fm$ of the sideband light included in the modulated first light and the frequency $f_2-2fm$ of the sideband light included in the modulated second light. In this case, since the photodiode 159 outputs the signal including the differential frequency $(f_2-f_1)-4fm$ to the PLL circuit 22 as the differential beat signal, the offset locking light is as illustrated in FIG. 26.

FIG. 25 is an explanatory diagram illustrating a first frequency $f_1$ included in first light, frequencies $f_1-fm$, $f_1+fm$, $f_1-2fm$, $f_1+2fm$ of sideband light included in the modulated first light, a second frequency $f_2$ included in second light, and frequencies $f_2-fm$, $f_2+fm$, $f_2-2fm$, $f_2+2fm$ of sideband light included in the modulated second light.

In FIG. 25, $(f_2-2fm)-(f_1+2fm)=(f_2-f_1)-4fm$ is a differential frequency between the frequency $f_1+2fm$ of the sideband light included in the modulated first light and the frequency $f_2-2fm$ of the sideband light included in the modulated second light.

Figure 26:
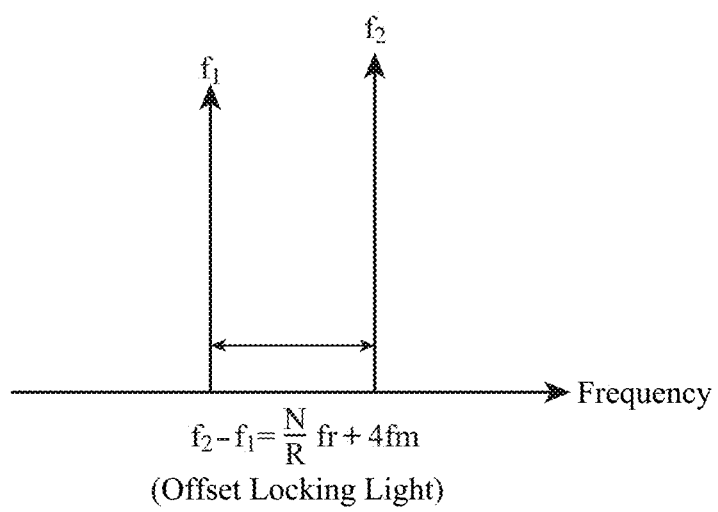
FIG. 26 is an explanatory view illustrating offset locking light.

FIG. 26 is an explanatory diagram illustrating offset locking light.

In FIG. 26, the frequency $f_1$ is the first frequency included in the first synchronization light, and the frequency $f_2$ is the second frequency included in the second synchronization light.

Eighth Embodiment

In an eighth embodiment, an optical oscillation device 2 will be described in which a light source control circuit 21 outputs a phase error signal to a first local oscillation signal source 15a, and the first local oscillation signal source 15a adjusts the frequency of the oscillating local oscillation signal in accordance with the phase error signal output from the light source control circuit 21.

Figure 27:
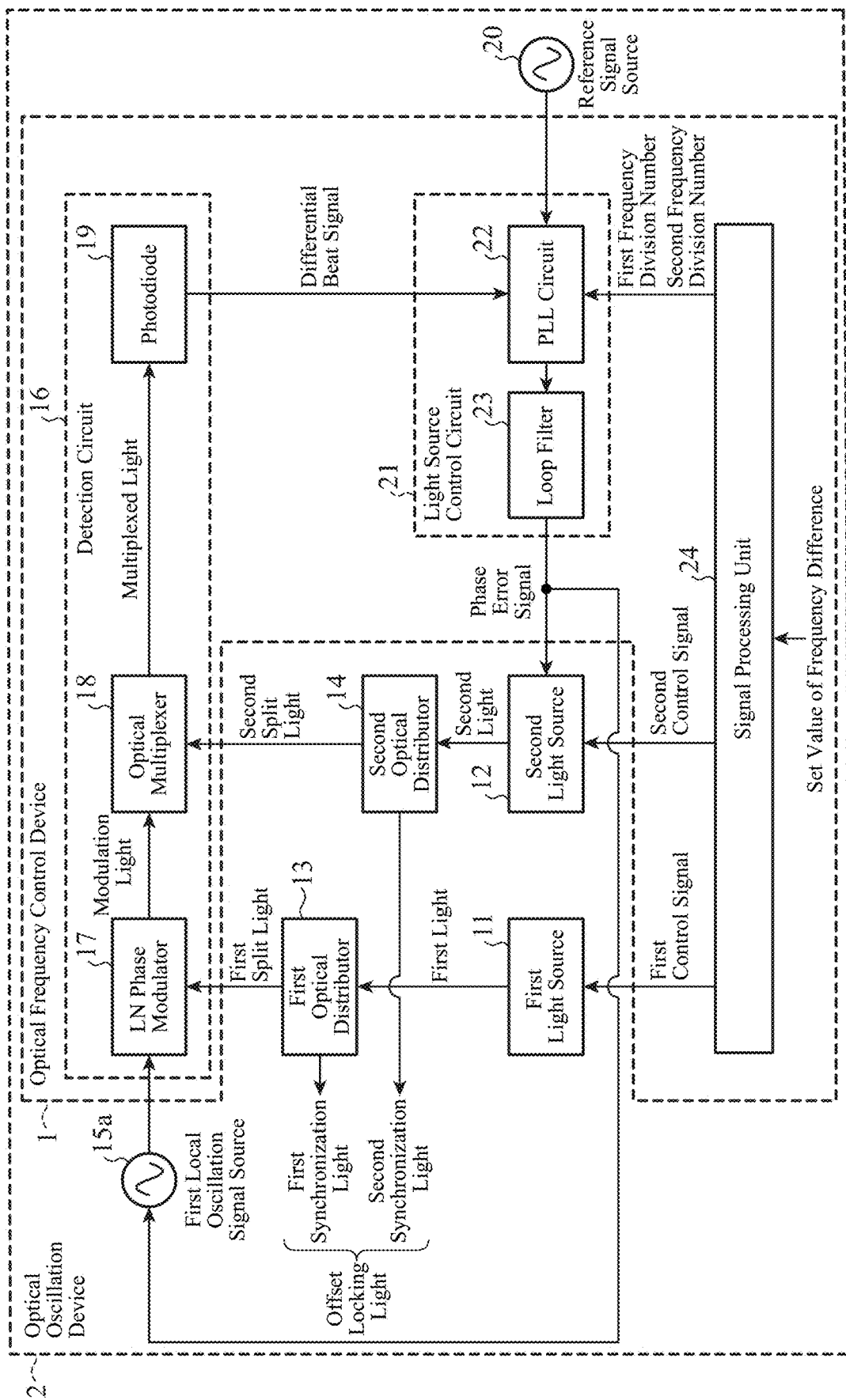
FIG. 27 is a configuration diagram illustrating an optical oscillation device 2 including an optical frequency control device 1 according to an eighth embodiment.

FIG. 27 is a configuration diagram illustrating the optical oscillation device 2 including an optical frequency control device 1 according to the eighth embodiment. In FIG. 27, the same reference signs as those in FIGS. 1, 8, 12, 16, 19, and 22 denote the same or corresponding parts, and thus the description thereof is omitted.

In the eighth embodiment, a loop filter 23 of the light source control circuit 21 outputs a phase error signal to each of a second light source 12 and a first local oscillation signal source 15a.

When the phase error signal output from the light source control circuit 21 is 0, the first local oscillation signal source 15a oscillates a local oscillation signal having a frequency of fm similarly to the first local oscillation signal source 15 illustrated in FIG. 1.

The first local oscillation signal source 15a is connected to an LN phase modulator 17 via, for example, an optical fiber, and outputs a local oscillation signal to the LN phase modulator 17.

The first local oscillation signal source 15a adjusts the frequency fm of the oscillating local oscillation signal in accordance with the phase error signal output from the light source control circuit 21.

In the optical oscillation device 2 illustrated in FIG. 27, the first local oscillation signal source 15a is applied to the optical oscillation device 2 illustrated in FIG. 1. However, this is merely an example, and the first local oscillation signal source 15a may be applied to the optical oscillation device 2 illustrated in FIG. 8, 12, 16, 19, or 22.

Next, the operation of the optical oscillation device 2 illustrated in FIG. 27 will be described.

Since the components other than the first local oscillation signal source 15a are similar to those of the optical oscillation device 2 illustrated in FIG. 1, the operation of the first local oscillation signal source 15a will be mainly described herein.

When the phase error signal output from the light source control circuit 21 is 0, the first local oscillation signal source 15a maintains the frequency fm of the oscillating local oscillation signal.

When the phase error signal indicates that the phase of the first light is advanced from the phase of the second light, the first local oscillation signal source 15a adjusts the frequency fm of the local oscillation signal to be small.

When the phase error signal indicates that the phase of the first light is delayed from the phase of the second light, the first local oscillation signal source 15a adjusts the frequency fm of the local oscillation signal to be large.

The LN phase modulator 17 modulates the first split light output from the first optical distributor 13 by the local oscillation signal oscillated by the first local oscillation signal source 15a, thereby generating sideband light having a frequency of $f_1 \pm fm$.

Figure 28A:
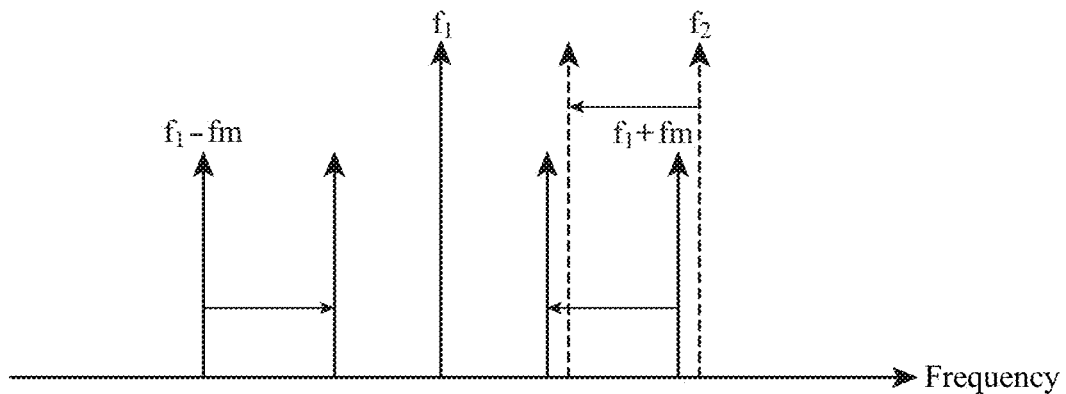
FIG. 28A is an explanatory diagram illustrating a change in sideband light when a frequency fm of a local oscillation signal is regulated to be small.

If the frequency fm of the local oscillation signal is adjusted to be small by the first local oscillation signal source 15a, as illustrated in FIG. 28A, the frequency difference between the frequency $f_1-fm$ and the frequency $f_1+fm$ included in the sideband light generated by the LN phase modulator 17 becomes small.

Figure 28B:
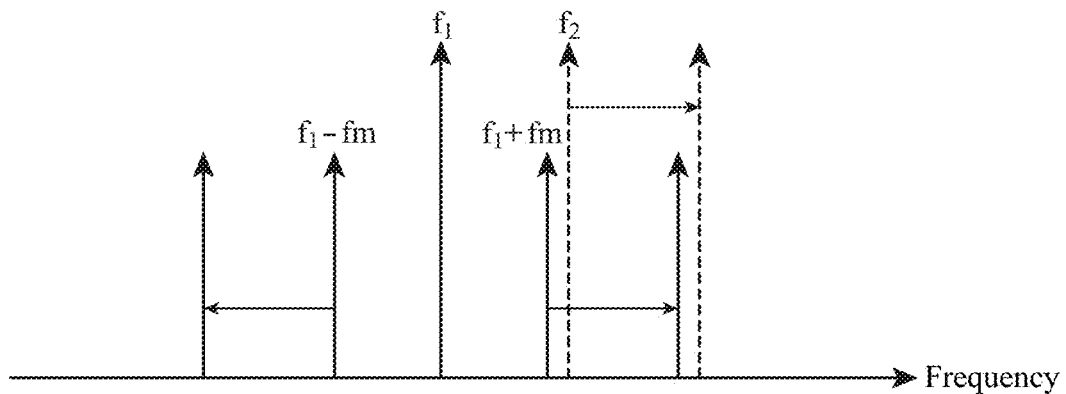
FIG. 28B is an explanatory diagram illustrating a change in sideband light when the frequency fm of the local oscillation signal is regulated to be large.

If the frequency fm of the local oscillation signal is adjusted to be large by the first local oscillation signal source 15a, as illustrated in FIG. 28B, the frequency difference between the frequency $f_1-fm$ and the frequency $f_1+fm$ included in the sideband light generated by the LN phase modulator 17 becomes large.

FIG. 28A is an explanatory diagram illustrating a change in the sideband light when the frequency fm of the local oscillation signal is adjusted to be small. FIG. 28B is an explanatory diagram illustrating a change in the sideband light when the frequency fm of the local oscillation signal is adjusted to be large.

When the first local oscillation signal source 15a adjusts the frequency fm of the local oscillation signal in accordance with the phase error signal, the frequency $f_2-(f_1+fm)$ of the difference included in the differential beat signal detected by the detection circuit 16 changes.

As the frequency $f_2-(f_1+fm)$ of the difference included in the differential beat signal changes, in the example of FIG. 28A, the second frequency $f_2$ included in the second light changes in a direction of decreasing.

As the frequency $f_2-(f_1+fm)$ of the difference included in the differential beat signal changes, in the example of FIG. 28B, the second frequency $f_2$ included in the second light changes in a direction of increasing.

Ninth Embodiment

In a ninth embodiment, a frequency conversion device including the optical oscillation device 2 according to any one of the first to eighth embodiments will be described.

Figure 29:
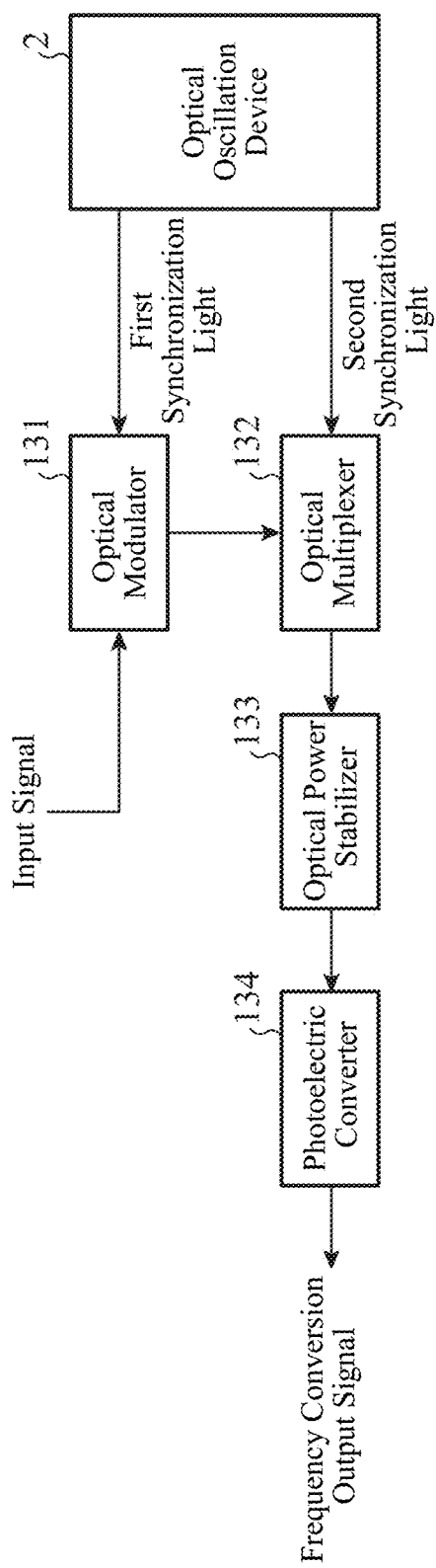
FIG. 29 is a configuration diagram illustrating a frequency conversion device according to a ninth embodiment.

FIG. 29 is a configuration diagram illustrating the frequency conversion device according to the ninth embodiment.

An optical oscillation device 2 is the optical oscillation device according to any one of the first to eighth embodiments.

The optical oscillation device 2 outputs first synchronization light, which is one light in the offset locking light, to an optical modulator 131 described later.

The optical oscillation device 2 outputs the second synchronization light, which is the other light of the offset locking light, to the optical multiplexer 132 described later.

The optical modulator 131 is implemented by, for example, an LN phase modulator.

The optical modulator 131 modulates the first synchronization light output from the optical oscillation device 2 with a microwave input signal or a millimeter wave input signal, and outputs the modulated first synchronization light to the optical multiplexer 132.

In the frequency conversion device illustrated in FIG. 29, the optical modulator 131 is implemented by an LN phase modulator. However, this is merely an example, and the optical modulator 131 may be implemented by, for example, a Mach-Zehnder type intensity modulator or an electro-absorption type modulator.

The optical multiplexer 132 multiplexes the second synchronization light output from the optical oscillation device 2 and the modulated first synchronization light output from the optical modulator 131, and outputs the multiplexed light, which is the light after being multiplexed, to an optical power stabilizer 133 described later.

The optical power stabilizer 133 suppresses fluctuation in the optical power of the multiplexed light output from the optical multiplexer 132.

The optical power stabilizer 133 includes, for example, a monitor optical coupler, a photodiode, an analog-to-digital converter (Hereinafter, referred to as an "AD converter"), and a semiconductor optical amplifier or an optical variable attenuator. The optical power stabilizer 133 monitors the optical power of the multiplexed light output from the optical multiplexer 132 using the monitor optical coupler, the photodiode, and the AD converter. The optical power stabilizer 133 performs gain adjustment of the semiconductor optical amplifier or gain adjustment of the optical variable attenuator in accordance with the monitoring result of the optical power, thereby suppressing fluctuation of the optical power of the multiplexed light.

A photoelectric converter 134 is implemented by, for example, a photodiode.

The photoelectric converter 134 converts the multiplexed light, in which the fluctuation of the optical power is suppressed by the optical power stabilizer 133, into an electric signal.

The photoelectric converter 134 outputs the electric signal to the outside of the device as a frequency conversion output signal.

Next, the operation of the frequency conversion device illustrated in FIG. 29 will be described.

The optical oscillation device 2 outputs the first synchronization light including the first frequency $f_1$ to the optical modulator 131 and outputs the second synchronization light including the second frequency $f_2$ to the optical multiplexer 132.

Upon receiving the first synchronization light from the optical oscillation device 2, the optical modulator 131 modulates the first synchronization light with a microwave input signal or a millimeter wave input signal.

The optical modulator 131 outputs the modulated first synchronization light to the optical multiplexer 132.

The optical multiplexer 132 multiplexes the second synchronization light output from the optical oscillation device 2 and the modulated first synchronization light output from the optical modulator 131.

The optical multiplexer 132 outputs the multiplexed light, which is light after being multiplexed, to the optical power stabilizer 133.

The frequency of the multiplexed light is a frequency obtained by up-converting or down-converting the frequency of the microwave input signal or the frequency of the millimeter wave input signal by the offset frequency $f_2-f_1$.

The optical power stabilizer 133 suppresses fluctuation in the optical power of the multiplexed light output from the optical multiplexer 132.

Since the fluctuation of the optical power of the multiplexed light is suppressed by the optical power stabilizer 133, it is possible to correct the fluctuation of the optical power of the multiplexed light generated when the optical frequency control device 1 changes the offset frequency $f_2-f_1$, or the fluctuation of the optical power of the multiplexed light generated when the optical phase synchronization follows the wavelength fluctuation in each of the first light source 11 and the second light source 12. By correcting the fluctuation in the optical power of the multiplexed light, the fluctuation in the frequency conversion efficiency can be suppressed.

The photoelectric converter 134 converts the multiplexed light, in which the optical power is stabilized by the optical power stabilizer 133, into an electric signal, and outputs the electric signal to the outside of the device as a frequency conversion output signal.

In the ninth embodiment described above, the frequency conversion device is configured to include the optical oscillation device 2, the optical modulator 131 that modulates the first light oscillated by the first light source 11 by the input signal, the optical multiplexer 132 that multiplexes the second light oscillated by the second light source 12 and the first light modulated by the optical modulator 131, and the photoelectric converter 134 that converts the light after multiplexed by the optical multiplexer 132 into an electric signal. Therefore, the frequency conversion device can up-convert or down-convert the frequency of the microwave input signal or the frequency of the millimeter wave input signal by the offset frequency $f_2-f_1$.

Tenth Embodiment in a tenth embodiment, a radio wave generation device including the optical oscillation device 2 according to any one of the first to eighth embodiments.

Figure 30:
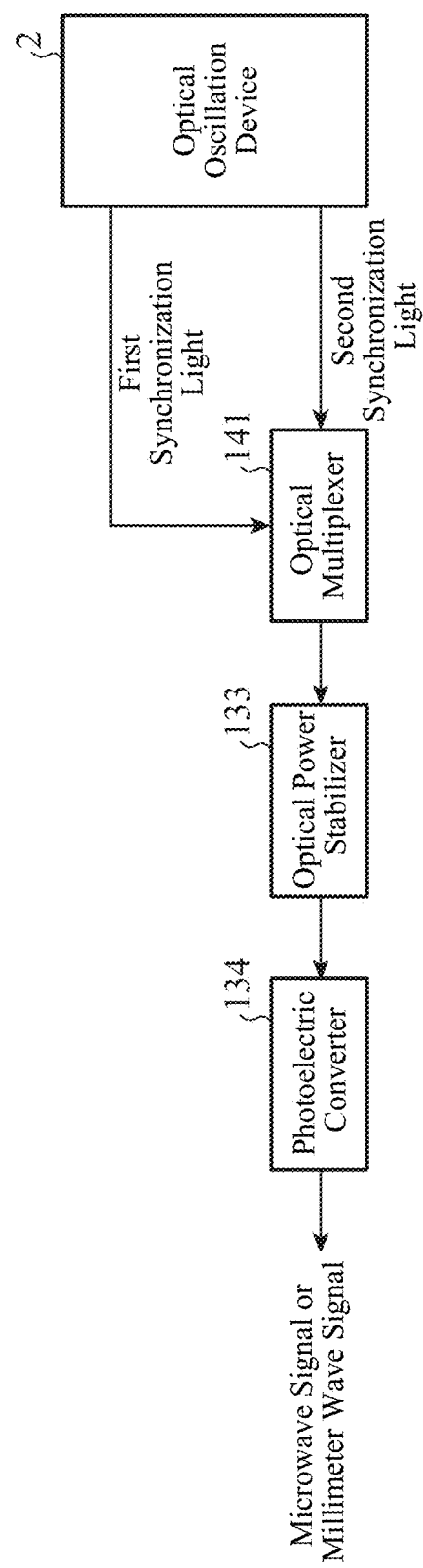
FIG. 30 is a configuration diagram illustrating a radio wave generation device according to a tenth embodiment.

FIG. 30 is a configuration diagram illustrating the radio wave generation device according to the tenth embodiment. In FIG. 30, the same reference signs as those in FIGS. 1 and 29 denote the same or corresponding parts, and thus the description thereof is omitted.

An optical oscillation device 2 is the optical oscillation device according to any one of the first to eighth embodiments.

The optical oscillation device 2 outputs first synchronization light, which is one light of offset locking light, to an optical multiplexer 141 described later.

The optical oscillation device 2 outputs second synchronization light, which is the other light of the offset locking light, to the optical multiplexer 141.

The optical multiplexer 141 multiplexes the first synchronization light output from the optical oscillation device 2 and the second synchronization light output from the optical oscillation device 2.

The optical multiplexer 141 outputs the light, which is multiplexed, to the optical power stabilizer 133.

The frequency of the multiplexed light is the offset frequency $f_2-f_1$.

Next, the operation of the radio wave generation device illustrated in FIG. 30 will be described.

The optical oscillation device 2 outputs the first synchronization light including the first frequency $f_1$ to the optical multiplexer 141, and outputs the second synchronization light including the second frequency $f_2$ to the optical multiplexer 141.

The optical multiplexer 141 multiplexes the first synchronization light output from the optical oscillation device 2 and the second synchronization light output from the optical oscillation device 2.

The optical multiplexer 141 outputs the multiplexed light of the first synchronization light and the second synchronization light to the optical power stabilizer 133.

The optical power stabilizer 133 suppresses fluctuation in the optical power of the multiplexed light output from the optical multiplexer 141.

A photoelectric converter 134 converts the multiplexed light, in which the optical power is stabilized by the optical power stabilizer 133, into an electric signal, and outputs the electric signal to the outside of the device as a microwave signal or a millimeter wave signal.

The microwave signal or the millimeter wave signal is a signal including the offset frequency $f_2-f_1$.

In the tenth embodiment described above, the radio wave generation device is configured to include the optical oscillation device 2, the optical multiplexer 141 that multiplexes the first light oscillated by the first light source 11 and the second light oscillated by the second light source 12, and the photoelectric converter 134 that converts the light multiplexed by the optical multiplexer 141 into an electric signal. Therefore, the radio wave generation device can output a signal including the offset frequency $f_2-f_1$.

Note that, in the scope of the present invention, the present invention of this application allows free combinations of each embodiment, modification of any constituents of each embodiment, or omission of any constituents in each embodiment.

INDUSTRIAL APPLICABILITY

The present invention is suitable for an optical frequency control device that changes a frequency included in light, an optical oscillation device including the optical frequency control device, a frequency conversion device including the optical oscillation device, and a radio wave generation device including the optical oscillation device.

REFERENCE SIGNS LIST

1: optical frequency control device, 2: optical oscillation device, 11: first light source, 12: second light source, 13: first optical distributor, 14: second optical distributor, 15, 15a: first local oscillation signal source, 16: detection circuit, 17: LN phase modulator, 18: optical multiplexer, 19: photodiode, 20: reference signal source, 21: light source control circuit, 22: PLL circuit, 23: loop filter, 24: signal processing unit, 31: laser diode, 32: constant current driver, 33: thermistor, 34: TEC driver, 35: Peltier element, 41: laser diode, 42: constant current driver, 43: thermistor, 44: TEC driver, 45: Peltier element, 51: prescaler, 52: prescaler, 53: phase comparator, 54: polarity switch, 61: frequency division number setting unit, 61a: subtractor, 61b: divider, 61c: multiplier, 62: control signal setting unit, 62a: table, 71: voltage monitor. 72: signal processing unit, 73: voltage range storing unit, 74: comparator, 75: control signal setting unit, 81: signal processing unit, 82: frequency division number setting unit, 82a: subtractor, 82b: comparator. 82c: increment unit, 82d: multiplier, 82e: divider, 82f: multiplier, 90: light source control circuit, 91: PLL circuit, 100: signal processing unit, 101: frequency division number setting unit, 101a: subtractor, 101b: comparator, 101c: increment unit, 101d: multiplier, 101e: absolute value calculator, 101f: divider, 101g: multiplier, 101h: sign extractor, 110: power regulator, 120: signal processing unit, 121: power calculator, 131: optical modulator, 132: optical multiplexer, 133: optical power stabilizer, 134: photoelectric converter, 141: optical multiplexer, 151: second local oscillation signal source, 152: detection circuit, 153: LN phase modulator, 154: optical multiplexer, 155: photodiode, 156: detection circuit, 157: LN phase modulator, 158: optical multiplexer, 159: photodiode

The invention claimed is:

1. An optical frequency control device, comprising:
   a detection circuit to receive first light including a first frequency from a first light source, receive second light including a second frequency from a second light source, modulate the first light with a local oscillation signal oscillated by a first local oscillation signal source, and detect a differential beat signal including a differential frequency between a frequency of sideband light included in the first light, which is modulated, and the second frequency;
   a light source control circuit to change the second frequency included in the second light oscillated by the second light source by frequency-dividing a differential beat signal detected by the detection circuit with a first frequency division number, by frequency-dividing a reference signal oscillated by a reference signal source with a second frequency division number, and by outputting, to the second light source, a phase error signal, which indicates a phase difference between the differential beat signal after the frequency division and the reference signal after the frequency division number; and
   a signal processor to set each of a first frequency division number and a second frequency division number in accordance with a set value of a frequency difference between the first frequency division number and the second frequency division number.

2. The optical frequency control device according to claim 1, wherein the signal processor determines an order of the sideband light on a basis of the set value and sets the first frequency division number in accordance with each of the set value and the order.

3. The optical frequency control device according to claim 1, wherein the signal processor switches a polarity of a phase error signal output from the light source control circuit.

4. The optical frequency control device according to claim 2, further comprising a power regulator to regulate power of a local oscillation signal oscillated by the first local oscillation signal source,
   wherein the signal processor controls regulation of power by the power regulator on a basis of an order of the sideband light.

5. The optical frequency control device according to claim 1, wherein the detection circuit modulates the second light oscillated by the second light source with a local oscillation signal oscillated by a second local oscillation signal source, and detects
   a differential beat signal including a differential frequency between a frequency of sideband light included in the first light after modulation and a frequency of sideband light included in the second light after modulation, instead of detecting a differential beat signal including a differential frequency between the frequency of the sideband light and the second frequency.

6. The optical frequency control device according to claim 1, wherein the detection circuit modulates the second light oscillated by the second light source with a local oscillation signal oscillated by a first local oscillation signal source, and detects
   a differential beat signal including a differential frequency between a frequency of sideband light included in the first light after modulation and a frequency of sideband light included in the second light after modulation, instead of detecting a differential beat signal including a differential frequency between the frequency of the sideband light and the second frequency.

7. The optical frequency control device according to claim 1, wherein the light source control circuit regulates a frequency of a local oscillation signal oscillated by the first local oscillation signal source by outputting the phase error signal to the first local oscillation signal source.

8. An optical oscillation device comprising:
   the optical frequency control device according to claim 1;
   a first light source to oscillate first light;
   a second light source to oscillate second light;
   a first local oscillation signal source to oscillate a local oscillation signal; and
   a reference signal source to oscillate a reference signal.

9. The optical oscillation device according to claim 8, wherein the signal processor outputs a first control signal for controlling a first frequency included in first light oscillated by the first light source and a second control signal for controlling a second frequency included in second light oscillated by the second light source in accordance with the set value,
   the first light source changes a first frequency included in the first light in accordance with the first control signal output from the signal processor, and
   the second light source changes a second frequency included in the second light in accordance with each of a phase error signal output from the light source control circuit and the second control signal output from the signal processor.

10. The optical oscillation device according to claim 9, wherein the signal processor regulates each of the first control signal and the second control signal on a basis of a phase error signal output from the light source control circuit.

11. The optical oscillation device according to claim 8, further comprising:
    a first optical distributor to distribute the light oscillated by the first light source, output one light after the distribution to the detection circuit, and output another light after the distribution as one light in offset locking light; and
    a second optical distributor to distribute the light oscillated by the second light source, to output one light after the distribution to the detection circuit, and to output the other light after the distribution as another light in the offset locking light.

12. The optical oscillation device according to claim 8, further comprising a second local oscillation signal source to oscillate a local oscillation signal,
    wherein the detection circuit modulates the second light oscillated by the second light source with a local oscillation signal oscillated by the second local oscillation signal source, and detects a differential beat signal including a differential frequency between a frequency of sideband light included in the first light after modulation and a frequency of sideband light included in the second light after modulation, instead of detecting a differential beat signal including a differential frequency between the frequency of the sideband light and the second frequency.

13. The optical oscillation device according to claim 8, wherein the detection circuit modulates the second light oscillated by the second light source with a local oscillation signal oscillated by the first local oscillation signal source, and detects a differential beat signal including a differential frequency between a frequency of sideband light included in the first light after modulation and a frequency of sideband light included in the second light after modulation, instead of detecting a differential beat signal including a differential frequency between the frequency of the sideband light and the second frequency.

14. The optical oscillation device according to claim 8, wherein the light source control circuit outputs the phase error signal to the first local oscillation signal source, and the first local oscillation signal source regulates a frequency of an oscillating local oscillation signal in accordance with the phase error signal output from the light source control circuit.

15. The optical oscillation device according to claim 8, wherein one or more of the first light source, the second light source, and the detection circuit are integrated as a planar lightwave circuit.

16. The optical oscillation device according to claim 8, wherein one or more of the first light source, the second light source, the detection circuit, the light source control circuit, and the signal processor are integrated using silicon.

17. A frequency conversion device comprising:
the optical oscillation device according to claim 8;
an optical modulator to modulate first light oscillated by the first light source with an input signal;
an optical multiplexer to multiplex the second light oscillated by the second light source and the light modulated by the optical modulator; and
a photoelectric converter to convert light multiplexed by the optical multiplexer into an electric signal.

18. The frequency conversion device according to claim 17, further comprising an optical power stabilizer to suppress power fluctuation of light multiplexed by the optical multiplexer and output light after the power fluctuation suppression to the photoelectric converter.

19. A radio wave generation device comprising:
the optical oscillation device according to claim 8;
an optical multiplexer to multiplex first light oscillated by the first light source and second light oscillated by the second light source; and
a photoelectric converter to convert light multiplexed by the optical multiplexer into an electric signal.

20. The radio wave generation device according to claim 19, further comprising an optical power stabilizer to suppress power fluctuation of light multiplexed by the optical multiplexer and output the light after the power fluctuation suppression to the photoelectric converter.

* * * * *